United States Patent
Yamazaki et al.

(10) Patent No.: US 8,232,598 B2
(45) Date of Patent: Jul. 31, 2012

(54) DISPLAY DEVICE AND METHOD FOR MANUFACTURING THE SAME

(75) Inventors: Shunpei Yamazaki, Setagaya (JP); Ikuko Kawamata, Atsugi (JP); Atsushi Miyaguchi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 434 days.

(21) Appl. No.: 12/232,311

(22) Filed: Sep. 15, 2008

(65) Prior Publication Data
US 2009/0078939 A1 Mar. 26, 2009

(30) Foreign Application Priority Data
Sep. 20, 2007 (JP) .................................. 2007-243925

(51) Int. Cl.
*H01L 27/12* (2006.01)
(52) U.S. Cl. .... 257/351; 257/59; 257/350; 257/E33.003
(58) Field of Classification Search ................... 257/351, 257/E33.003, 350, 59
See application file for complete search history.

(56) References Cited

U.S. PATENT DOCUMENTS

| | | | |
|---|---|---|---|
| 4,472,729 A | 9/1984 | Shibata et al. |
| 4,933,298 A | 6/1990 | Hasegawa |
| 5,028,976 A | 7/1991 | Ozaki et al. |
| 5,422,302 A | 6/1995 | Yonehara et al. |
| 5,643,801 A | 7/1997 | Ishihara et al. |
| 5,877,034 A | 3/1999 | Ramm et al. |
| 5,976,953 A | 11/1999 | Zavracky et al. |
| 6,037,635 A | 3/2000 | Yamazaki |
| 6,127,702 A | 10/2000 | Yamazaki et al. |

(Continued)

FOREIGN PATENT DOCUMENTS
JP 05-090117 A 4/1993
(Continued)

OTHER PUBLICATIONS

Jung et al., "Highly Cost Effective and High Performance 65nm $S^3$ (Stacked Single-Crystal Si) SRAM Technology with $25F^2$, 0 16um$^2$ Cell and Doubly Stacked SSTFT Cell Transistors for Ultra High Density and High Speed Applications," 2005 Symposium on VLSI Technology Digest of Technical Papers, 2005, pp. 220-221.

(Continued)

*Primary Examiner* — Stephen W Smoot
*Assistant Examiner* — Vicki B Booker
(74) *Attorney, Agent, or Firm* — Eric J. Robinson; Robinson Intellectual Property Law Office, P.C.

(57) ABSTRACT

To provide a display device which can realize high performance of a field-effect transistor which forms a pixel of the display device and which can achieve improvement in an aperture ratio of a pixel, which has been reduced due to increase in the number of field-effect transistors, and reduction in the area of the field-effect transistor which occupies the pixel, without depending on a microfabrication technique of the field-effect transistor, even when the number of field-effect transistors in the pixel is increased. A display device is provided with a plurality of pixels in which a plurality of field-effect transistors including a semiconductor layer which is separated from a semiconductor substrate and is bonded to a supporting substrate having an insulating surface are stacked with a planarization layer interposed therebetween.

36 Claims, 22 Drawing Sheets

U.S. PATENT DOCUMENTS

| | | | |
|---|---|---|---|
| 6,335,231 B1 | 1/2002 | Yamazaki et al. | |
| 6,372,609 B1 | 4/2002 | Aga et al. | |
| 6,380,046 B1 | 4/2002 | Yamazaki | |
| 6,424,020 B1 * | 7/2002 | Vu et al. | 257/507 |
| 6,525,340 B2 | 2/2003 | Colavito et al. | |
| 6,703,265 B2 | 3/2004 | Asami et al. | |
| 6,717,180 B2 | 4/2004 | Yamazaki et al. | |
| 6,821,826 B1 | 11/2004 | Chan et al. | |
| 6,881,975 B2 | 4/2005 | Anzai et al. | |
| 6,908,797 B2 | 6/2005 | Takano | |
| 7,052,974 B2 | 5/2006 | Mitani et al. | |
| 7,067,926 B2 | 6/2006 | Yamazaki et al. | |
| 7,074,656 B2 | 7/2006 | Yeo et al. | |
| 7,105,394 B2 | 9/2006 | Hachimine et al. | |
| 7,164,151 B2 | 1/2007 | Yamazaki et al. | |
| 7,199,024 B2 | 4/2007 | Yamazaki | |
| 7,298,009 B2 | 11/2007 | Yan et al. | |
| 7,312,487 B2 | 12/2007 | Alam et al. | |
| 7,332,384 B2 | 2/2008 | Buchholtz et al. | |
| 7,393,732 B2 | 7/2008 | Rim | |
| 2002/0179905 A1 * | 12/2002 | Colavito et al. | 257/57 |
| 2004/0195572 A1 | 10/2004 | Kato et al. | |
| 2004/0217433 A1 | 11/2004 | Yeo et al. | |
| 2005/0006647 A1 | 1/2005 | Utsunomiya | |
| 2005/0260800 A1 | 11/2005 | Takano | |
| 2006/0049430 A1 * | 3/2006 | Kasai et al. | 257/213 |
| 2006/0068533 A1 | 3/2006 | Utsunomiya | |
| 2006/0125013 A1 | 6/2006 | Rim | |
| 2007/0001226 A1 | 1/2007 | Takahashi | |
| 2008/0254560 A1 | 10/2008 | Yamazaki | |
| 2008/0283958 A1 | 11/2008 | Ohnuma | |
| 2009/0047771 A1 | 2/2009 | Yamazaki et al. | |
| 2009/0050941 A1 | 2/2009 | Yamazaki et al. | |
| 2009/0053876 A1 | 2/2009 | Yamazaki | |
| 2009/0078970 A1 | 3/2009 | Yamazaki et al. | |
| 2009/0114926 A1 | 5/2009 | Yamazaki | |

FOREIGN PATENT DOCUMENTS

| | | | |
|---|---|---|---|
| JP | 07-297377 A | | 11/1995 |
| JP | 10-326895 A | | 12/1998 |
| JP | 10326895 | * | 12/1998 |
| JP | 11-163363 | | 6/1999 |
| JP | 11-163363 A | | 6/1999 |
| JP | 2000-124092 | | 4/2000 |
| JP | 2003-273240 A | | 9/2003 |
| JP | 2004-349513 | | 12/2004 |
| JP | 2005-039171 A | | 2/2005 |

OTHER PUBLICATIONS

Hayashi et al., "A New Three Dimensional IC Fabrication Technology, Stacking Thin Film Dual-CMOS Layers," IEDM 1991, pp. 657-660.

Kim.S et al., "Low Temperature Silicon Circuit Layering for Three-Dimensional Integration," Proceedings 2004 IEEE International SOI Conference, 2004, pp. 136-138.

* cited by examiner

US 8,232,598 B2

DISPLAY DEVICE AND METHOD FOR MANUFACTURING THE SAME

BACKGROUND OF THE INVENTION

1. Field of the Invention

The present invention relates to a display device. In particular, the present invention relates to a display device in which a pixel circuit is formed three-dimensionally with the use of a field-effect transistor where a semiconductor layer is provided on an insulating surface.

2. Description of the Related Art

In recent years, a structure using a semiconductor substrate which is referred to as silicon on insulator (hereinafter also referred to as "SOI") in which a thin single crystal semiconductor layer is provided on an insulating surface has been attracting attention. In this structure, an active region (a channel formation region) of a field-effect transistor (FET, also simply referred to as a transistor), which has been formed of bulk single crystal silicon, is formed of a single crystal silicon thin film.

As a method for manufacturing an SOI substrate, a hydrogen ion implantation separation method is known (e.g., see Patent Document 1: Japanese Published Patent Application No. 2000-124092). The hydrogen ion implantation separation method is a method in which hydrogen ions are implanted into a silicon wafer to form a microbubble layer at a certain depth from the surface, and a thin silicon layer is bonded to another silicon wafer with the microbubble layer as a cleavage plane. In addition to heat treatment for separation of the silicon layer, it is necessary to perform heat treatment in an oxidizing atmosphere to form an oxide film on the silicon layer, remove the oxide film, and perform heat treatment at a temperature of 1000° C. to 1300° C. to increase bonding strength. Therefore, it is difficult to bond a silicon layer with desired bonding strength to a substrate like a glass substrate which cannot resist high temperature treatment, and there is a technical obstacle in simply applying the hydrogen ion implantation separation method to a field-effect transistor which forms a pixel of a display device.

On the other hand, a display device provided with a transistor which forms a pixel with the use of a technique of stacking thin film circuits three-dimensionally by provision of a thin film circuit including a transistor which is formed using a separation technique and a transfer technique and a connection electrode for connecting an external circuit to the thin film circuit is disclosed (see Patent Document 2: Japanese Published Patent Application No. 2004-349513).

SUMMARY OF THE INVENTION

The number of field-effect transistors which form a pixel of a display device tends to increase in achieving high performance of the display device. In addition, by reduction in the size of a pixel of a display device, the number of pixels in a display portion having the same size is increased, which tends to achieve high definition. Therefore, it can also be considered that improvement in an aperture ratio of a pixel which has been reduced due to increase in the number of field-effect transistors and reduction in the area of a field-effect transistor which occupies a pixel are achieved by miniaturization of a field-effect transistor.

In addition, in achieving high performance of a display device, it is necessary to consider high performance of a semiconductor layer of a field-effect transistor which forms the pixel of a display device as well as miniaturization of the field-effect transistor.

However, there is limitation on high performance of a display device with dependence only on a microfabrication technique of the field-effect transistor which forms a pixel of a display device. In addition, field-effect transistors which form a pixel are stacked three-dimensionally using a separation technique and a transfer technique, whereby improvement in an aperture ratio of the pixel, which has been reduced due to increase in the number of field-effect transistors and reduction in the areas of the field-effect transistors which occupy the pixel can be achieved. However, it is difficult to electrically connect thin film circuits which are transferred after separation to each other, which is not preferable in terms of mass productivity. Therefore, a technique of stacking thin film circuits three-dimensionally has been required with the use of a technique which can simply obtain a semiconductor layer of a high-performance field-effect transistor and which is excellent in mass productivity as in an SOI technique.

Thus, an object of the present invention is to provide a display device which can realize high performance of a field-effect transistor which forms a pixel of the display device and which can achieve improvement in an aperture ratio of a pixel, which has been reduced due to increase in the number of field-effect transistors, and reduction in the area of the field-effect transistor which occupies the pixel, without depending on a microfabrication technique of the field-effect transistor, even when the number of field-effect transistors in the pixel is increased.

A display device is provided with a plurality of pixels in which a plurality of semiconductor elements such as field-effect transistors including a semiconductor layer which is separated from a semiconductor substrate and is bonded to a supporting substrate having an insulating surface are stacked with a planarization layer interposed therebetween.

A semiconductor layer in a lower layer and a semiconductor layer in an upper layer which are stacked with a gate insulating layer, a planarization layer, an insulating layer in the upper layer, and the like interposed therebetween are electrically connected to each other by a wiring layer which penetrates the gate insulating layer, the planarization layer, and the insulating layer in the upper layer. In the case where the semiconductor layer in the lower layer and the semiconductor layer in the upper layer are stacked so as to be overlapped with each other, the wiring layer may be formed to penetrate the semiconductor layer in the upper layer and to be in contact with the semiconductor layer in the lower layer. The semiconductor layers are stacked closely so as to be overlapped with each other, whereby a display device having a pixel which includes highly integrated field-effect transistors can be achieved.

High performance semiconductor elements which are formed of the semiconductor layer which is separated and transferred from the semiconductor substrate can be stacked; therefore, the display device having a pixel which includes field-effect transistors that are more highly integrated can be achieved.

In formation of the semiconductor element in the upper layer over the semiconductor element in the lower layer, a planarization layer which covers the semiconductor element in the lower layer is formed, and an insulating layer which is bonded to a semiconductor layer is formed over the planarization layer. Therefore, a bond between the semiconductor layer of the semiconductor element in the upper layer and the insulating layer is facilitated, whereby the reliability of the semiconductor device and the yield can be improved.

In addition, when the semiconductor layers of field-effect transistors are bonded to different insulating layers, parasitic capacitance between the semiconductor layers of the field-effect transistors or parasitic capacitance between gate electrode layers of the field-effect transistors can be reduced.

Since a semiconductor layer which is separated and transferred from a semiconductor substrate is used, a crystal plane orientation and a crystal axis of a channel length direction in the field-effect transistor can be controlled by selecting an appropriate semiconductor substrate.

By employing a crystal plane orientation or a crystal axis with which mobility of carriers flowing through a channel of the field-effect transistor is increased, the pixel which forms a display device can be operated at higher speed. In addition, low voltage driving becomes possible, and low power consumption can be achieved. In other words, the possibility that carriers flowing through the channel of the field-effect transistor are scattered by atoms can be reduced, whereby resistance with which electrons and holes meet can be reduced, and performance of the field-effect transistor can be improved.

In bonding the semiconductor layer to a supporting substrate, a silicon oxide film which is preferably formed using organosilane as a source material is formed on one surface (on the side of the semiconductor layer or the supporting substrate) or both surfaces (on the side of the semiconductor layer and the side of the supporting substrate) that are to form a bond, and the silicon oxide film can be used as an insulating layer which is to be bonded to the semiconductor layer. Examples of an organosilane gas are silicon-containing compounds such as tetraethoxysilane (TEOS) (chemical formula: $Si(OC_2H_5)_4$), trimethylsilane (TMS) (chemical formula: $(CH_3)_3SiH$), tetramethylsilane (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$). In other words, in the structure in which the semiconductor layer is bonded to the supporting substrate, a layer which has a smooth surface and forms a hydrophilic surface is provided as a bonding surface.

Note that a chemical vapor deposition (CVD) method in this specification includes a plasma CVD method, a thermal CVD method, and a photo CVD method.

The silicon oxide film serving as the insulating layer which is bonded to the semiconductor layer can be formed by a chemical vapor deposition method, using monosilane, disilane, or trisilane as a source gas. Further, the silicon oxide film serving as the insulating layer which is bonded to the semiconductor layer may be a thermal oxide film, which preferably contains chlorine.

The semiconductor layer which is to be bonded to the supporting substrate can be obtained by cleavage and release at an embrittlement layer formed in the semiconductor substrate. The embrittlement layer can be formed by introduction of ions of hydrogen, helium, or a halogen typified by fluorine. In this case, one or a plurality of ions of the same atom, in which the mass numbers are different, may be introduced. In the case of introduction of hydrogen ions, it is preferable that $H^+$, $H_2^+$, and $H_3^+$ ions be contained and the proportion of $H_3^+$ ions be high.

The supporting substrate may be provided with a silicon nitride film or a silicon nitride oxide film as a blocking layer (also referred to as a barrier layer) which prevents diffusion of impurity elements. Further, a silicon oxynitride film may be combined as an insulating film which has an effect of relieving stress. Note that a silicon oxynitride film refers to a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 atomic % to 70 atomic %, 0.5 atomic % to 15 atomic %, 25 atomic % to 35 atomic %, and 0.1 atomic % to 10 atomic %, respectively. Further, a silicon nitride oxide film refers to a film that contains more nitrogen than oxygen and, in the case where measurements are performed using RBS and HFS, includes oxygen, nitrogen, silicon, and hydrogen at concentrations ranging from 5 atomic % to 30 atomic %, 20 atomic % to 55 atomic %, 25 atomic % to 35 atomic %, and 10 atomic % to 30 atomic %, respectively. Note that percentages of nitrogen, oxygen, silicon, and hydrogen fall within the ranges given above, where the total number of atoms contained in the silicon oxynitride film or the silicon nitride oxide film is defined as 100 atomic %.

In addition, a protection layer may be formed between the semiconductor substrate and the insulating layer which is bonded to the semiconductor layer. The protection layer can be a single layer or a stacked-layer structure of a plurality of layers selected from a silicon nitride layer, a silicon oxide layer, a silicon nitride oxide layer, or a silicon oxynitride layer. Those layers can be formed over the semiconductor substrate before the embrittlement layer is formed in the semiconductor substrate. Alternatively, those layers may be formed over the semiconductor substrate after the embrittlement layer is formed in the semiconductor substrate.

According to one mode of a display device of the present invention, a plurality of pixels having a stacked-layer structure includes, over a substrate having an insulating surface, a first field-effect transistor having a first semiconductor layer, a first gate insulating layer, a first gate electrode layer, a first source electrode layer, and a first drain electrode layer; a planarization layer over the first field-effect transistor; and a second field-effect transistor having a second semiconductor layer, a second gate insulating layer, a second gate electrode layer, a second source electrode layer, and a second drain electrode layer, over the planarization layer. The first semiconductor layer and the second semiconductor layer are provided by being separated from a semiconductor substrate. The first field-effect transistor is provided over the substrate having an insulating surface by being bonded to a first insulating layer which is formed between the first semiconductor layer and the substrate having an insulating surface. The second field-effect transistor is provided over the first field-effect transistor by being bonded to a second insulating layer which is provided over the planarization layer.

According to another mode of a display device of the present invention, a plurality of pixels having a stacked-layer structure includes, over a substrate having an insulating surface, a first field-effect transistor having a first semiconductor layer, a first gate insulating layer, a first gate electrode layer, a first source electrode layer, and a first drain electrode layer; a planarization layer over the first field-effect transistor; and a second field-effect transistor having a second semiconductor layer, a second gate insulating layer, a second gate electrode layer, a second source electrode layer, and a second drain electrode layer, over the planarization layer. The first semiconductor layer and the second semiconductor layer are provided by being separated from a semiconductor substrate. The first field-effect transistor is provided over the substrate having an insulating surface by being bonded to a first insulating layer which is formed between the first semiconductor layer and the substrate having an insulating surface. The second field-effect transistor is provided over the first field-effect transistor by being bonded to a second insulating layer which is provided over the planarization layer. The first semiconductor layer and the second semiconductor layer each have a different crystal plane orientation.

According to another mode of a display device of the present invention, a plurality of pixels having a stacked-layer structure includes, over a substrate having an insulating surface, a first field-effect transistor having a first semiconductor layer, a first gate insulating layer, a first gate electrode layer, a first source electrode layer, and a first drain electrode layer; a planarization layer over the first field-effect transistor; and a second field-effect transistor having a second semiconductor layer, a second gate insulating layer, a second gate electrode layer, a second source electrode layer, and a second drain electrode layer, over the planarization layer. The first semiconductor layer and the second semiconductor layer are provided by being separated from a semiconductor substrate. The first field-effect transistor is provided over the substrate having an insulating surface by being bonded to a first insulating layer which is formed between the first semiconductor layer and the substrate having an insulating surface. The second field-effect transistor is provided over the first field-effect transistor by being bonded to a second insulating layer which is provided over the planarization layer. The first semiconductor layer and the second semiconductor layer have the same crystal plane orientation and each have a different crystal axis in a channel length direction.

Note that in the present invention, a display device corresponds to a main body of a display panel where a plurality of pixels each including a display element such as a liquid crystal element or an EL element and a peripheral driver circuit for driving these pixels are formed over the same substrate. In addition, the display device in the present invention may also include a peripheral driver circuit, that is, an IC chip connected by so-called chip on glass (COG). Further, the display device in the present invention may also include a flexible printed circuit (FPC) or a printed circuit board (PWB) to which an IC, a resistor, a capacitor, an inductor, a transistor, or the like is attached. Still Further, the display device in the present invention may also include an optical sheet such as a polarizing plate or a retardation plate. Furthermore, the display device in the present invention may also include a backlight unit (may also include an optical waveguide, a prism sheet, a diffusion sheet, a reflective sheet, a light source (e.g., an LED or a cold cathode tube). Note that a light-emitting device corresponds to a display device having a self-luminous display element such as an EL element or an element used for an FED in particular, and a liquid crystal display device corresponds to a display device having a liquid crystal element in particular.

A semiconductor layer which forms a field-effect transistor is provided by being separated from a semiconductor substrate, so that high performance of the field-effect transistor which forms a pixel of a display device can be realized. In addition, the field-effect transistors in the pixel can be provided with a stacked-layer structure. Therefore, a display device can be provided, which can achieve improvement in an aperture ratio of a pixel, which has been reduced due to increase in the number of field-effect transistors, and reduction in the area of the field-effect transistor which occupies a pixel, without depending on a microfabrication technique of the field-effect transistors, even when the number of field-effect transistors in the pixel is increased.

DETAILED DESCRIPTION OF THE INVENTION

Figure 1A:
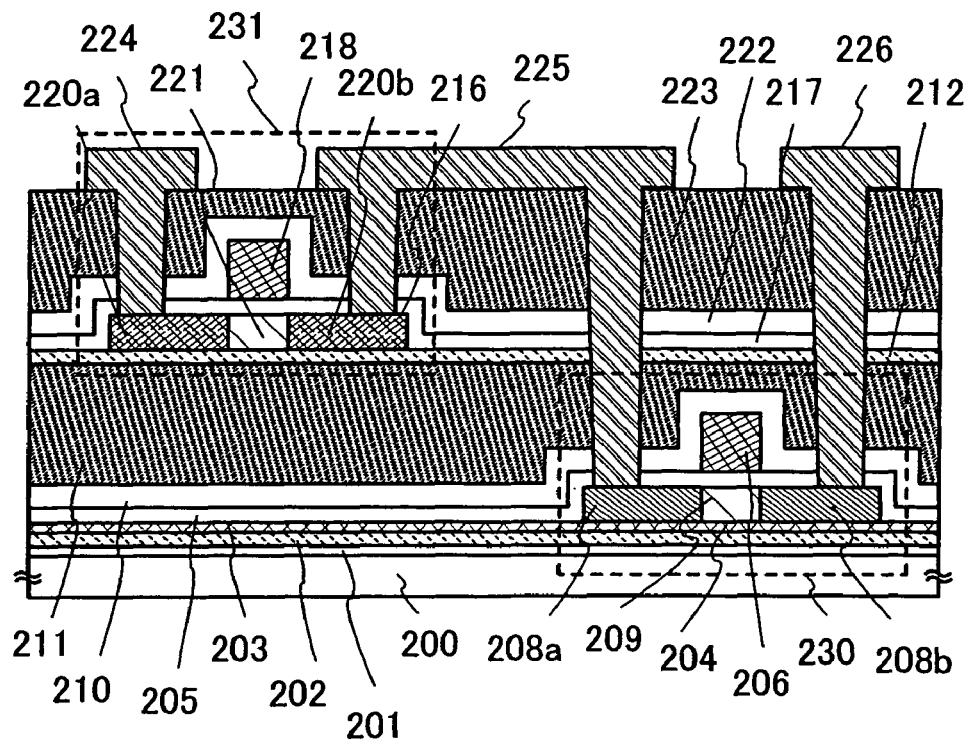
FIGS. 1A and 1B are each a cross-sectional view showing a field-effect transistor included in a pixel which forms a display device of the present invention.

Embodiment modes of the present invention will be described below with reference to the accompanying drawings. Note that the present invention is not limited to the description below, and it is easily understood by those skilled in the art that modes and details can be modified in various ways without departing from the purpose and the scope of the present invention. Accordingly, the present invention should not be interpreted as being limited to the description of the embodiment modes below. Note that the same portions or portions having a similar function are denoted by the same reference numeral through different diagrams in a structure of the present invention to be described hereinafter, and repetitive description thereof is omitted.

Embodiment Mode 1

A method for manufacturing a display device of the present invention is described with reference to FIGS. 1A and 1B, FIGS. 2A and 2B, FIGS. 3A to 3D, FIGS. 4A to 4D, FIGS. 5A to 5F, and FIGS. 6A to 6C. This embodiment mode will describe a structure of a pixel provided with a field-effect transistor as an example of a display device. In particular, this embodiment mode will describe a method for electrically connecting field-effect transistors which are formed over different planes with reference to cross-sectional views.

In this embodiment mode, a field-effect transistor having a semiconductor layer which is separated from a semiconductor substrate and is bonded to a supporting substrate having an insulating surface (or also referred to as a substrate having an insulating surface), a planarization layer, and another field-effect transistor are stacked. It is preferable that a single crystal semiconductor substrate be used as the semiconductor substrate and a single crystal semiconductor layer be formed as the semiconductor layer which is separated from the semiconductor substrate and bonded to the supporting substrate.

A cross-sectional view of field-effect transistors which form a pixel of a display device of this embodiment mode is shown in FIG. 1A. A blocking layer 201, an insulating layer 202, a protection layer 203, a field-effect transistor 230, an insulating layer 210, a planarization layer 211, an insulating layer 212, a field-effect transistor 231, an insulating layer 222, and a planarization layer 223 are formed over a supporting substrate 200 having an insulating surface. The field-effect transistor 230 and the field-effect transistor 231 include a thin semiconductor layer. The field-effect transistor 230 includes a semiconductor layer 204 which includes an impurity region 208a and an impurity region 208b, which are a source region and a drain region, and a channel formation region 209, a gate insulating layer 205, and a gate electrode layer 206. The field-effect transistor 231 includes a semiconductor layer 216 which includes an impurity region 220a and an impurity region 220b, which are a source region and a drain region, and a channel formation region 221, a gate insulating layer 217, and a gate electrode layer 218. A wiring layer 226 is formed to be in contact with the impurity region 208b. A wiring layer 224 is formed to be in contact with the impurity region 220a. A wiring layer 225 which is formed to be in contact with the impurity region 208a and the impurity region 220b electrically connects the field-effect transistor 230 and the field-effect transistor 231.

Figure 1B:
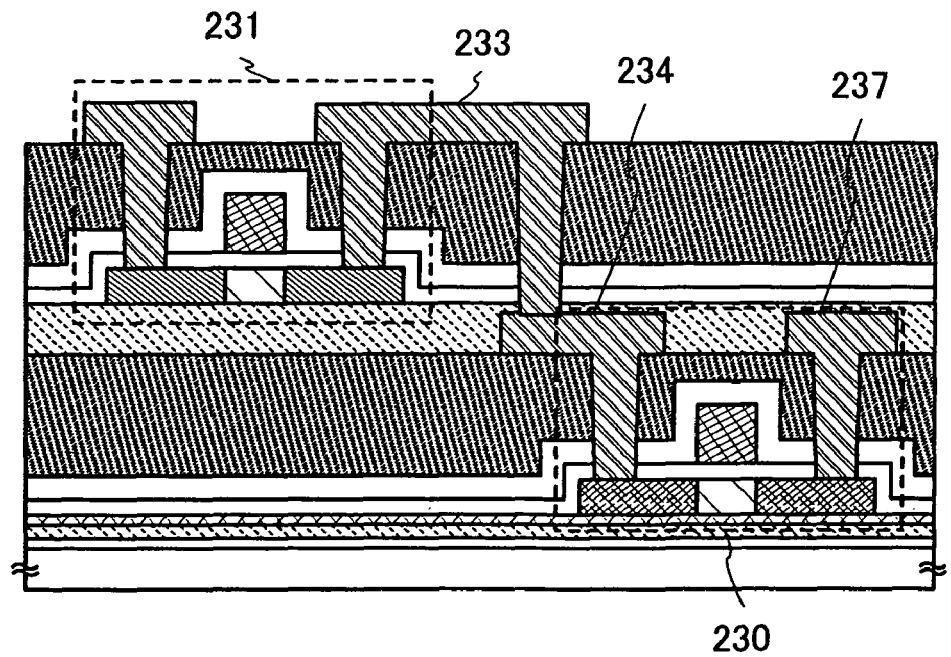

Electrical connection of the field-effect transistors shown in FIG. 1A, which are formed over different planes is an example in which the wiring layer 225 and the wiring layer 226 are formed in openings (contact holes) which successively penetrate the gate insulating layer 205, the insulating layer 210, the planarization layer 211, the insulating layer 212, the gate insulating layer 217, the insulating layer 222, and the planarization layer 223. FIG. 1B shows an alternative example of electrical connection between the field-effect transistor 230 and the field-effect transistor 231.

Figure 2A:
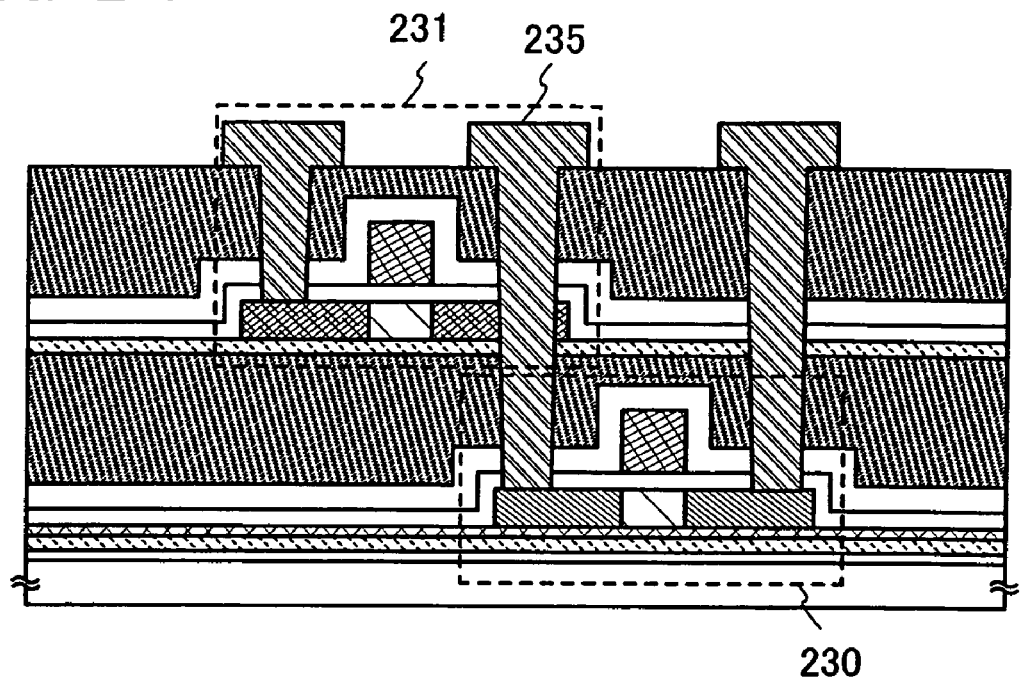
FIGS. 2A and 2B are each a cross-sectional view showing a field-effect transistor included in a pixel which forms a display device of the present invention.
Figure 2B:
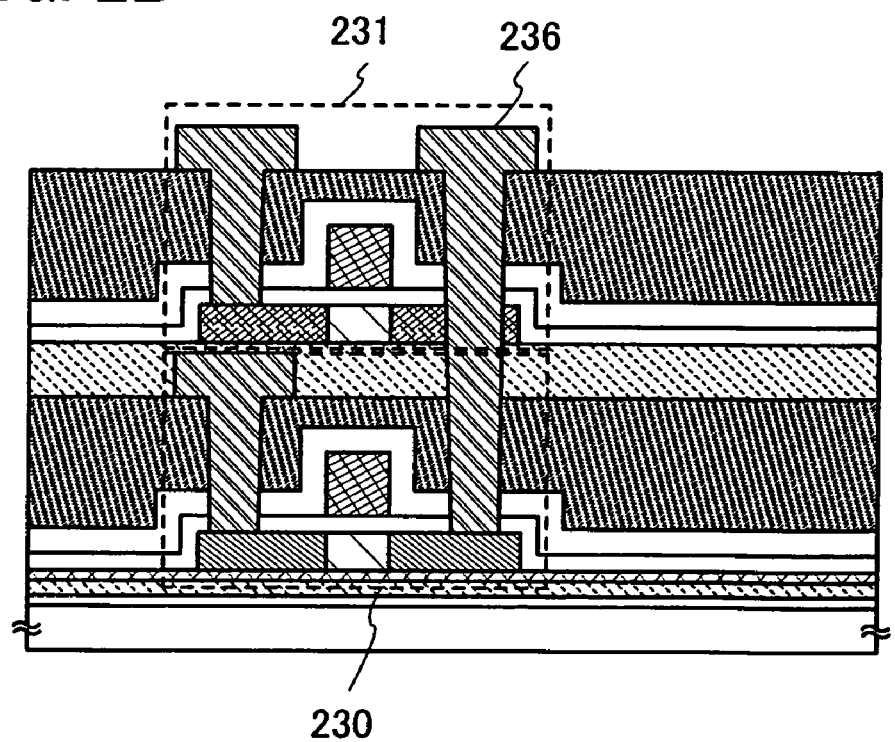

For the wiring layers 224 to 226, after a conductive film with a single-layer structure or stacked-layer structure is formed over the entire surface of the substrate using a CVD method or a sputtering method using a metal element such as aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or compound material which contains any of the metal elements, the wiring layers 224 to 226 can also be formed by etching of the conductive film as selected. For an alloy material containing aluminum, for example, a material containing aluminum as its main component and nickel and a material containing aluminum as its main component, nickel, and at least one of carbon and silicon can be given. Furthermore, for a compound material containing tungsten, for example, a tungsten silicide can be given. For the wiring layers, for example, a stacked-layer structure of a barrier layer, an aluminum-silicon (Al—Si) layer, and a barrier layer or a stacked-layer structure of a barrier layer, an aluminum-silicon (Al—Si) layer, a titanium nitride layer, and a barrier layer can be employed. Note that a barrier layer corresponds to a thin film formed of titanium, a nitride of titanium, molybdenum, or a nitride of molybdenum. Since aluminum and aluminum silicon have low resistance and are inexpensive, they are suitable for materials used to form the wiring layers. Moreover, it is preferable that the wiring layers have a stacked-layer structure in which barrier layers are provided as a top layer and a bottom layer because the formation of hillocks of aluminum or aluminum silicon can be prevented with such a structure. The wiring layers 224 to 226 may have a stacked-layer structure in which embedded wiring layers are formed to fill openings which are contact holes and then lead wiring layers are formed over the embedded wiring layers. In addition, a barrier metal film or a seed film may be provided in the openings as the wiring layers. Note that wiring layers 233, 234, 235, 236, and 237 in FIG. 1B and FIGS. 2A and 2B are wiring layers having a stacked-layer structure similar to the wiring layers 224, 225, and 226.

A cross-sectional view of the field-effect transistors shown in FIG. 1B, which form a pixel of a display device is an example in which after the planarization layer 211 which covers the field-effect transistor 230 is formed, openings which reach the impurity regions 208a and 208b are formed in the gate insulating layer 205, the insulating layer 210, and the planarization layer 211; and the wiring layers 234 and 237 which are connected to the impurity regions 208a and 208b, respectively, are formed. The wiring layer 233 which is formed to be in contact with the impurity region 220b of the field-effect transistor 231 and the wiring layer 234 electrically connects the field-effect transistor 231 in the upper layer and the field-effect transistor 230 in the lower layer. In the case of FIG. 1B, another planarization layer may be formed over the wiring layers 234 and 237 to planarize projections and depressions due to the wiring layers 234 and 237 before the insulating layer 212 is formed. In FIG. 1B, the insulating layer 212 is formed to be thick so as to also serve as a planarization layer.

Note that in this specification, "connection" means "electrical connection" unless otherwise described.

The field-effect transistors which are stacked in different planes have either n-type or p-type conductivity. FIG. 1A shows an example in which the field-effect transistor 230 in the lower layer is an n-channel field-effect transistor which includes n-type impurity regions as the impurity regions 208a and 208b, while the field-effect transistor 231 in the upper layer is a p-channel field-effect transistor which includes p-type impurity regions as the impurity regions 220a and 220b. On the other hand, FIG. 1B shows an example in which the field-effect transistor 230 in the lower layer is a p-channel field-effect transistor which includes p-type impurity regions as the impurity regions 208a and 208b, while the field-effect transistor 231 in the upper layer is an n-channel field-effect transistor which includes n-type impurity regions as the impurity regions 220a and 220b.

A semiconductor layer in a lower layer and a semiconductor layer in an upper layer which are stacked with a gate insulating layer, a planarization layer, an insulating layer in the upper layer, and the like interposed therebetween are electrically connected by a wiring layer which penetrates the gate insulating layer, the planarization layer, and the insulating layer in the upper layer. In the case where the semiconductor layer in the lower layer and the semiconductor layer in the upper layer are stacked so as to be overlapped with each other, the wiring layer may be formed to penetrate the semiconductor layer in the upper layer and to be in contact with the semiconductor layer in the lower layer. If the semiconductor layers are stacked closely so as to be overlapped with each other, higher integration of a display device having a pixel which includes field-effect transistors can be achieved.

FIGS. 2A and 2B show examples of a pixel of a display device which is formed of filed-effect transistors in which the semiconductor layer in the lower layer and the semiconductor layer in the upper layer are stacked so as to be overlapped with each other. In FIG. 2A, the semiconductor layer 204 (the impurity region 208a) in the field-effect transistor 230, which is the semiconductor element in the lower layer and the semiconductor layer 216 (the impurity region 220b) in the field-effect transistor 231, which is the semiconductor element in the upper layer are stacked to as to be partially overlapped with each other. The wiring layer 235 which electrically connects the field-effect transistor 230 and the field-effect transistor 231 is formed to penetrate the gate insulating layer 205, the insulating layer 210, the planarization layer 211, the insulating layer 212, the semiconductor layer 216 (the impurity region 220b), the gate insulating layer 217, the insulating layer 222, and the planarization layer 223 and to reach the semiconductor layer 204 (the impurity region 208a).

While the semiconductor layer 204 in the field-effect transistor 230 and the semiconductor layer 216 in the field-effect transistor 231 are partially overlapped with each other in FIG. 2A, they may be substantially overlapped with each other using the same mask or the like as shown in FIG. 2B. The larger the area in which the semiconductor layers are overlapped with each other is, the higher integration can be realized. In FIG. 2B, the field-effect transistor 230 and the field-effect transistor 231 are stacked to be almost completely overlapped with each other with the planarization layer interposed therebetween. The wiring layer 236 which electrically connects the field-effect transistor 230 and the field-effect transistor 231 is formed to penetrate the gate insulating layer 205, the insulating layer 210, the planarization layer 211, the insulating layer 212, the semiconductor layer 216 (the impurity region 220b), the gate insulating layer 217, the insulating layer 222, and the planarization layer 223 and to reach the semiconductor layer 204 (the impurity region 208b).

A display device of the present invention has a pixel which includes field-effect transistors, semiconductor layers of which are stacked three-dimensionally to obtain high integration; therefore, the semiconductor layers are disposed in contact and adjacent to the same insulating layer, and further the semiconductor layers can be stacked in contact with a different insulating layer with the planarization layer interposed therebetween in up and down directions. Therefore, arrangement flexibility of the field-effect transistors in the pixel is high, which can lead to higher integration and higher performance. Thus, improvement in an aperture ratio of the pixel and reduction in the area of the field-effect transistors in the pixel can be achieved.

Further, since a semiconductor element which includes a semiconductor layer separated from a semiconductor substrate has smaller leak current caused by grain boundaries than a polycrystalline semiconductor layer which is obtained by a crystallization step, low power consumption of the display device can be realized. Further, variation in threshold values of semiconductor elements due to variation in crystal orientation is small. In addition, ridges on the semiconductor layer surface due to laser crystallization can be reduced; therefore, a gate insulating layer can be thinned.

All the field-effect transistors which are stacked three-dimensionally may be n-channel field-effect transistors or may be p-channel field-effect transistors. Alternatively, a plurality of field-effect transistors may be provided to be in contact with one insulating layer and those field-effect transistors may include both an n-channel field-effect transistor and a p-channel field-effect transistor.

While this embodiment mode describes a stacked-layer structure of two layers, a stacked-layer structure of more than two layers may be employed. A plurality of field-effect transistors can be stacked by bonding an insulating layer provided over a planarization layer and an insulating layer provided over a semiconductor layer.

Since a semiconductor layer which is separated and transferred from a semiconductor substrate is used in the field-effect transistors which form a pixel of a display device of this embodiment mode, a crystal plane orientation and crystal axes of a channel length direction in the field-effect transistor can be controlled by selecting a semiconductor substrate.

By employing a crystal orientation or a crystal axis with which mobility of carriers flowing through a channel of the field-effect transistor is increased, the field-effect transistors which form a pixel of a display device can be operated at higher speed. In addition, the field-effect transistors which form a pixel can be driven at a low voltage, and low power consumption can be achieved. In other words, the possibility that carriers flowing through the channel of the field-effect transistor are scattered by atoms can be reduced, whereby resistance which electrons and holes meet with can be reduced and performance of the field-effect transistors can be improved.

Hereinafter, a method for manufacturing a field-effect transistor which forms a pixel of a display device of this embodiment mode will be described with reference to FIGS. 3A to 3D, FIGS. 4A to 4D, FIGS. 5A to 5F, and FIGS. 6A to 6C.

First, a method for providing a semiconductor layer over a supporting substrate which is a substrate having an insulating surface from a semiconductor substrate will be described with reference to FIGS. 3A to 3D and FIGS. 4A to 4D.

Figure 3A:
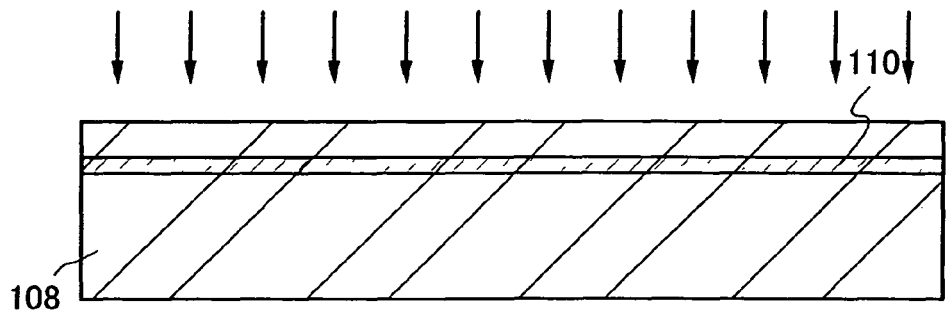
FIGS. 3A to 3D are cross-sectional views showing a manufacturing method of a field-effect transistor in a display device of the present invention.

A semiconductor substrate 108 shown in FIG. 3A is cleaned, and ions accelerated by an electric field are introduced into a predetermined depth from the surface to form an embrittlement layer 110. Ion introduction is performed in consideration of the thickness of a semiconductor layer which is to be transferred to a supporting substrate. An accelerating voltage for introducing ions into the semiconductor substrate 108 is set in consideration of such a thickness.

As the semiconductor substrate 108, a semiconductor substrate such as a silicon substrate or a germanium substrate; or a compound semiconductor substrate such as a gallium arsenide substrate or an indium phosphide substrate is used. It is preferable that a single crystal semiconductor substrate be used as the semiconductor substrate 108; however, a polycrystalline semiconductor substrate may be used as well. Alternatively, a semiconductor substrate formed of silicon having lattice distortion, silicon germanium in which germanium is added to silicon, or the like may be used. Silicon having a distortion can be formed by film formation of silicon on silicon germanium or silicon nitride which has a larger lattice constant than silicon. The semiconductor layer obtained over the supporting substrate can be determined by selecting the semiconductor substrate to serve as a base.

In addition, the crystal plane orientation of the semiconductor substrate 108 may be selected depending on a semiconductor element which is to be formed (a field-effect transistor in this embodiment mode). For example, a semiconductor substrate having a {100} crystal plane orientation, a {110} crystal plane orientation, or the like can be used.

In this embodiment mode, an ion introduction separation method in which ions of hydrogen, helium, or fluorine are introduced into a predetermined depth of the semiconductor substrate, and then, heat treatment is performed and a semiconductor layer of a superficial part is separated is employed; however, a method in which single crystal silicon is epitaxially grown over porous silicon, and then, a porous silicon layer is cleaved and separated with water jet may be employed.

For example, a single crystal silicon substrate is used as the semiconductor substrate 108, and the surface thereof is processed with dilute hydrofluoric acid so that a natural oxide film is removed and a contaminant such as dust or the like attached to the surface is also removed, whereby the surface of the semiconductor substrate 108 is cleaned.

The embrittlement layer 110 may be formed by introduction of ions by an ion doping method or an ion implantation method. The embrittlement layer 110 is formed by introduction of ions of hydrogen, helium, or a halogen typified by fluorine. When fluorine ions are introduced as a halogen element, $BF_3$ may be used as a source gas. Note that an ion implantation method is a method in which an ionized gas is introduced into a semiconductor after being mass separated.

When halogen ions such as fluorine ions are introduced into the single crystal silicon substrate by an ion implantation method, fluorine which has been implanted knocks out (expels) silicon atoms in silicon crystal lattices, so that blank portions are formed effectively and microvoids are made in the embrittlement layer. In this case, a volume change occurs in microvoids formed in the embrittlement layer by heat treatment at a relatively low temperature so that separation occurs along the embrittlement layer, whereby a thin single crystal semiconductor layer can be formed. After the introduction of fluorine ions, hydrogen ions may be introduced to contain hydrogen in the voids. Since the embrittlement layer which is formed to separate the thin semiconductor layer from the semiconductor substrate is separated using a volume change in microvoids formed in the embrittlement layer, it is preferable to make effective use of fluorine ions or hydrogen ions in this manner.

Introduction may be performed with one or a plurality of ions of the same atom, in which the mass numbers are different. For example, in the case where hydrogen ions are introduced, it is preferable that $H^+$, $H_2^+$, and $H_3^+$ ions be contained and the proportion of $H_3^+$ ions be high. In the case where hydrogen ions are introduced, if $H^+$, $H_2^+$, and $H_3^+$ ions are contained and the proportion of $H_3^+$ ions is high, introduction efficiency can be increased and introduction time can be shortened. Such a structure facilitates the separation.

Because there is a need of introducing ions at a high dose for forming the embrittlement layer, the surface of the semiconductor substrate 108 may be roughened. Therefore, a protective layer against ion introduction, such as a silicon nitride film, a silicon nitride oxide film, or a silicon oxide film may be formed on the surface into which ions are introduced to have a thickness of 50 nm to 200 nm.

For example, a stacked layer of a silicon oxynitride film (with a thickness of 5 nm to 300 nm, preferably 30 nm to 150 nm (e.g., 50 nm)) and a silicon nitride oxide film (with a thickness of 5 nm to 150 nm, preferably 10 nm to 100 nm (e.g., 50 nm)) is formed by a plasma CVD method as the protective layer over the semiconductor substrate 108. As an example, a silicon oxynitride film is formed with a thickness of 50 nm over the semiconductor substrate 108, and a silicon nitride oxide film is stacked with a thickness of 50 nm over the silicon oxynitride film. The silicon oxynitride film may be a silicon oxide film formed by a chemical vapor deposition method using an organosilane gas.

Further, degreasing and cleaning may be performed on the semiconductor substrate 108 and an oxide film on the surface may be removed and thermal oxidation may be performed. As thermal oxidation, general dry oxidation may be performed; however, oxidation in an oxidizing atmosphere to which a halogen is added is preferably performed. For example, heat treatment is performed at a temperature of greater than or equal to 700° C. in an atmosphere containing HCl at 0.5 to 10 volume % (preferably 3 volume %) with respect to oxygen. The thermal oxidation is preferably performed at a temperature of 950° C. to 1100° C. The processing time may be 0.1 hour to 6 hours, preferably 0.5 hour to 3.5 hours. The film thickness of the oxide film which is formed is 10 to 1000 nm (preferably 50 to 200 nm), for example, 100 nm.

Instead of HCl, one or a plurality of kinds selected from HF, $NF_3$, HBr, $Cl_2$, $ClF_3$, $BCl_3$, $F_2$, $Br_2$, or the like can be used as the substance which contains halogen.

When heat treatment is performed within such a temperature range, a gettering effect by a halogen element can be obtained. Gettering particularly has an effect of removing metal impurities. In other words, impurities such as metal are turned into a volatile chloride by the action of chloride, moved into the air, and removed by action of chlorine. The heat treatment is effective if being carried out on the semiconductor substrate 108 with its surface subjected to chemical mechanical polishing (CMP) treatment. Further, hydrogen has an effect of compensating defects at an interface between the semiconductor substrate 108 and the oxide film which is formed and reducing a local level density of the interface, and the interface between the semiconductor substrate 108 and the oxide film is inactivated and thus electric characteristics are stabilized.

A halogen can be contained in the oxide film formed by this heat treatment. Halogen elements are contained at a concentration of $1\times10^{17}/cm^3$ to $5\times10^{20}/cm^3$, so that the oxide film can serve as a protective film which captures impurities such as metal and prevents contamination of the semiconductor substrate 108.

For forming the embrittlement layer 110, an accelerating voltage and the total number of ions can be adjusted in accordance with the thickness of a film deposited over the semiconductor substrate, the thickness of the semiconductor layer which is to be separated from the semiconductor substrate and transferred to the supporting substrate, and ion species which are used for introduction.

For example, a hydrogen gas is used as a source material, and ions are introduced at an accelerating voltage of 40 kV with the total number of ions of $2\times10^{16}$ ions/cm² by an ion doping method so that the embrittlement layer can be formed. If the thickness of the protective layer is increased and ions are introduced under the same condition to form the embrittlement layer, the thickness of a semiconductor layer which is separated from the semiconductor substrate and transferred to the supporting substrate can be decreased. For example, although it depends on the ratio of ion species ($H^+$ ions, $H_2^+$ ions, and $H_3^+$ ions), in the case where the embrittlement layer is formed under the above-described condition, if a silicon oxynitride film (with a thickness of 50 nm) and a silicon nitride oxide film (with a thickness of 50 nm) are stacked as a protective layer over the semiconductor substrate, the thickness of the semiconductor layer which is transferred to the supporting substrate is approximately 120 nm; whereas, if a silicon oxynitride film (with a thickness of 100 nm) and a silicon nitride oxide film (with a thickness of 50 nm) are stacked as a protective layer over the semiconductor substrate, the thickness of the semiconductor layer which is transferred to the supporting substrate is approximately 70 nm.

When helium (He) or hydrogen is used as a source gas, ions are introduced with an accelerating voltage within the range of 10 kV to 200 kV and with a dose within the range of $1 \times 10^{16}$ ions/cm$^2$ to $6 \times 10^{16}$ ions/cm$^2$ so that the embrittlement layer can be formed. When helium is used as a source gas, $He^+$ ions can be introduced as main ions without performing mass separation. On the other hand, when hydrogen is used as a source gas, $H_3^+$ ions and $H_2^+$ ions can be introduced as main ions. Ion species also change depending on a plasma generation method, a pressure, the supply of a source gas, or an accelerating voltage.

As an example of formation of the embrittlement layer, a silicon oxynitride film (with a thickness of 50 nm), a silicon nitride oxide film (with a thickness of 50 nm), and a silicon oxide film (with a thickness of 50 nm) are stacked as a protective layer over the semiconductor substrate, and hydrogen is introduced at an acceleration voltage of 40 kV and a dose of $2 \times 10^{16}$ ions/cm$^2$ to form the embrittlement layer in the semiconductor substrate. Then, a silicon oxide film (with a thickness of 50 nm) is formed as an insulating layer over the silicon oxide film which is the uppermost layer of the protective layer. As another example of the formation of the embrittlement layer, a silicon oxide film (with a thickness of 100 nm) and a silicon nitride oxide film (with a thickness of 50 nm) are stacked as a protective layer over the semiconductor substrate, and hydrogen is introduced at an acceleration voltage of 40 kV and a dose of $2 \times 10^{16}$ ions/cm$^2$ to form the embrittlement layer in the semiconductor substrate. Then, a silicon oxide film (with a thickness of 50 nm) is formed as an insulating layer over the silicon nitride oxide film which is the uppermost layer of the protective layer. Note that the silicon oxynitride film and the silicon nitride oxide film may be formed by a plasma CVD method, and the silicon oxide film may be formed by a CVD method using an organosilane gas.

In the case where a glass substrate which is used in the electronics industry, such as an aluminosilicate glass substrate, an aluminoborosilicate glass substrate, or a barium borosilicate glass substrate, is used as a supporting substrate 101, alkali metal such as sodium is contained in a small amount in the glass substrate, and the small amount of impurity might adversely affect the characteristics of semiconductor elements such as transistors. The silicon nitride oxide film has an effect of preventing such an impurity like a metal impurity contained in the supporting substrate 101 from diffusing into the semiconductor substrate side. Note that a silicon nitride film may be formed as an alternative to the silicon nitride oxide film. A stress relieving layer such as a silicon oxynitride film or a silicon oxide film may be provided between the semiconductor substrate and the silicon nitride oxide film. When a stacked-layer structure of the silicon nitride oxide film and the silicon oxynitride film is provided, diffusion of impurities into the semiconductor substrate can be prevented and stress distortion can be reduced.

Figure 3B:
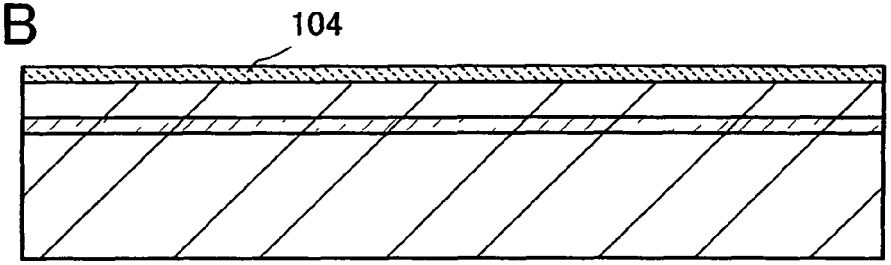

Next, as shown in FIG. 3B, a silicon oxide film is formed as an insulating layer 104 on the surface which forms a bond with the supporting substrate. Note that the protective layer stacked at formation of the embrittlement layer may be removed to form the insulating layer 104 or the insulating layer 104 may be stacked over the protective layer. It is preferable to use a silicon oxide film formed by a chemical vapor deposition method with the use of an organosilane gas as the silicon oxide film. Alternatively, a silicon oxide film formed by a chemical vapor deposition method with the use of a silane gas can be applied. In the film formation by a chemical vapor deposition method, a film formation temperature of, for example, less than or equal to 350° C. (300° C. as a specific example) is applied as the temperature that does not cause degasification from the embrittlement layer 110 which is formed in the single crystal semiconductor substrate. Further, heat treatment which separates a single crystal semiconductor layer or a polycrystalline semiconductor layer from a single crystal semiconductor substrate or a polycrystalline semiconductor substrate is performed at a temperature higher than the temperature at which the insulating layer 104 is formed.

The insulating layer 104 has a smooth surface and forms a hydrophilic surface. A silicon oxide film is appropriate for the insulating layer 104. In particular, a silicon oxide film formed by a chemical vapor deposition method with the use of an organosilane gas is preferable. Examples of the organosilane gas include compounds containing silicon, such as tetraethyl orthosilicate (TEOS, chemical formula: $Si(OC_2H_5)_4$), trimethylsilane (TMS, chemical formula: $(CH_3)_3SiH$), tetramethylsilane (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane ($SiH(N(CH_3)_2)_3$). Note that in the case where a silicon oxide layer is formed by a chemical vapor deposition method with the use of organosilane as a source gas, it is preferable to mix a gas which provides oxygen. For the gas which provides oxygen, oxygen, nitrous oxide, nitrogen dioxide, or the like can be used. Further, an inert gas such as argon, helium, nitrogen, or hydrogen may be mixed. Further, as the insulating layer 104, a silicon oxide layer formed by a chemical vapor deposition method with the use of silane such as monosilane, disilane, trisilane, or the like as a source gas can also be applied. Also in this case, it is preferable to mix a gas which provides oxygen, an inert gas, or the like. In the film formation by a chemical vapor deposition method, a film formation temperature of, for example, less than or equal to 350° C. is applied as the temperature that does not cause degasification from the embrittlement layer 110 which is formed in the semiconductor substrate 108. Further, heat treatment which separates a semiconductor layer from a single crystal semiconductor substrate or a polycrystalline semiconductor substrate is performed at a temperature higher than the temperature at which the insulating layer 104 is formed. Note that the chemical vapor deposition method includes a plasma CVD method, a thermal CVD method, and a photo CVD method in its category.

Further alternatively, for the insulating layer 104, silicon oxide formed by heat treatment under an oxidizing atmosphere, silicon oxide which grows by reaction of oxygen radicals, chemical oxide formed using an oxidative chemical solution, or the like can be applied. As the insulating layer 104, an insulating layer including a siloxane (Si—O—Si) bond may be applied as well. Further, the insulating layer 104 may be formed by reaction between the organosilane gas and oxygen radicals or nitrogen radicals.

The insulating layer 104 which has a smooth surface and forms a hydrophilic surface is provided with a thickness of 5 nm to 500 nm, preferably 10 nm to 200 nm. With this thickness, it is possible to smooth the roughness of the surface of a film to be formed and to obtain smoothness of the growth surface of the film. In addition, distortion of the supporting substrate and the semiconductor substrate 108 that are to be bonded together can be reduced. The surface of the insulating layer 104 is preferably set as follows: arithmetic mean roughness Ra is less than 0.8 nm and root-mean-square roughness Rms is less than 0.9 nm; preferably Ra is less than or equal to 0.4 nm and Rms is less than or equal to 0.5 nm; and more preferably Ra is less than or equal to 0.3 nm and Rms is less than or equal to 0.4 nm. For example, Ra is 0.27 nm and Rms is 0.34 nm. In this specification, Ra is arithmetic mean roughness, Rms is root-mean-square roughness, and the measurement area is 2 $\mu m^2$ or 10 $\mu m^2$.

A silicon oxide film which is similar to the insulating layer 104 may also be provided for the supporting substrate 101. In other words, when a semiconductor layer 102 is bonded to the supporting substrate 101, a firm bond can be formed by providing the insulating layer 104 which is formed of a silicon oxide film which preferably uses organosilane as a source material for one surface or both surfaces which form a bond.

Figure 3C:
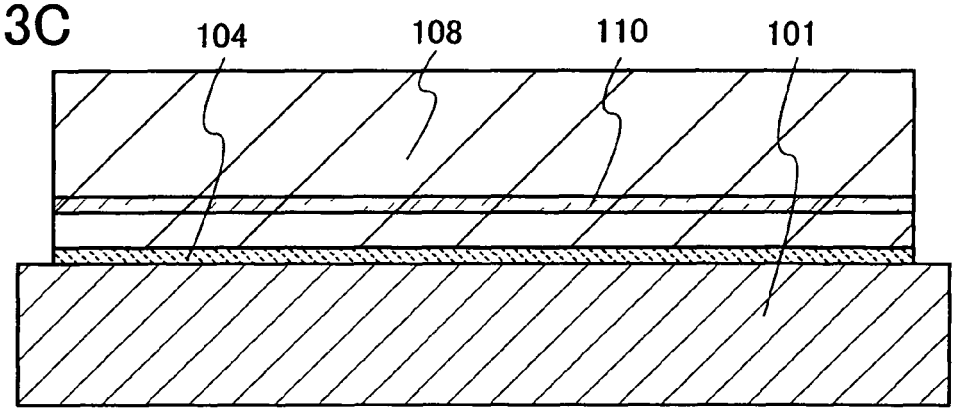

FIG. 3C shows a mode in which the supporting substrate 101 and a surface of the insulating layer 104 over the semiconductor substrate 108 are disposed in close contact with each other and bonded to each other. Surfaces that form the bond are sufficiently cleaned. The surfaces of the supporting substrate 101 and the insulating layer 104 over the semiconductor substrate 108 may be cleaned by megasonic cleaning or the like. Further, the surfaces may be cleaned with ozone water after the megasonic cleaning to remove an organic substance and to improve the hydrophilicity of the surfaces.

By making the supporting substrate 101 and the insulating layer 104 face each other and pressing one part thereof from the outside, the supporting substrate 101 and the insulating layer 104 attract each other by increase in van der Waals forces or contribution of hydrogen bonding due to local reduction in distance between the bonding surfaces. Further, since the distance between the supporting substrate 101 and the insulating layer 104 in an adjacent region, which also face each other, is reduced, a region which is strongly influenced by van der Waals forces or a region to which hydrogen bonding contributes is widened; accordingly, bonding proceeds and spreads to the entire bonding surfaces. For example, a pressure of approximately 100 kPa to 5000 kPa may be used.

Then, when the supporting substrate 101 and the insulating layer 104 are disposed in close contact, a bond is formed. Van der Waals force acts on this bonding, and the supporting substrate 101 and the semiconductor substrate 108 are pressed against each other, so that a stronger bond can be formed by hydrogen bonding.

When the supporting substrate 101 and the semiconductor substrate 108 are pressed against each other so that a pressure of one of the four corners of the substrate is suppressed at 100 kPa to 5000 kPa, the bonding surfaces come close to each other; thus, the bonding can shift from Van der Waals force to hydrogen bonding. When the bonding surfaces at the one place comes close in the substrate, the adjacent bonding surfaces also come close and shift to hydrogen bonding; thus, the entire bonding surfaces can shift to hydrogen bonding.

The surfaces may be activated so as to form a favorable bond. For example, the surfaces where a bond is formed are irradiated with an atomic beam or an ion beam. When an atomic beam or an ion beam is used, an inert gas neutral atom beam or an inert gas ion beam of argon or the like can be used. Alternatively, plasma irradiation or radical treatment is performed. By such surface treatment, a bond between different kinds of materials is easily formed even at a temperature of 200° C. to 400° C.

Further, in order to improve bonding strength of a bond interface between the supporting substrate and the insulating layer, heat treatment is preferably performed. For example, heat treatment is performed under a temperature condition of 70° C. to 350° C. (e.g., at 200° C. for 2 hours) with an oven, a furnace, or the like.

Figure 3D:
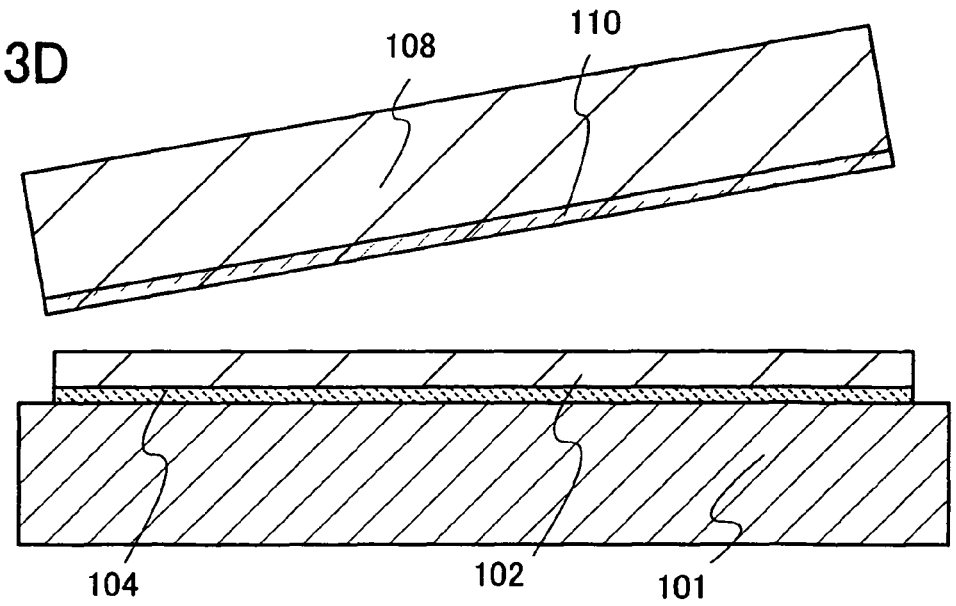

In FIG. 3D, after the supporting substrate 101 and the semiconductor substrate 108 are attached to each other, heat treatment is performed so that the semiconductor substrate 108 is separated from the supporting substrate 101 with the embrittlement layer 110 used as a cleavage plane. When heat treatment is performed at, for example, 400° C. to 700° C., a volume change occurs in microvoids formed in the embrittlement layer 110, which enables cleavage to occur along the embrittlement layer 110. Since the insulating layer 104 is bonded to the supporting substrate 101, the semiconductor layer 102 having the same crystallinity as the semiconductor substrate 108 remains over the supporting substrate 101.

The heat treatment within the temperature range of 400° C. to 700° C. may be successively performed with the same apparatus as the above heat treatment for improving the bonding strength or with a different apparatus. For example, after heat treatment in a furnace at 200° C. for 2 hours, the temperature is increased to near 600° C. and held for 2 hours, the temperature is decreased to a temperature ranging from 400° C. to a room temperature, and then the substrates are taken out of the furnace. Alternatively, heat treatment may be performed with a temperature which has been increased from a room temperature. Further alternatively, heat treatment may be performed in a furnace at 200° C. for 2 hours, and then, heat treatment may be performed within a temperature range of 600° C. to 700° C. with a rapid thermal annealing (RTA) apparatus for 1 minute to 30 minutes (e.g., at 600° C. for 7 minutes, or at 650° C. for 7 minutes).

By the heat treatment within the temperature range of 400° C. to 700° C., bonding between the insulating layer and the supporting substrate shifts from hydrogen bonding to covalent bonding, and the element which has been introduced into the embrittlement layer is separated out and pressure rises, whereby the semiconductor layer can be separated from the semiconductor substrate. After the heat treatment, the supporting substrate and the semiconductor substrate are in a state where one of them is provided over the other, and the supporting substrate and the semiconductor substrate can be separated from each other without application of large force. For example, one substrate provided over the other substrate is lifted by a vacuum chuck, so that the substrate can be easily separated. At this time, if the lower substrate is fixed with a vacuum chuck or a mechanical chuck, the supporting substrate and the semiconductor substrate can be separated from each other without horizontal deviation.

Note that although an example in which the semiconductor substrate 108 is smaller than the supporting substrate 101 is shown in FIGS. 3A to 3D and FIGS. 4A to 4D, the present invention is not limited thereto, and the semiconductor substrate 108 and the supporting substrate 101 may be the same size or the semiconductor substrate 108 may be larger than the supporting substrate 101.

Figure 4A:
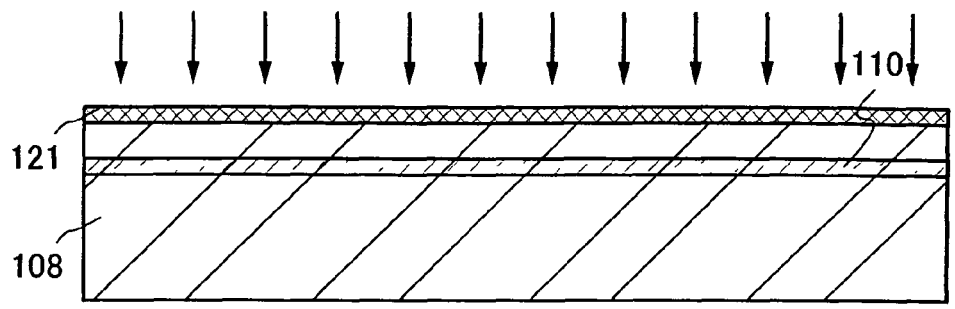
FIGS. 4A to 4D are cross-sectional views showing a manufacturing method of a field-effect transistor in a display device of the present invention.

FIGS. 4A to 4D show steps of forming a semiconductor layer by provision of an insulating layer which is bonded to the semiconductor layer and provided on the supporting substrate side. FIG. 4A shows a step in which ions accelerated by an electric field are introduced into a predetermined depth of the semiconductor substrate 108 provided with a silicon oxide film as a protective layer 121 to form the embrittlement layer 110. The ion introduction is performed in a manner similar to that of FIG. 3A. Formation of the protective layer 121 on the surface of the semiconductor substrate 108 can prevent the surface from being damaged and from losing the planarity due to ion introduction. In addition, the protective layer 121 has an effect of preventing diffusion of impurities into the semiconductor layer 102 formed of the semiconductor substrate 108.

Figure 4B:
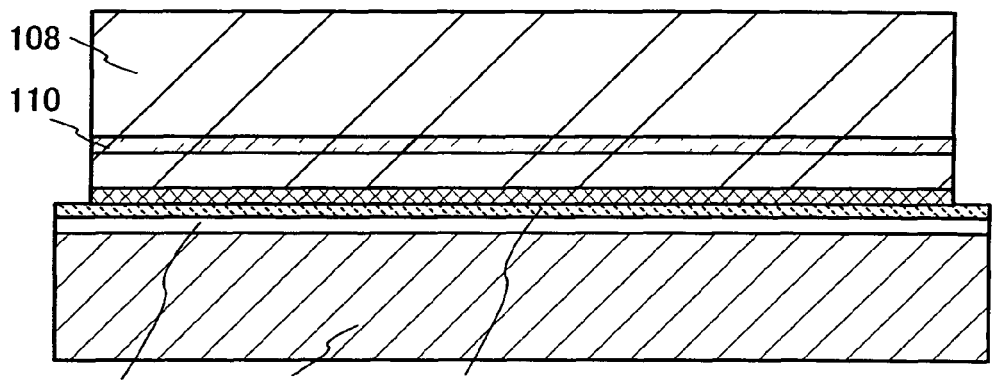

FIG. 4B shows a step in which the supporting substrate 101, over which a blocking layer 109 and the insulating layer 104 are formed, and a surface of the protective layer 121, which is formed on the semiconductor substrate 108, are disposed in close contact with each other to form a bond. The blocking layer 109 is provided so as to prevent impurities such as sodium ions from diffusing from the supporting substrate 101 and contaminating the semiconductor layer. Note that in a case where there is no possibility of diffusion of impurities from the supporting substrate 101 which causes adverse effects on the semiconductor layer, the blocking layer 109 can be omitted. The insulating layer 104 over the supporting substrate 101 is disposed in close contact with the protective layer 121 of the semiconductor substrate 108 so that they are bonded to each other.

Figure 4C:
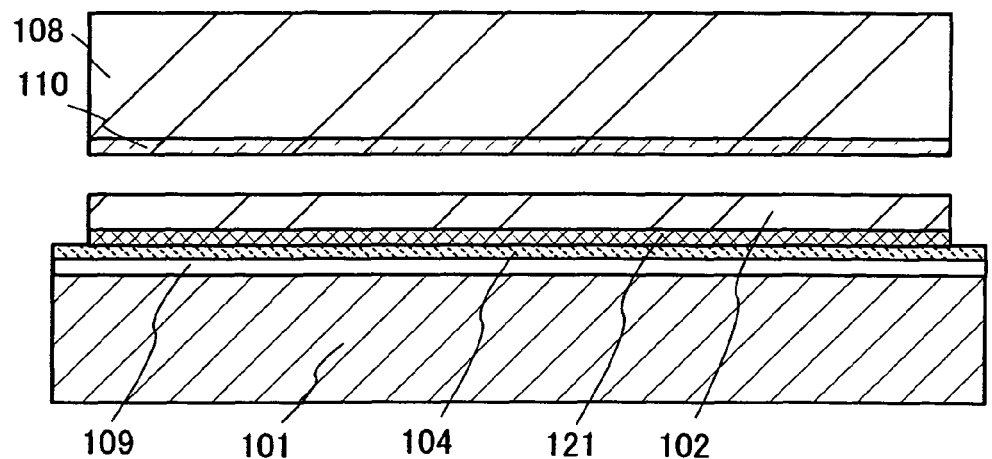
Figure 4D:
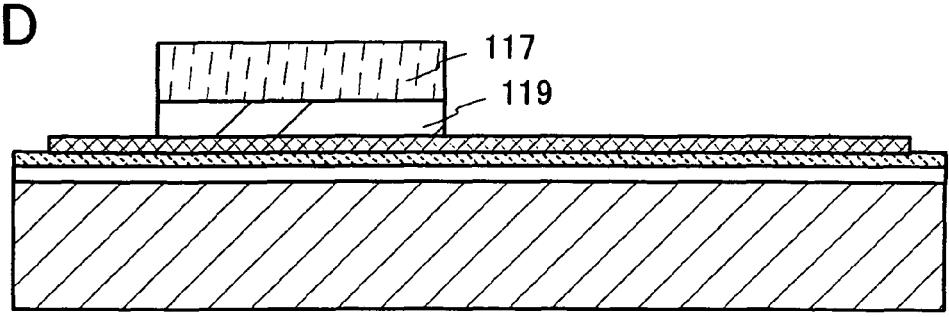

After that, the semiconductor substrate 108 is separated as shown in FIG. 4C. Heat treatment for separating the semiconductor layer is performed in a manner similar to that of the case of FIG. 3D. The temperature of the heat treatment in the bonding and separation steps is less than or equal to that of the heat treatment which is performed in advance on the supporting substrate 101. In this manner, the semiconductor substrate shown in FIG. 4C can be obtained.

As the supporting substrate 101, a substrate having an insulating property or a substrate having an insulating surface can be used, and it is possible to use any of a variety of glass substrates that are used in the electronics industry, called non-alkali glass substrates, such as an aluminosilicate glass substrate, an aluminoborosilicate glass substrate, and a barium borosilicate glass substrate. Further, a quartz substrate, a ceramic substrate, a sapphire substrate, a metal substrate whose surface is coated with an insulating layer, or the like can be applied.

Through the above-described process, as shown in FIG. 4C, the insulating layer 104 is provided over the supporting substrate 101, which is a substrate having an insulating surface, and the semiconductor layer 102 which has been separated from the semiconductor substrate 108 is formed.

The semiconductor layer 102 provided over the supporting substrate 101 is etched into an island-like shape. A mask 117 is formed over the semiconductor layer 102. A semiconductor layer 119 having an island-like shape is formed by etching the semiconductor layer 102 using the mask 117. While FIGS. 4A to 4C show an example in which the protective layer and the insulating layer below the semiconductor layer are not etched in the etching treatment for forming the semiconductor layer 119, the protective layer and the insulating layer may also be etched in the etching treatment for forming the semiconductor layer 119. In such a case, the protective layer and the insulating layer reflect the shape of the semiconductor layer 119 having an island-like shape and provided only under the semiconductor layer 119.

The semiconductor layer which is separated from the semiconductor substrate and is transferred to the supporting substrate may have crystal defects due to the separation step and the ion introduction step, and may lose surface planarity and have projections and depressions. When a field-effect transistor is formed using the semiconductor layer, it is difficult to form a thin gate insulating layer with high withstand voltage on the upper surface of the semiconductor layer with such projections and depressions. In addition, if the semiconductor layer has a crystal defect, performance and reliability of the field-effect transistor are adversely affected; for example, a local interface state density with the gate insulating layer is increased.

Therefore, the semiconductor layer is preferably irradiated with an electromagnetic wave such as laser light to reduce crystal defects. Irradiation with an electromagnetic wave can melt the semiconductor layer at least partially and can reduce crystal defects in the semiconductor layer. Note that an oxide film (a natural oxide film or a chemical oxide film) formed on the surface of the semiconductor layer may be removed with dilute hydrofluoric acid before irradiation with an electromagnetic wave.

Any electromagnetic wave may be used as long as it can supply high energy to the semiconductor layer, and laser light can be preferably used.

The energy supply can be performed by colliding the particles having high energy with the semiconductor layer by irradiation or the like and mainly by heat conduction. As a heat source for supplying the particles having high energy, plasma can be used; normal-pressure plasma, high-pressure plasma, a thermal plasma jet, or a flame of a gas burner or the like can be used. Further, as another example of the heat source, an electron beam or the like can be used.

Wavelengths of electromagnetic waves are wavelengths that are absorbed by the semiconductor layer. The wavelengths can be determined by considering the skin depth of electromagnetic waves or the like. For example, the wavelengths of electromagnetic waves can be 190 nm to 600 nm. In addition, electromagnetic wave energy can be determined by considering the wavelengths of electromagnetic waves, the skin depth of electromagnetic waves, the thickness of the semiconductor layer to be irradiated, or the like.

A laser which oscillates laser light can be a continuous wave laser, a pseudo continuous wave laser, or a pulsed laser. A pulsed laser is preferable because the semiconductor layer is partly melted. For example, there are a gas laser such as an excimer laser like a KrF laser, an Ar laser, a Kr laser, or the like; and a solid-state laser such as a YAG laser, a $YVO_4$ laser, a YLF laser, a $YAlO_3$ laser, a $GdVO_4$ laser, a KGW laser, a KYW laser, an alexandrite laser, a Ti:sapphire laser, a $Y_2O_3$ laser, or the like. An excimer laser is a pulsed laser, and some solid-state lasers such as a YAG laser can be used as a continuous wave laser, a pseudo continuous wave laser, or a pulsed laser. Note that in a solid-state laser, the second to fifth harmonics of a fundamental wave can be preferably used. Alternatively, a semiconductor laser such as GaN, GaAs, GaAlAs, or InGaAsP can be used.

If the semiconductor layer can be irradiated with electromagnetic wave energy, lamp light may be used. For example, light emitted from an ultraviolet lamp, a black light, a halogen lamp, a metal halide lamp, a xenon arc lamp, a carbon arc lamp, a high pressure sodium lamp, or a high pressure mercury lamp may be used. A flash annealing with the use of the above lamp light may be used. Since flash annealing which is performed by preferably using a halogen lamp, a xenon lamp, or the like takes very short treatment time, increase in temperature of the supporting substrate can be suppressed.

An optical system including a shutter; a reflector such as a mirror or a half mirror; and a cylindrical lens, a convex lens, or the like may be provided to adjust the shape or path of electromagnetic waves.

Note that as for an irradiation method of electromagnetic waves, electromagnetic waves may be selectively emitted, or light (electromagnetic waves) is scanned in the XY directions so that light (electromagnetic waves) can be emitted. In this case, it is preferable to use a polygon mirror or a galvanometer mirror for an optical system.

Irradiation with electromagnetic waves can be performed in an atmosphere which contains oxygen such as an atmospheric atmosphere or in an inert atmosphere such as a nitrogen atmosphere. To perform irradiation with electromagnetic waves in an inert atmosphere, irradiation with electromagnetic waves may be performed in an airtight chamber, and an atmosphere in this chamber may be controlled. In the case where a chamber is not used, a nitrogen atmosphere can be formed by spraying an inert gas such as nitrogen gas on a surface to be irradiated with electromagnetic waves.

Further, polishing treatment may be performed on the surface of the semiconductor layer to which high energy is supplied by electromagnetic wave irradiation or the like to reduce crystal defects of the surface. Polishing treatment can enhance the planarity of the surface of the semiconductor layer.

For polishing treatment, a chemical mechanical polishing (CMP) method or a liquid jet polishing method can be used. Note that the surface of the semiconductor layer is cleaned and purified before polishing treatment. Cleaning may be performed by using megasonic cleaning, two-fluid jet cleaning, or the like; and dust or the like of the surface of the semiconductor layer is removed by cleaning. In addition, it is preferable to remove a natural oxide film or the like over the surface of the semiconductor layer by using dilute hydrofluoric acid and to expose the semiconductor layer.

In addition, polishing treatment (or etching treatment) may be performed on the surface of the semiconductor layer before irradiation with electromagnetic waves.

In this embodiment mode, when a single crystal silicon substrate is used as the semiconductor substrate 108, a single crystal silicon layer can be obtained as the semiconductor layer 119. Further, since a method for manufacturing a field-effect transistor which forms a pixel of a display device in this embodiment mode allows a process temperature to be less than or equal to 700° C., a glass substrate can be employed as the supporting substrate 101. In other words, similarly to a conventional thin film transistor, the field-effect transistor in this embodiment mode can be formed over a glass substrate, and a single crystal silicon layer can be employed as the semiconductor layer. Accordingly, a field-effect transistor with high performance and high reliability which can operate at high speed and can be driven with low voltage consumption and have a low subthreshold swing and high electron field-effect mobility can be manufactured over a supporting substrate such as a glass substrate.

Next, a method for manufacturing the field-effect transistor shown in the above-described FIG. 1A which forms a pixel of a display device is described with reference to FIGS. 5A to 5F and FIGS. 6A to 6C.

Figure 5A:
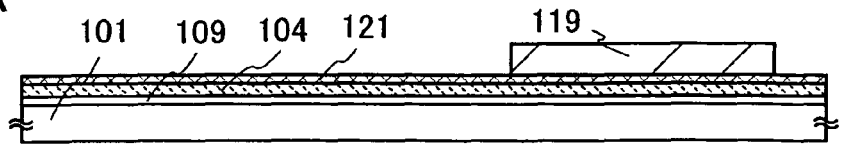
FIGS. 5A to 5F are cross-sectional views showing a manufacturing method of a field-effect transistor in a display device of the present invention.

In FIG. 5A, the blocking layer 109, the insulating layer 104, the protective layer 121, and the semiconductor layer 119 are formed over the supporting substrate 101. The supporting substrate 101, the semiconductor layer 119, the blocking layer 109, the insulating layer 104, and the protective layer 121 correspond to those in FIGS. 4A to 4D.

To the semiconductor layer 119, a p-type impurity such as boron, aluminum, or gallium or an n-type impurity such as phosphorus or arsenic is preferably added in accordance with a formation region of an n-channel field-effect transistor or a p-channel field-effect transistor In other words, the p-type impurity is added to a formation region of the n-channel field-effect transistor and the n-type impurity is added to a formation region of the p-channel field-effect transistor, whereby so-called well regions are formed. The dose of impurity ions may range approximately from $1 \times 10^{12}$ ions/cm$^2$ to $1 \times 10^{14}$ ions/cm$^2$). Furthermore, in the case of controlling the threshold voltage of each field-effect transistor, a p-type or n-type impurity may be added to the well region.

The semiconductor layer 119 may be further etched to have island-like shapes in accordance with arrangement of the semiconductor elements.

An oxide film over the semiconductor layer is removed, and a gate insulating layer 205 which covers the semiconductor layer 119 is formed.

The gate insulating layer 205 may be formed of silicon oxide or a stacked-layer structure of silicon oxide and silicon nitride. The gate insulating layer 205 may be formed by depositing an insulating film by a plasma CVD method or a low pressure CVD method or may be formed by solid phase oxidation or solid phase nitridation by plasma treatment. This is because a gate insulating layer which is formed by oxidizing or nitriding a semiconductor layer by plasma treatment is dense and has high withstand voltage and is excellent in reliability.

Further, as the gate insulating layer 205, a high-dielectric constant material such as zirconium dioxide, hafnium oxide, titanium dioxide, or tantalum pentoxide may be used. By using such a high-dielectric constant material for the gate insulating layer 205, gate leakage current can be reduced.

Figure 5B:
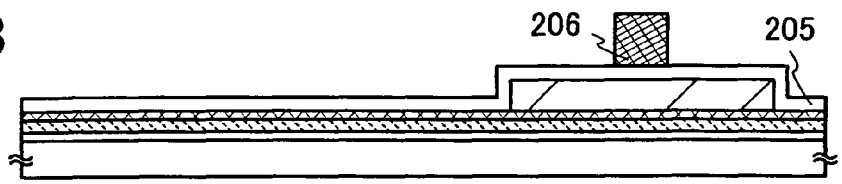
Figure 5C:
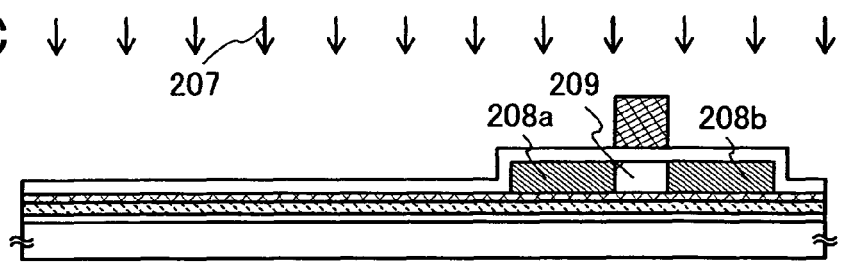

A gate electrode layer 206 is formed over the gate insulating layer 205 (see FIG. 5B). The gate electrode layer 206 can be formed by a sputtering method, an evaporation method, a CVD method, or the like. The gate electrode layer 206 may be formed of an element selected from tantalum (Ta), tungsten (W), titanium (Ti), molybdenum (Mo), aluminum (Al), copper (Cu), chromium (Cr), or neodymium (Nd); or an alloy material or a compound material which contains any of these elements as its main component. In addition, as the gate electrode layer 206, a semiconductor layer typified by a polycrystalline silicon film doped with an impurity element such as phosphorus or an AgPdCu alloy may be used.

The impurity regions 208a and 208b, which are n-type impurity regions, are formed by adding an impurity element 207 imparting n-type conductivity using the gate electrode layer 206 as a mask. In this embodiment mode, phosphine (PH$_3$) is used as a doping gas containing an impurity element. Here, doping is performed such that the impurity regions 208a and 208b contain the impurity element imparting n-type conductivity at a concentration of approximately $5 \times 10^{19}$ atoms/cm$^3$ to $5 \times 10^{20}$ atoms/cm$^3$. In addition, the channel formation region 209 is formed in the semiconductor layer 119 (see FIG. 5C).

The impurity regions 208a and 208b are n-type high-concentration impurity regions and serve as a source and a drain.

Heat treatment, intense light irradiation, or laser irradiation may be performed in order to activate the impurity element, which can repair plasma damage of the gate insulating layer and of the interface between the gate insulating layer and the semiconductor layer as well as activation.

Subsequently, an interlayer insulating layer which covers the gate electrode layer and the gate insulating layer is formed. In this embodiment mode, the interlayer insulating layer is a stacked layer of the insulating layer 210 which contains hydrogen and serves as a protective film and the planarization layer 211.

Further, heat treatment is performed in a nitrogen atmosphere at 300° C. to 550° C. for 1 hour to 12 hours to hydrogenate the semiconductor layer. Preferably, this heat treatment is performed at 400° C. to 500° C. This step terminates dangling bonds of the semiconductor layer with hydrogen which is contained in the insulating layer 210, which is the interlayer insulating layer. In this embodiment mode, the heat treatment is performed at 410° C. for 1 hour.

In the present invention, the planarization layer 211 is formed to relieve projections and depressions on the surface which are generated by the semiconductor layer, the gate electrode layer, and the like and to planarize the surface. Accordingly, the planarization layer 211 is formed to have a thickness with which the surface thereof is planarized. Note that the surface may be planarized by chemical mechanical polishing (CMP).

The insulating layer 210 and the planarization layer 211 may be a silicon nitride film, a silicon nitride oxide film, a silicon oxynitride film, or a silicon oxide film which are formed by a sputtering method or plasma CVD. Alternatively, a single layer or a stacked layer of three or more layers which includes another insulating film containing silicon may be used.

The insulating layer 210 and the planarization layer 211 can be formed of a material selected from aluminum nitride (AlN), aluminum oxynitride (AlON), aluminum nitride oxide (AlNO) containing more nitrogen than oxygen, aluminum oxide, diamond-like carbon (DLC), carbon containing nitrogen (CN), or another inorganic insulating substance. Further, a siloxane resin may be used. Note that a siloxane resin refers to a resin including an Si—O—Si bond. Siloxane has a skeleton formed by a bond of silicon (Si) and oxygen (O), in which an organic group containing at least hydrogen (such as an alkyl group or aromatic hydrocarbon) is used as a substituent. The organic group may include a fluoro group.

Alternatively, an organic insulating material which can withstand heat treatment, which will be used in a subsequent step, may be used. As such an organic material, polyimide, acrylic, polyamide, polyimide amide, resist, benzocyclobutene, or polysilazane can be given. A coated film with a favorable planarity formed by a coating method which is formed by a coating method and has favorable planarity may also be used as the planarization layer 211.

Dip coating, spray coating, a doctor knife, a roll coater, a curtain coater, a knife coater, a CVD method, an evaporation method, or the like can be employed for forming the insulating layer 210 and the planarization layer 211. The insulating layer 210 and the planarization layer 211 may be formed by a droplet discharge method.

Figure 5D:
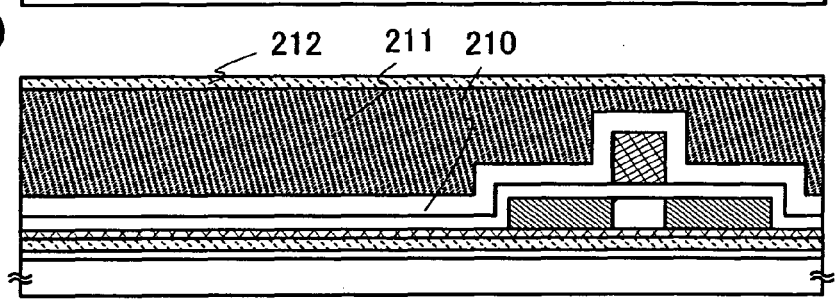

The insulating layer 212 is formed over the planarization layer 211 as an insulating layer which is bonded to a second semiconductor layer (see FIG. 5D). The material and forming step of the insulating layer 212 may be similar to those for the insulating layer 104. For example, in this embodiment mode, a silicon oxide film is formed as the insulating layer 212.

Figure 5E:
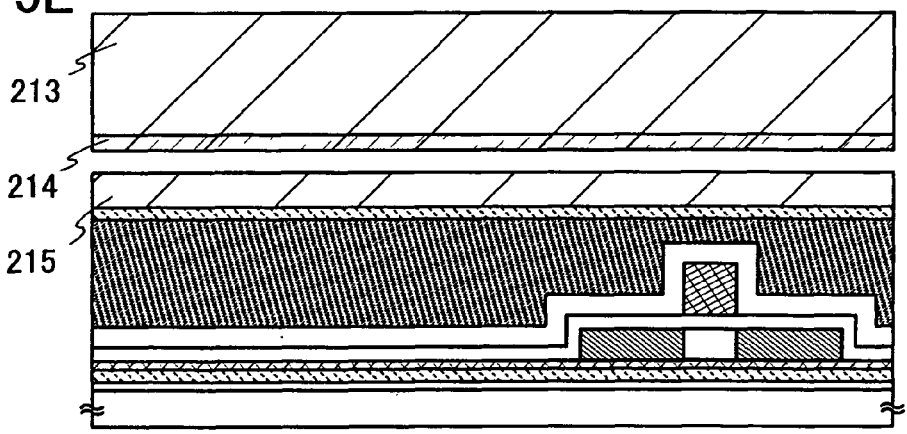

As described above in FIGS. 4A to 4D, the semiconductor layer 215 is bonded to the insulating layer 212 to be formed over the planarization layer 211 in a similar manner in which the semiconductor layer 102 is bonded to the insulating layer 104 and is separated from the semiconductor substrate 108 (see FIG. 5E). By heat treatment, the semiconductor layer 215 is separated from a semiconductor substrate 213, in which an embrittlement layer 214 is formed, and is bonded to the insulating layer 212.

The semiconductor layer 215 may be irradiated with laser light to reduce crystal defects. Further, the surface of the semiconductor layer 215 may be subjected to polishing treatment. Polishing treatment can enhance the planarity of the surface of the semiconductor layer 215.

Note that in this embodiment mode, a single crystal semiconductor substrate with a {100} crystal plane orientation is selected as the semiconductor substrate 108, which is a first semiconductor substrate, while a single crystal semiconductor substrate with a {110} crystal plane orientation is selected as the semiconductor substrate 213, which is a second semiconductor substrate. Note that a combination of the crystal plane orientation of the first semiconductor substrate and the crystal plane orientation of the second semiconductor substrate is not limited to the combination in this embodiment mode. For example, a substrate with a {110} crystal plane orientation may be used as the first semiconductor substrate, and a substrate with a {100} crystal plane orientation may be used as the second semiconductor substrate. In that case, it is preferable that a p-channel field-effect transistor be manufactured using the first semiconductor substrate and an n-channel field-effect transistor be manufactured using the second semiconductor substrate.

Figure 5F:
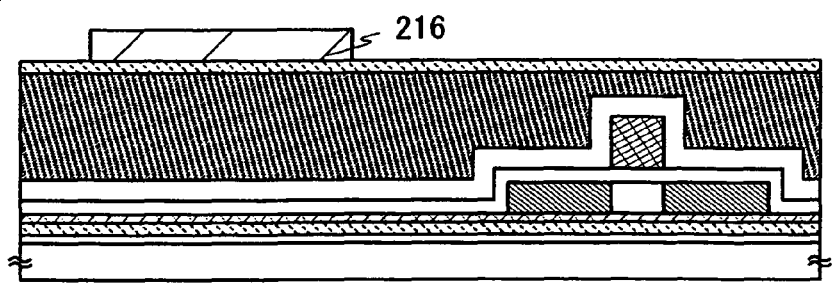

After that, the semiconductor layer 215, which is a thin film, is selectively etched to form the semiconductor layer 216 having an island-like shape over the insulating layer 212 (see FIG. 5F).

Figure 6A:
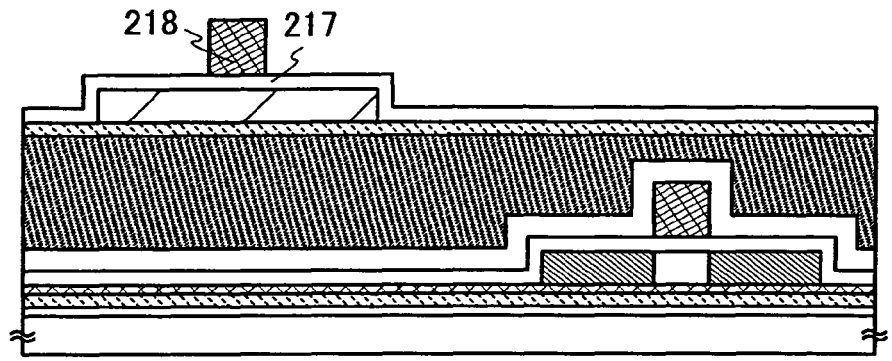
FIGS. 6A to 6C are cross-sectional views showing a manufacturing method of a field-effect transistor in a display device of the present invention.
Figure 6B:
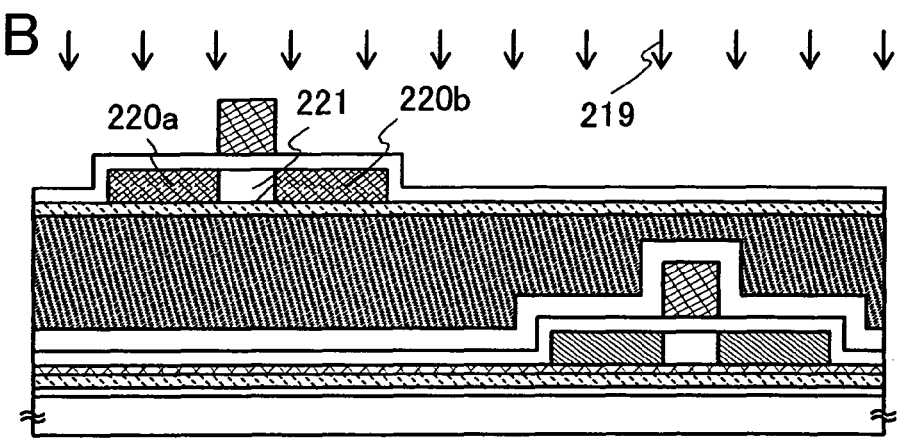
Figure 6C:
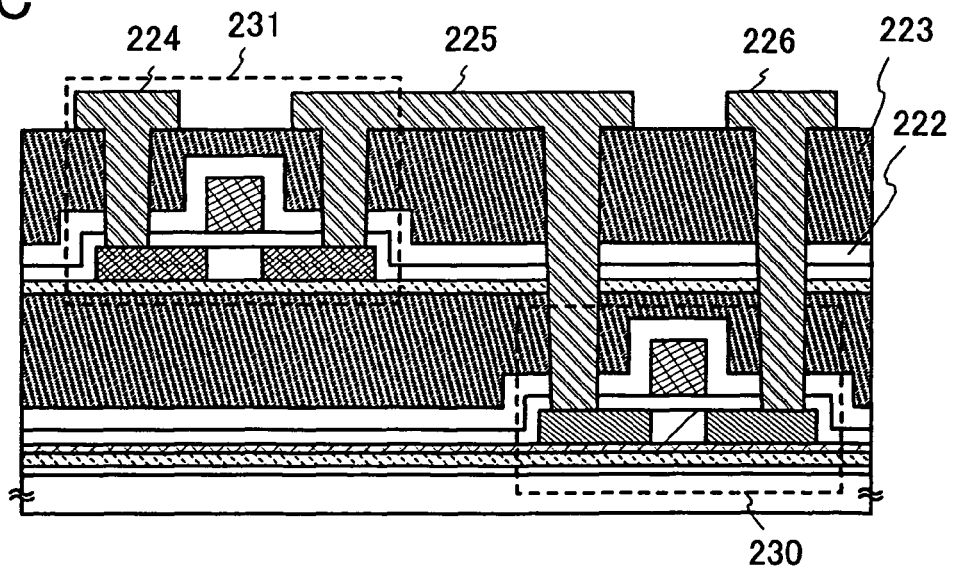

The gate insulating layer 217 and the gate electrode layer 218 are formed over the semiconductor layer 216 (see FIG. 6A).

The impurity regions 220a and 220b, which are p-type impurity regions, are formed by adding an impurity element 219 imparting p-type conductivity using the gate electrode layer 218 as a mask. Here, doping is performed such that the impurity regions 220a and 220b contain the impurity element imparting p-type conductivity at a concentration of approximately $1\times10^{20}$ atoms/cm$^3$ to $5\times10^{21}$ atoms/cm$^3$. In addition, the channel formation region 221 is formed in the semiconductor layer 216 (see FIG. 6B). The impurity regions 220a and 220b are p-type high-concentration impurity regions and serve as a source and a drain.

Subsequently, an interlayer insulating layer which covers the gate electrode layer and the gate insulating layer is formed. In this embodiment mode, the interlayer insulating layer is a stacked layer of the insulating layer 222 which contains hydrogen and serves as a protective film and the planarization layer 223.

Further, heat treatment is performed in a nitrogen atmosphere at 300° C. to 550° C. for 1 hour to 12 hours to hydrogenate the semiconductor layer. Preferably, this heat treatment is performed at 400° C. to 500° C. This step terminates dangling bonds of the semiconductor layer with hydrogen which is contained in the insulating layer 222. Which is the interlayer insulating layer. In this embodiment mode, the heat treatment is performed at 410° C. for 1 hour. This heat treatment step may also serve as heat treatment for the semiconductor layer 119 and the insulating layer 210.

In the present invention, the planarization layer 223 is formed to relieve projections and depressions on the surface which are generated by the semiconductor layer, the gate electrode layer, and the like and to planarize the surface. Accordingly, the planarization layer 223 is formed to have a thickness with which the surface thereof is planarized. Note that the surface may be planarized by chemical mechanical polishing (CMP).

The gate insulating layer 217, the gate electrode layer 218, the insulating layer 222, and the planarization layer 223 correspond to the gate insulating layer 205, the gate electrode layer 206, the insulating layer 210, and the planarization layer 211, respectively, and they can be formed of similar materials and by similar steps.

Then, contact holes (openings) which reach the semiconductor layer 119 are formed in the gate insulating layer 205, the insulating layer 210, the planarization layer 211, the insulating layer 212, the gate insulating layer 217, the insulating layer 222, and the planarization layer 223 using a mask formed of a resist; and contact holes (openings) which reach the semiconductor layer 216 are formed in the gate insulating layer 217, the insulating layer 222, and the planarization layer 223 using a mask formed of a resist. Etching may be performed once or plural times in accordance with a selectivity of a material which is used. The gate insulating layer 205, the insulating layer 210, the planarization layer 211, the insulating layer 212, the gate insulating layer 217, the insulating layer 222, and the planarization layer 223 are selectively removed by etching to form openings which reach the impurity regions 208a and 208b or the impurity regions 220a and 220b, which are source regions and drain regions.

A method and a condition of the etching may be set as appropriate depending on the materials of the gate insulating layer 205, the insulating layer 210, the planarization layer 211, the insulating layer 212, the gate insulating layer 217, the insulating layer 222, and the planarization layer 223 in which the contact holes are formed. Wet etching, dry etching, or both of them can be used as appropriate. In this embodiment mode, dry etching is used. As an etching gas, a chlorine-based gas typified by $Cl_2$, $BCl_3$, $SiC_4$, or $CCl_4$; a fluorine-based gas typified by $CF_4$, $SF_6$, or $NF_3$; or $O_2$ can be used as appropriate. Further, an inert gas may be added to an etching gas to be used. As an inert element to be added, one or a plurality of elements selected from He, Ne, Ar, Kr, or Xe can be used.

As an etchant of wet etching, a hydrofluoric acid-based solution such as a mixed solution of ammonium hydrogen fluoride and ammonium fluoride may be used.

A conductive film is formed to cover the openings, and the conductive film is etched to form the wiring layers 224, 225, and 226. The wiring layers 224, 225, and 226 are electrically connected to parts of source regions or drain regions and serve as source electrode layers or drain electrode layers. The wiring layers can be formed by forming a conductive film by a PVD method, a CVD method, an evaporation method, or the like, and then etching the conductive film into a desired shape. Alternatively, the conductive films can be selectively formed in predetermined positions by a droplet discharge method, a printing method, an electroplating method, or the like. Further, a reflow method or a damascene method may be used. The wiring layers are formed of a metal such as Ag, Au, Cu, Ni, Pt, Pd, Ir, Rh, W, Al, Ta, Mo, Cd, Zn, Fe, Ti, Zr, or Ba; and Si or Ge; or an alloy or nitride thereof. Further, a stacked-layer structure of those layers may be employed.

In this embodiment mode, the conductive films with a single-layer structure or a stacked-layer structure are formed to fill contact holes formed in the gate insulating layer 217, the insulating layer 222, and the planarization layer 223 and contact holes formed in the gate insulating layer 205, the insulating layer 210, the planarization layer 211, the insulating layer 212, the gate insulating layer 217, the insulating layer 222, and the planarization layer 223 on the entire surface of the substrate by a CVD method or a sputtering method with the use of a metal element such as aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or a compound material containing any of the metal elements. After that, the conductive films are selectively etched to form the wiring layers 224, 225, and 226 (see FIG. 6C).

Through the above-described steps, a display device which is formed of a pixel including the field-effect transistor 230, which is an n-channel field-effect transistor and the field-effect transistor 231, which is a p-channel field-effect transistor can be manufactured. Note that the field-effect transistor 230 and the field-effect transistor 231 are electrically connected by the wiring layer 225.

The field-effect transistor 230 is bonded to the insulating layer 104 and is provided over the supporting substrate 101, while the field-effect transistor 231 is bonded to the insulating layer 212 which is formed over the planarization layer 211 covering the field-effect transistor 230 and is provided over the planarization layer 211. The field-effect transistor 230 and the field-effect transistor 231 are stacked.

According to the present invention, high performance semiconductor elements can be stacked; therefore, higher integration of the display device having a pixel which includes field-effect transistors can be achieved.

In addition, in attaching the semiconductor layers to the supporting substrate, the semiconductor layers are formed over different planar insulating layers; therefore, the insulating layers and the semiconductor layers can be easily bonded to each other.

As in this embodiment mode, when semiconductor layers which form field-effect transistors of different conductivity types are formed over different insulating layers, parasitic capacitance between the semiconductor layers of the field-effect transistors of different conductivity types and parasitic capacitance between the gate electrode layers of the field-effect transistors of different conductivity types can be reduced. Accordingly, a display device having a pixel which includes high-performance field-effect transistors can be manufactured.

The field-effect transistor is not limited to the one described in this embodiment mode, and may have a single gate structure, in which one channel formation region is formed, a double gate structure, in which two channel formation regions are formed, or a triple gate structure, in which three channel formation regions are formed.

In addition, while this embodiment mode describes a CMOS structure in which the field-effect transistors which are stacked have different conductivity types, field-effect transistors of the same conductivity type may be stacked.

As described above, in this embodiment mode, a display device having a pixel which includes high-performance field-effect transistors that are more highly integrated can be manufactured.

Embodiment Mode 2

This embodiment mode describes an example in which steps of separating a semiconductor layer from the semiconductor substrate and bonding the semiconductor layer to a supporting substrate are different from steps in Embodiment Mode 1. Therefore, repetitive description of the same portion or a portion having a similar function to the portions in Embodiment Mode 1 is omitted.

According to this embodiment mode, when a semiconductor layer is transferred from a semiconductor substrate, the semiconductor substrate is etched selectively (this step is also referred to as groove processing), and a plurality of semiconductor layers divided such that they have the size of semiconductor elements to be manufactured are transferred to a supporting substrate. Thus, a plurality of island-like semiconductor layers can be formed over the supporting substrate. Since the semiconductor layers which are processed into an element size in advance are transferred, transfer to the supporting substrate can be performed in units of the semiconductor layers; thus, the size and shape of the semiconductor substrate are not restricted. Therefore, transfer of semiconductor layers to a large-sized supporting substrate can be performed more efficiently.

Further, etching is performed on the semiconductor layers formed over the supporting substrate, and the forms of the semiconductor layers are controlled precisely by processing and modifying the semiconductor layers. Accordingly, discrepancy in formation position and defects in shape of the semiconductor layer due to pattern misalignment caused by light exposure going around a resist mask, or the like during resist mask formation; position misalignment caused by a bonding step during transfer; or the like can be modified.

Thus, a plurality of semiconductor layers having a desired shape can be formed over a supporting substrate with a high yield. Accordingly, a display device having a pixel which is obtained by stacking and highly integrating field-effect transistors that are formed by using precise and high-performance semiconductor elements can be manufactured over a large-sized substrate with high throughput and high productivity.

Figure 7A:
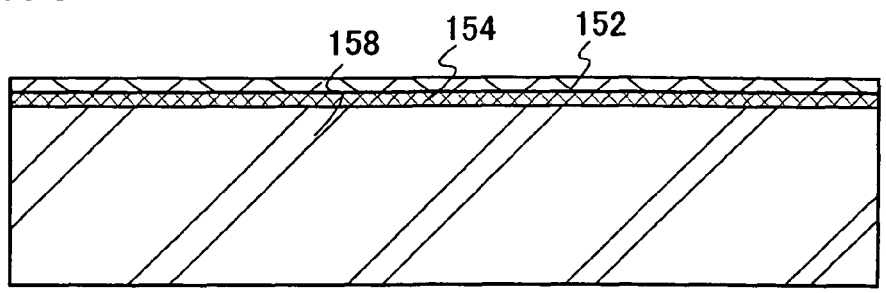
FIGS. 7A to 7E are cross-sectional views showing a manufacturing method of a field-effect transistor in a display device of the present invention.

FIG. 7A shows a state in which a protective layer 154 and a silicon nitride film 152 are formed over a semiconductor substrate 158. The silicon nitride film 152 is used as a hard mask in performing groove processing on the semiconductor substrate 158. The silicon nitride film 152 may be formed by depositing silane and ammonia by a vapor deposition method.

Figure 7B:
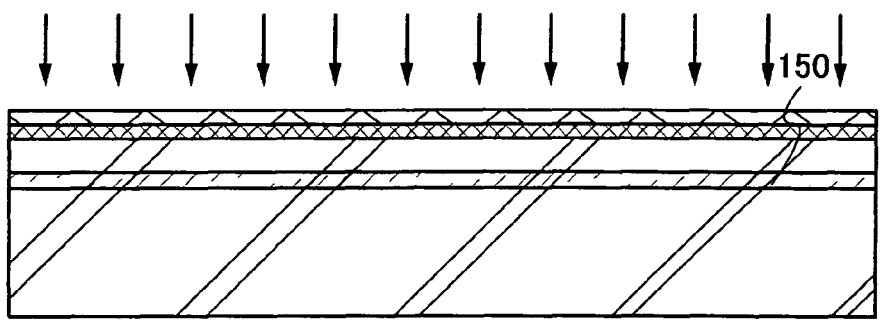

Then, ion introduction is performed to form an embrittlement layer 150 on an entire surface of the semiconductor substrate 158 (see FIG. 7B). Ion introduction is performed in consideration of the thickness of a semiconductor layer which is to be transferred to a supporting substrate. An accelerating voltage for introducing ions into the semiconductor substrate 158 is set in consideration of the thickness, so that ions are introduced into a deep part of the semiconductor substrate 158. With this treatment, the embrittlement layer 150 is formed in a region at a certain depth from the surface of the semiconductor substrate 158.

The groove processing is performed in consideration of the shape of semiconductor layers of semiconductor elements. In other words, in order to transfer a semiconductor layer to the supporting substrate, the groove processing is performed on the semiconductor substrate 158 such that a portion which is transferred as a semiconductor layer remains as a convex portion.

Figure 7C:
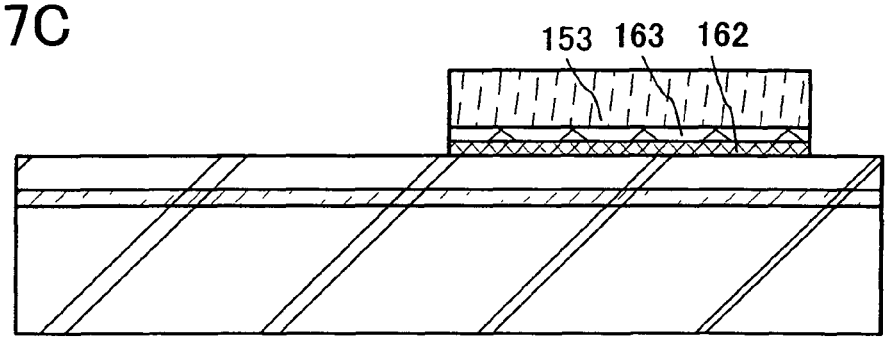

A mask 153 is formed of photoresist. The silicon nitride film 152 and the protective layer 154 are etched using the mask 153 to form a protective layer 162 and a silicon nitride layer 163 (see FIG. 7C).

Figure 7D:
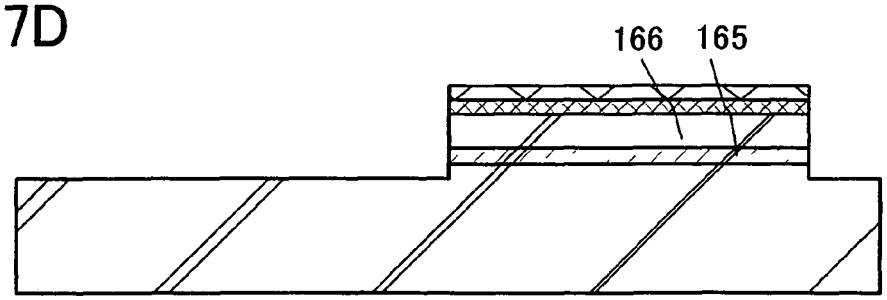

Then, the semiconductor substrate 158 is etched using the silicon nitride layer 163 as a hard mask to form the semiconductor substrate 158 having an embrittlement layer 165 and a semiconductor layer 166 (see FIG. 7D). In the present invention, a semiconductor region which is part of a semiconductor substrate which is processed into a convex shape using the embrittlement layer and by groove processing is referred to as the semiconductor layer 166 as in FIG. 7D.

The depth of etching the semiconductor substrate 158 is set as appropriate in consideration of the thickness of the semiconductor layer which is transferred to the supporting substrate. The thickness of the semiconductor layer can be set by a depth where hydrogen ions reach by introduction. The groove formed in the semiconductor substrate 158 is preferably deeper than the embrittlement layer. In this groove processing, if the groove is processed to be deeper than the embrittlement layer, the embrittlement layer can be left only in a region of the semiconductor layer which is to be separated.

Figure 7E:
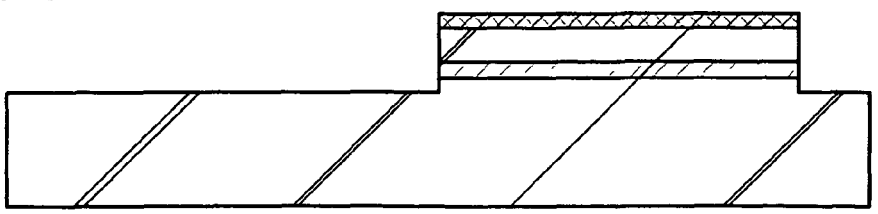
Figure 8A:
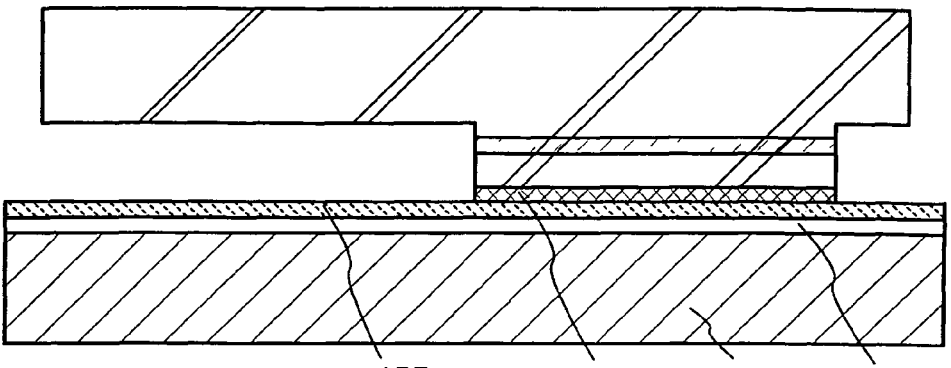
FIGS. 8A to 8D are cross-sectional views showing a manufacturing method of a field-effect transistor in a display device of the present invention.

The silicon nitride layer 163 on the surface is removed (see FIG. 7E). Then, the surface of the protective layer 162 of the semiconductor substrate 158 and a supporting substrate 151 are bonded to each other (see FIG. 8A).

The surface of the supporting substrate 151 is provided with a blocking layer 159 and an insulating layer 157. The blocking layer 159 is provided so as to prevent impurities such as sodium ions from diffusing from the supporting substrate 151 and contaminating the semiconductor layer. Note that in a case where there is no possibility of diffusion of impurities from the supporting substrate 151 which causes adverse effects on the semiconductor layer, the blocking layer 159 can be omitted. The insulating layer 157 is provided to form a bond with the protective layer 162.

The bond can be formed by disposing the protective layer 162 on the semiconductor substrate 158 side and the insulating layer 157 on the supporting substrate side, the surfaces of which are cleaned, in close contact with each other. The bond can be formed at room temperature. This bonding is performed at the atomic level, and a firm bond is formed at room temperature by van der Waals forces. Since groove processing has been performed on the semiconductor substrate 158, a convex portion forming the semiconductor layer is in contact with the supporting substrate 151.

Figure 8B:
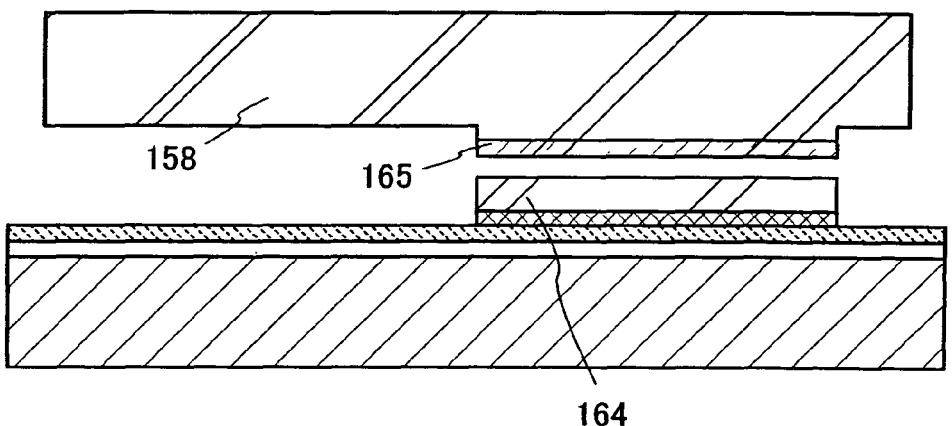

After the bond between the semiconductor substrate 158 and the supporting substrate 151 is formed, heat treatment is performed to separate a semiconductor layer 164 from the semiconductor substrate 158 and to fasten the semiconductor layer 164 to the supporting substrate 151, as shown in FIG. 8B. The volume of microvoids formed in the embrittlement layer 150 is changed and a crack is generated along the embrittlement layer 150, whereby the semiconductor layer is separated. After that, in order to make the bond much firmer, heat treatment is preferably performed. As described above, the semiconductor layer is formed over the insulating surface. FIG. 8B shows a state in which the semiconductor layer 164 is bonded to the supporting substrate 151.

In this embodiment mode, since the semiconductor layers which are processed into an element size in advance are transferred, transfer to the supporting substrate can be performed in units of the semiconductor layers; therefore, the size and shape of the semiconductor substrate are not limited. Accordingly, semiconductor layers having various shapes can be formed over the semiconductor substrate. For example, the sizes and shapes of the semiconductor layers can be freely formed in each mask of a light-exposure apparatus which is used for etching, in each stepper of the light-exposure apparatus for forming a mask pattern, or depending on a panel size of a display device using a large-sized substrate.

The semiconductor layer 164 may be used as it is as a semiconductor layer of a semiconductor element, or may be further etched to process the shape.

Figure 8C:
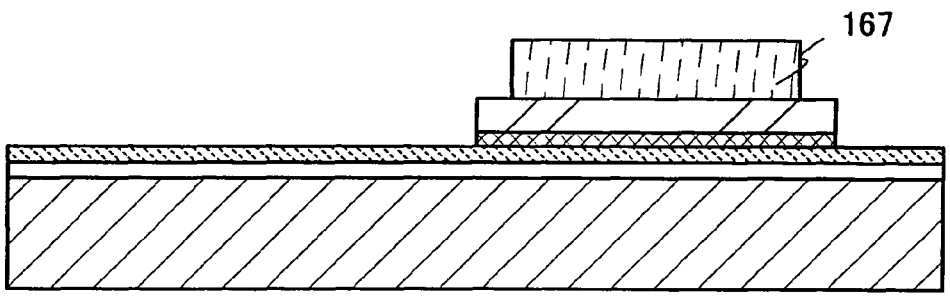
Figure 8D:
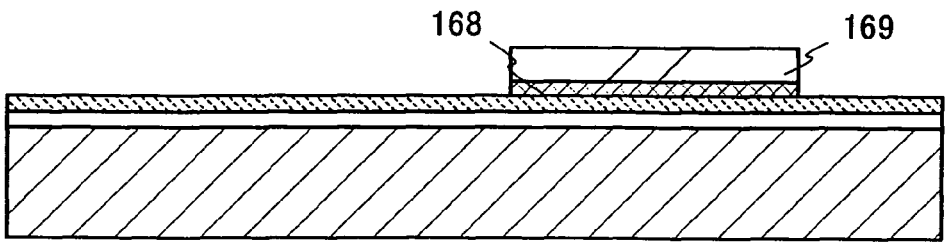

FIGS. 8C and 8D shown an example in which the semiconductor layer 164 which is transferred is further etched to have the shape processed. A mask 167 is formed to expose a periphery of the semiconductor layer 164, which is an unnecessary part.

The semiconductor layer 164 is etched using the mask 167 to form a semiconductor layer 169. In this embodiment mode, the protective layer 162 under the semiconductor layer is etched together with the semiconductor layer to be a protective layer 168 (see FIG. 8D). As described above, when the shape of the semiconductor layer is further processed after the semiconductor layer is transferred to the supporting substrate, misalignment of a region where the semiconductor layer is formed, defects in shape, or the like which occur in the manufacturing process can be modified.

FIGS. 7A to 7E and FIGS. 8A to 8D show an example in which a semiconductor layer is transferred to an insulating layer over the supporting substrate. Needless to say, this embodiment mode can be employed for forming a semiconductor layer over an insulating layer which is over a planarization layer, as a semiconductor layer of a semiconductor element which is stacked in the upper layer.

This embodiment mode can be implemented in combination with Embodiment Mode 1 as appropriate.

Embodiment Mode 3

This embodiment mode describes an example in which steps of separating a semiconductor layer from the semiconductor substrate and bonding the semiconductor layer to a supporting substrate are different from steps in Embodiment Mode 1. Therefore, repetitive description of the same portion or a portion having a similar function to the portions in Embodiment Mode 1 is omitted.

This embodiment mode describes an example in which after a semiconductor layer is separated from a semiconductor substrate, the semiconductor layer is bonded to a supporting substrate.

Figure 9A:
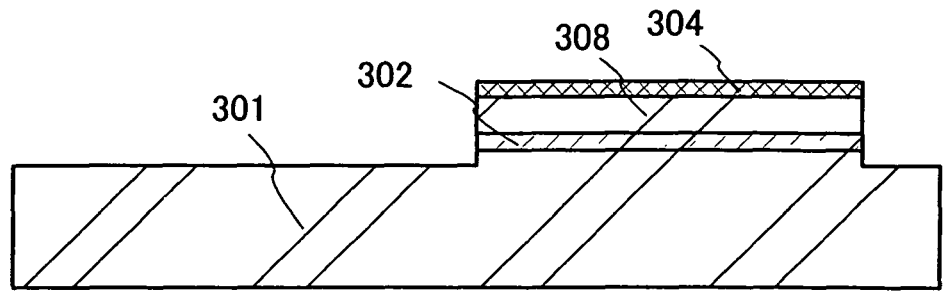
FIGS. 9A to 9D are cross-sectional views showing a manufacturing method of a field-effect transistor in a display device of the present invention.

As described in Embodiment Mode 2 with reference to FIGS. 7A to 7E, the embrittlement layer is formed in the semiconductor substrate and a groove is formed. Groove processing is performed in consideration of the shape of a semiconductor layer of a semiconductor element. In other words, in order to transfer the semiconductor layer of the semiconductor element to the supporting substrate, the groove processing is performed on a semiconductor substrate 301 such that a portion which is transferred as the semiconductor layer remains as a convex portion. In FIG. 9A, the semiconductor substrate 301, an embrittlement layer 302, a semiconductor layer 308 which is part of the semiconductor substrate 301, and an insulating film 304 are formed. In this embodiment mode, silicon oxide is used for the insulating film 304.

Then, heat treatment is performed and neighboring minute voids in the embrittlement layer 302 are coupled and the volume of the minute voids is increased. As a result, the semiconductor substrate 301 is cleaved along the embrittlement layer 302; thus, the semiconductor layer 308 is separated with the insulating film 304 from the semiconductor substrate 301. The heat treatment may be performed within a temperature range of 400° C. to 600° C.

Note that heat treatment may be performed using dielectric heating with a high frequency wave such as a microwave. The heat treatment using dielectric heating can be performed by irradiating the semiconductor substrate 301 with a high-frequency wave with a frequency of 300 MHz to 3 THz which is produced with a high-frequency generator. Specifically, for example, irradiation is performed with a microwave of 2.45 GHz at 900 W for 14 minutes to couple the neighboring minute voids in the embrittlement layer; thus, the semiconductor substrate 301 is finally cleaved.

Figure 9B:
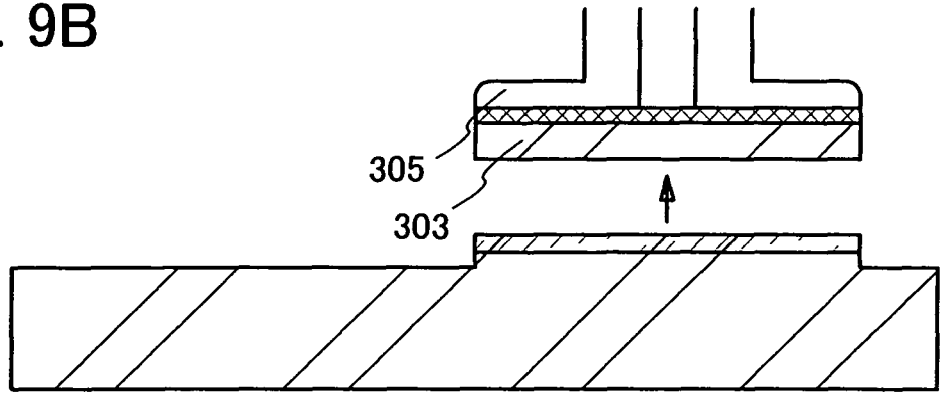

Then, as shown in FIG. 9B, a collet 305 is fixed to the insulating film 304 formed over the semiconductor layer 308, and the semiconductor layer 308 is pulled apart from the semiconductor substrate 301. Even if cleavage of the semiconductor substrate 301 by the above-described heat treatment is incomplete, the semiconductor layer 308 is completely separated from the semiconductor substrate 301 and a semiconductor layer 303 can be obtained by applying force to the collet 305. The collet 305 can be a means that can be selectively fixed to one of the semiconductor layers 308, such as a chuck like a vacuum chuck or a mechanical chuck, a microneedle with an adhesive attached to a tip, or the like. FIG. 9B shows a case where a vacuum chuck is used as the collet 305.

As the adhesive which is attached to the microneedle, an epoxy-based adhesive, a ceramic-based adhesive, a silicone-based adhesive, a low temperature coagulant, or the like can be used. As the low temperature coagulant, for example, MW-1 (manufactured by Eminent Supply Corporation) can be used. MW-1 has a freezing point of 17° C. and has an adhesive effect at a temperature of less than or equal to 17° C. (preferably at a temperature of less than or equal to 10° C.) and does not have an adhesive effect at a temperature of greater than or equal to 17° C. (preferably approximately 25° C.).

Note that hydrogenation may be performed on the semiconductor substrate 301 before the cleavage of the semiconductor substrate 301. Hydrogenation is performed, for example, at 350° C. in a hydrogen atmosphere for approximately 2 hours.

Figure 9C:
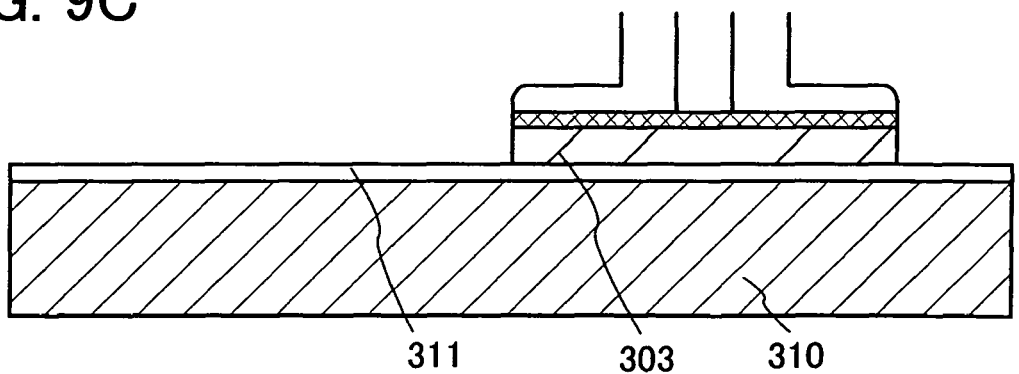

Next, as shown in FIG. 9C, the semiconductor layer 303 and a supporting substrate 310 are attached to each other so that a surface exposed by separating the semiconductor layer 303 faces the supporting substrate 310 side. In this embodiment mode, because an insulating film 311 is formed over the supporting substrate 310, the semiconductor layer 303 and the supporting substrate 310 can be attached to each other by bonding the insulating film 311 and the semiconductor layer 303. After the semiconductor layer 303 and the insulating film 311 are bonded to each other, heat treatment at 400° C. to 600° C. is preferably performed in order to make the bond much firmer.

The bond is formed by van der Waals forces; therefore, a firm bond can be formed even at room temperature. Note that since the above-described bonding can be performed at a low temperature, various substrates can be used as the supporting substrate 310. For example, as the supporting substrate 310, a substrate such as a quartz substrate or a sapphire substrate can be used as well as a glass substrate made of aluminosilicate glass, barium borosilicate glass, aluminoborosilicate glass, or the like. Further, as the supporting substrate 310, a semiconductor substrate formed of silicon, gallium arsenide, indium phosphide, or the like can be used. Alternatively, a metal substrate such as a stainless steel substrate may be used as the supporting substrate 310.

Note that the supporting substrate 310 does not necessarily have the insulating film 311 on its surface. In the case where the insulating film 311 is not formed, the supporting substrate 310 and the semiconductor layer 303 can be bonded to each other. Note that by formation of the insulating film 311 on the surface of the supporting substrate 310, impurities such as an alkali metal or an alkaline-earth metal can be prevented from entering the semiconductor layer 303 from the supporting substrate 310.

If the insulating film 311 is formed, not the supporting substrate 310 but the insulating film 311 is bonded to the semiconductor layer 303; therefore, kinds of substrates which can be used as the supporting substrate 310 are further increased. A substrate formed from a flexible synthetic resin such as plastic generally tends to have a low upper temperature limit, but can be used as the supporting substrate 310 in the case where the insulating film 311 is formed, as long as the substrate can withstand processing temperatures of the manufacturing process.

Note that before or after the semiconductor layer 303 is attached to the supporting substrate 310, thermal annealing using irradiation with laser light may be performed on a surface exposed by separation of the semiconductor layer 303. If thermal annealing is performed before the semiconductor layer 303 is attached to the supporting substrate 310, the surface exposed by separation is planarized and bonding strength can be further increased. If thermal annealing is performed after the semiconductor layer 303 is attached to the supporting substrate 310, part of the semiconductor layer 303 is melted and bonding strength can be further increased.

Note that the semiconductor layer 303 may be attached to the supporting substrate 310 not only by the bond but also by application of high frequency oscillation of approximately 10 MHz to 1 THz to the semiconductor layer 303, which generates frictional heat between the semiconductor layer 303 and the supporting substrate 310 to melt part of the semiconductor layer 303 with the heat, whereby the semiconductor layer 303 is attached to the supporting substrate 310.

Note that when MW-1 is used as a low temperature coagulant, first, the low temperature coagulant which is attached to the tip of a microneedle is made in contact with the insulating film 304 at a temperature (e.g., approximately 25° C.) at which the low temperature coagulant does not have an adhesive effect. Next, a temperature is lowered to a temperature (e.g., approximately 5° C.) at which the low temperature coagulant has an adhesive effect and the low temperature coagulant is solidified, whereby the microneedle and the insulating film 304 are fixed. After the semiconductor layer 303 pulled apart from the semiconductor substrate 301 is attached to the supporting substrate 310, the temperature of the low temperature coagulant is raised to a temperature (e.g., approximately 25° C.) at which the low temperature coagulant does not have an adhesive effect again, whereby the microneedle can be pulled apart from the semiconductor layer 303.

Figure 9D:
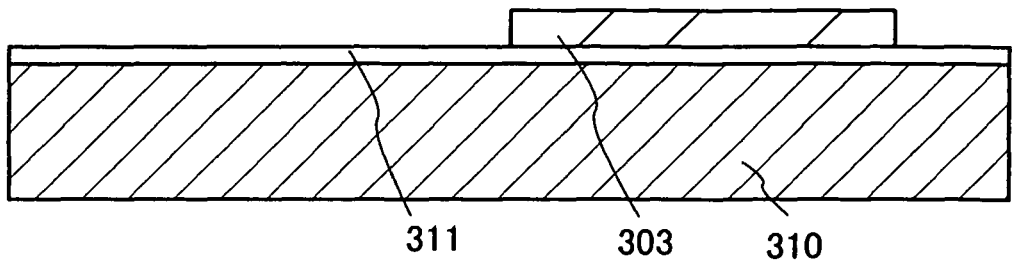

The insulating film 304 over the semiconductor layer 303 is removed, and the semiconductor layer 303 having an island-like shape is formed over the supporting substrate 310 and the insulating film 311 (see FIG. 9D). The semiconductor layer 303 may be further etched to have the shape processed.

When the surface of the semiconductor layer which is exposed by the cleavage faces the supporting substrate side as shown in FIGS. 9A to 9D, a surface with higher planarity is in contact with a gate insulating film; therefore, the interface state density between the semiconductor layer and the gate insulating film can be low and uniform. Accordingly, polishing for planarizing the surface of the semiconductor layer which comes into contact with the gate insulating film can be omitted, or a polishing time can be shortened, whereby cost can be suppressed and throughput can be improved.

Note that the semiconductor layer can also be attached to the supporting substrate so that the surface of the semiconductor layer exposed by the cleavage comes into contact with the gate insulating film formed over the semiconductor layer. This example is described with reference to FIGS. 10A to 10D and FIGS. 11A to 11C.

Figure 10A:
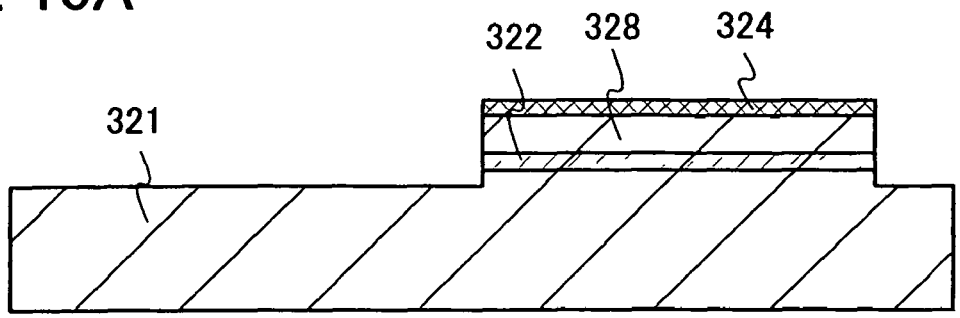
FIGS. 10A to 10D are cross-sectional views showing a manufacturing method of a field-effect transistor in a display device of the present invention.

In FIG. 10A, a semiconductor substrate 321, an embrittlement layer 322, a semiconductor layer 328 which is part of the semiconductor substrate, and an insulating film 324 are formed as in FIG. 9A. In this embodiment mode, silicon oxide is used for the insulating film 324.

Figure 10B:
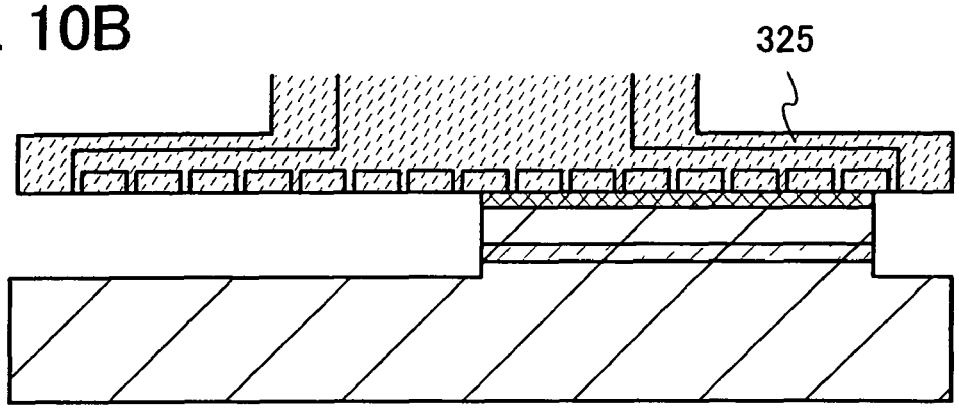

Next, as shown in FIG. 10B, the semiconductor substrate 321 is fixed to a holding means 325. The semiconductor substrate 321 is fixed so that the semiconductor layer 328 faces the holding means 325 side. The holding means 325 can be a large-sized vacuum chuck or mechanical chuck which can withstand heat treatment in a later step and be fixed so as to be overlapped with a plurality of semiconductor layers (in FIGS. 10A to 10D, the semiconductor layer 328). In specific, the holding means 325 can be a porous vacuum chuck, a non-contact vacuum chuck, or the like. This embodiment mode describes an example in which a vacuum chuck is used as the holding means 325.

Figure 10C:
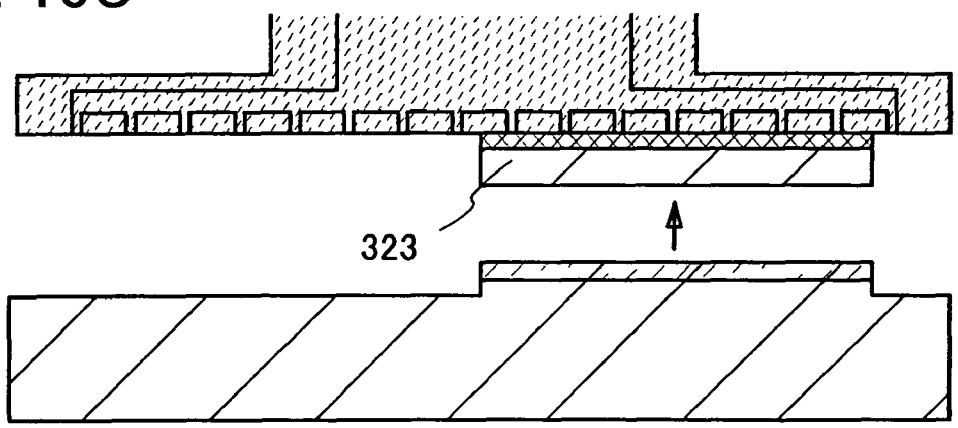

Then, heat treatment is performed and neighboring minute voids in the embrittlement layer 322 are coupled and the volume of the minute voids is increased. As a result, the semiconductor substrate 321 is cleaved along the embrittlement layer 322 as shown in FIG. 10C; thus, the semiconductor layer 328, which has been part of the semiconductor substrate 321, becomes a semiconductor layer 323 and is separated with the insulating film 324 from the semiconductor substrate 321. The heat treatment may be performed within a temperature range of 400° C. to 600° C.

Note that the heat treatment may be performed by dielectric heating with high frequency waves such as microwaves.

Note that before the semiconductor substrate 321 is cleaved, hydrogenation treatment may be performed on the semiconductor substrate 321.

Figure 10D:
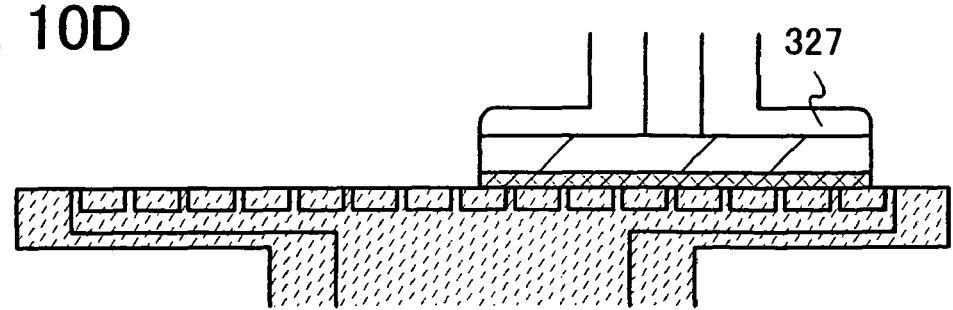
Figure 11A:
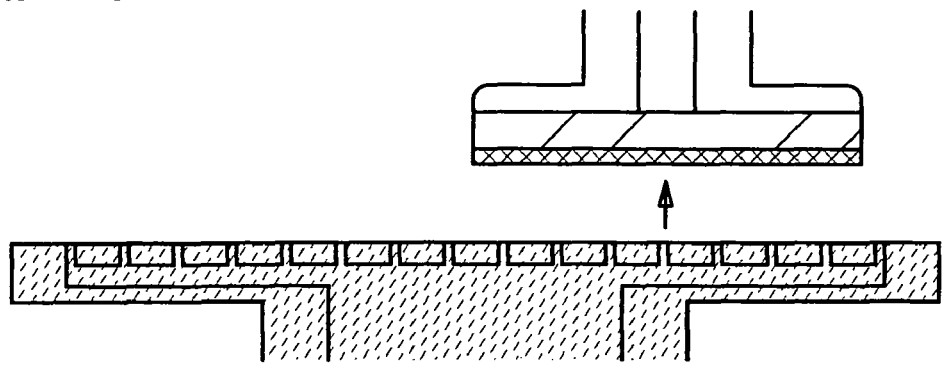
FIGS. 11A to 11C are cross-sectional views showing a manufacturing method of a field-effect transistor in a display device of the present invention.

Then, as shown in FIG. 10D and FIG. 11A, a collet 327 is fixed to the surface of the semiconductor layer 323 which is exposed by the cleavage, and the semiconductor layer 323 is pulled apart from the holding means 325. The collet 327 can be a means that can be selectively fixed to the semiconductor layer 323, such as a chuck like a vacuum chuck or a mechanical chuck, a microneedle with an adhesive attached to a tip, or the like. FIG. 10D and FIG. 11A illustrate a case where a vacuum chuck is used as the collet 327.

Although this embodiment mode describes an example in which the collet 327 is fixed to the surface of the semiconductor layer 323 which is exposed by the cleavage, a protective film such as an insulating film may be formed in order to prevent the semiconductor layer 323 from being damaged by the collet 327. Note that the protective film is removed after the semiconductor layer 323 is attached to a supporting substrate 330 in a later step.

As the adhesive which is attached to the microneedle, an epoxy-based adhesive, a ceramic-based adhesive, a silicone-based adhesive, a low temperature coagulant, or the like can be used.

Figure 11B:
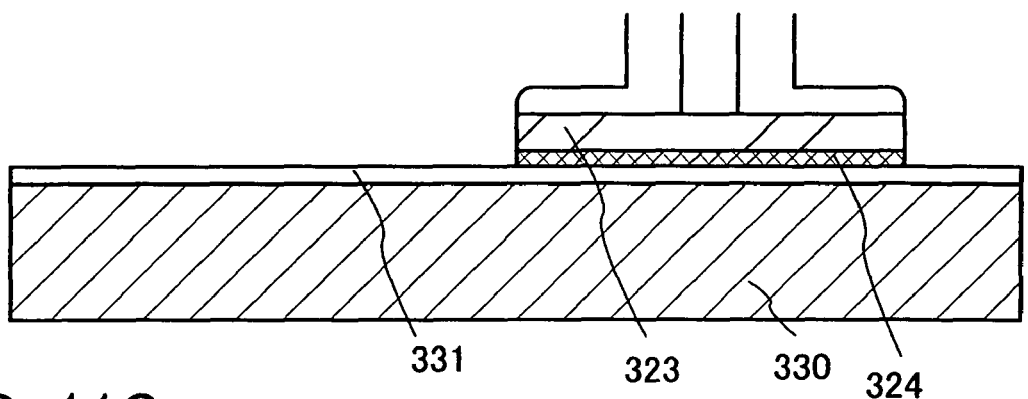
Figure 11C:
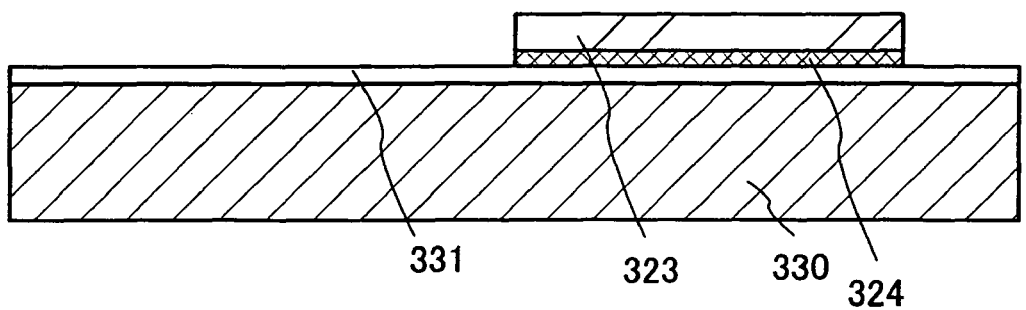

Next, as shown in FIG. 11B, the semiconductor layer 323 and the supporting substrate 330 are attached to each other so that the insulating film 324 faces the supporting substrate 330 side, in other words, a surface opposite to the surface exposed by the cleavage faces the supporting substrate 330 side. In this embodiment mode, because an insulating film 331 is formed over the supporting substrate 330, the semiconductor layer 323 and the supporting substrate 330 can be attached to each other by bonding the insulating film 324 and the insulating film 331 (see FIG. 11C). After the insulating film 331 and the insulating film 324 are bonded to each other, heat treatment at 400° C. to 600° C. is preferably performed in order to further make the bond firm.

The bond is formed by van der Waals forces, so that a firm bond can be formed even at room temperature. Note that since the above-described bonding can be performed at a low temperature, various substrates can be used as the supporting substrate 330.

Note that the supporting substrate 330 does not necessarily have the insulating film 331 on its surface.

Note that there are a case where the semiconductor substrate is warped or deformed and a case where an end portion of the semiconductor substrate is slightly rounded. Further, when the semiconductor substrate is irradiated with hydrogen or a rare gas, or hydrogen ions or rare gas ions to separate a semiconductor layer from the semiconductor substrate, there is a case where introduction with the above-mentioned gas or ions is not sufficiently performed on the end portion of the semiconductor substrate. Therefore, it is difficult to separate a portion of the semiconductor layer which is at an end portion of the semiconductor substrate, and in the case where the semiconductor substrate is attached to a supporting substrate, and then is separated to form the semiconductor layer by cleavage of the semiconductor substrate, the distance between the semiconductor layers may be several millimeter to several centimeters. However, in this embodiment mode, the semiconductor substrate is cleaved to form the semiconductor layer before the semiconductor substrate is attached to the supporting substrate. Thus, when the semiconductor layers are attached to the supporting substrate, the distance between the semiconductor layers can be suppressed as small as approximately several tens of micrometers, and it is easy to form a display device having a pixel which includes field-effect transistors provided without the influence of the space between adjacent semiconductor layers.

In a method for manufacturing a field-effect transistor which forms a pixel of a display device which is described in this embodiment mode, since a plurality of semiconductor layers can be attached to one supporting substrate using a plurality of semiconductor substrates, processing can be performed with high throughput. In addition, a crystal plane orientation of the semiconductor layer can be selected as appropriate in accordance with the polarity of a semiconductor element; therefore, the mobility of the semiconductor element can be increased and a display device having a pixel which includes field-effect transistors which can operate at higher speed can be provided.

In addition, a plurality of semiconductor layers can be formed by cleavage at plural portions of a semiconductor substrate and the plurality of semiconductor layers can be attached to a supporting substrate. Therefore, positions to which the plurality of semiconductor layers are attached can be selected in accordance with polarity and layout of semiconductor elements of a pixel which forms a display device.

This embodiment mode can be implemented in combination with Embodiment Mode 1 as appropriate.

Embodiment Mode 4

This embodiment mode will describe a structure of an apparatus for manufacturing field-effect transistors which form a pixel of a display device which can be applied to the present invention (in particular, to Embodiment Mode 3).

Figure 12A:
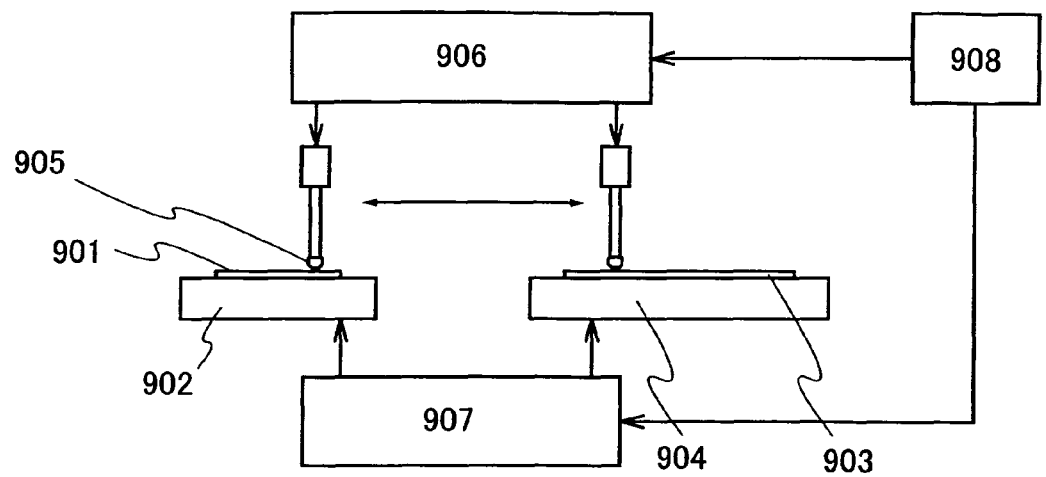
FIGS. 12A and 12B are each a view showing a manufacturing method of a field-effect transistor in a display device of the present invention.

FIG. 12A shows an example of a structure of a manufacturing apparatus which can be applied to the present invention (in particular, to Embodiment Mode 3). The manufacturing apparatus shown in FIG. 12A includes a stage 902 over which a semiconductor substrate 901 is placed and a stage 904 over which a supporting substrate 903 is placed. Note that while FIG. 12A shows an example in which the semiconductor substrate 901 and the supporting substrate 903 are placed over different stages, the present invention is not limited to this structure. The semiconductor substrate 901 and the supporting substrate 903 can also be placed over one stage.

Further, while FIG. 12A shows one stage 902 over which one semiconductor substrate 901 is placed, the present invention is not limited to this structure. For example, a manufacturing apparatus which can be applied to the present invention may have a plurality of stages 902 over which one semiconductor substrate 901 is placed. Alternatively, a plurality of semiconductor substrates 901 may be placed over the stage 902.

The manufacturing apparatus shown in FIG. 12A has a collet 905 which is fixed to a semiconductor layer formed by cleavage of the semiconductor substrate 901 and attaches the semiconductor layer to a predetermined position of the supporting substrate 903. The collet 905 can be a means that can be selectively fixed to one of the semiconductor layers, such as a chuck like a vacuum chuck or a mechanical chuck, a microneedle with an adhesive attached to a tip, or the like.

In addition, the manufacturing apparatus shown in FIG. 12A has at least a collet driving portion 906 which controls the position of the collet 905, a stage driving portion 907 which controls positions of the stage 902 and the stage 904, and a CPU 908 which controls operations of the collet driving portion 906 and the stage driving portion 907 in accordance with positional information of the collet or positional information of the stage.

The positional information of the collet or the positional information of the stage can be obtained based on positional information where a semiconductor layer is in the semiconductor substrate 901 and where the semiconductor layer is to be attached to the supporting substrate 903. Note that the manufacturing apparatus shown in FIG. 12A may be provided with a camera having an imaging device such as a charge coupled device (CCD) in order to position the semiconductor substrate 901 or the supporting substrate 903.

When a heat sink for absorbing and dissipating heat of the semiconductor substrate 901 is provided over the stage 902 and a microneedle whose tip is provided with a low temperature coagulant is provided as the collet 905, the temperature of the semiconductor substrate 901 can be lowered efficiently by the heat sink.

Figure 12B:
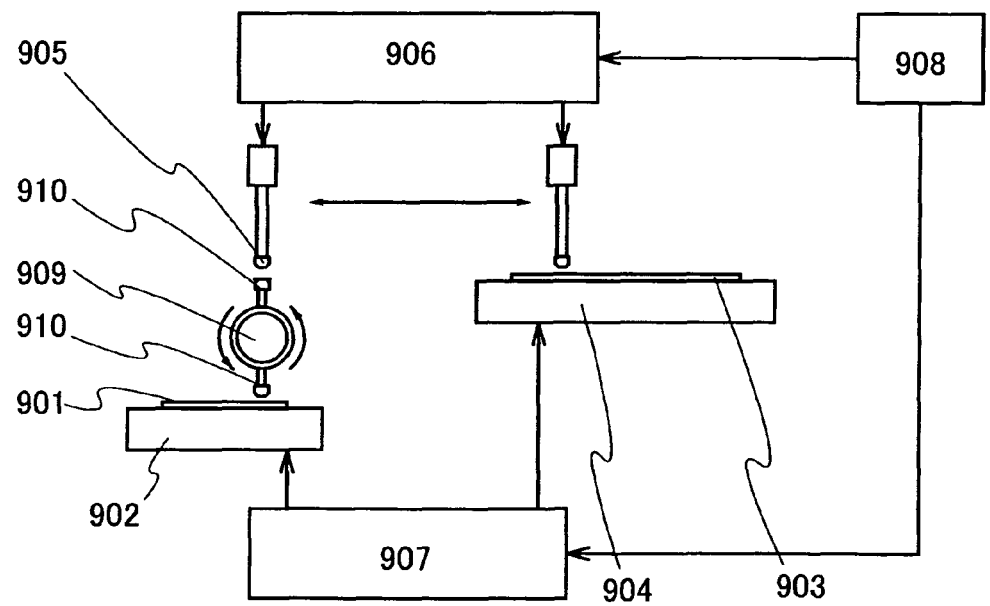

Further, a manufacturing apparatus which can be applied to the present invention may have a reversing device for picking up a semiconductor layer from the semiconductor substrate 901 and then turning over the semiconductor layer. FIG. 12B shows a mode in which a reversing device 909 is added to the manufacturing apparatus in FIG. 12A. The reversing device 909 has a reversing collet 910 and can pick up a semiconductor layer and hold it temporarily with the reversing collet 910. The collet 905 can receive the semiconductor layer from the reversing collet 910 by being fixed to a surface of the semiconductor layer which is opposite from the surface fixed to the reversing collet 910.

Figure 13:
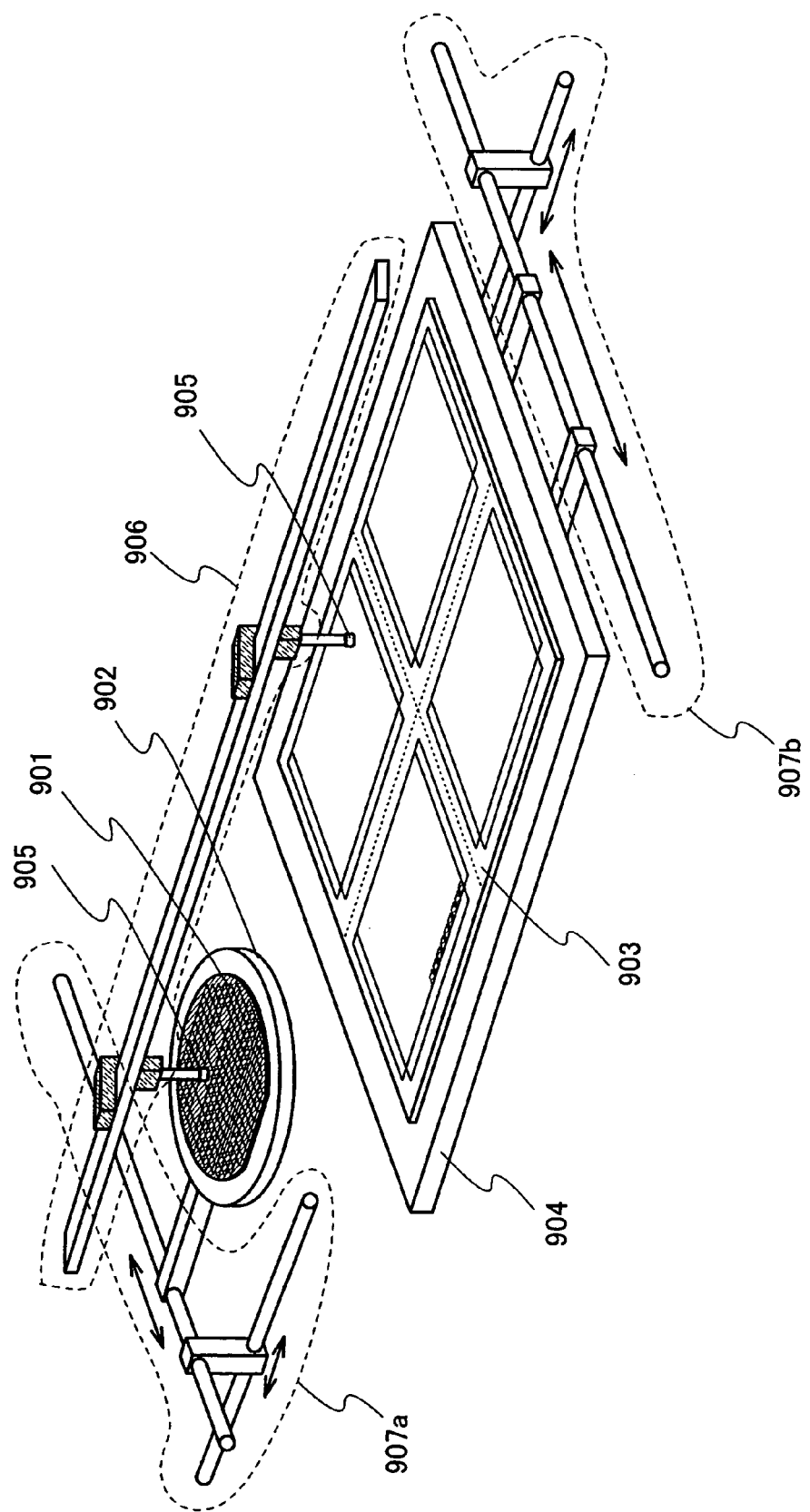
FIG. 13 is a view showing a manufacturing method of a field-effect transistor in a display device of the present invention.

Next, in order to show a positional relationship and specific structures of the semiconductor substrate 901, the stage 902, the supporting substrate 903, the stage 904, the collet 905, the collet driving portion 906, and the stage driving portion 907 in FIG. 12A, a perspective view of them is shown in FIG. 13. Note that FIG. 13 shows an example which employs a stage driving portion 907a which controls the operation of the stage 902 and a stage driving portion 907b which controls the operation of the stage 904.

In accordance with instructions from the CPU 908, the stage driving portion 907a moves the stage 902 in an X direction or a Y direction intersecting the X direction. Note that the stage driving portion 907a may move the stage 902 in a Z direction as well as the X direction or the Y direction. The Z direction exists on a plane different from the plane formed by the X direction and the Y direction. In a similar manner, the stage driving portion 907b moves the stage 904 in the X direction or the Y direction intersecting the X direction. The stage driving portion 907b may move the stage 904 in the Z direction as well as the X direction or the Y direction. The Z direction exists on a plane different from the plane formed by the X direction and the Y direction.

The collet 905 picks up one of a plurality of semiconductor layers formed by cleavage of the semiconductor substrate 901. Then, the collet driving portion 906 transfers the collet 905 from the semiconductor substrate 901 to the supporting substrate 903, while the collet 905 holds the semiconductor layer. Note that although FIG. 13 shows an example in which one collet 905 comes and goes between the semiconductor substrate 901 and the supporting substrate 903, a plurality of collets 905 may be employed. When the plurality of collets 905 are employed, a plurality of collet driving portions 906 for independently controlling the operation of each collet 905 may be prepared, or all the collets 905 may be controlled with one collet driving portion 906.

Figure 14:
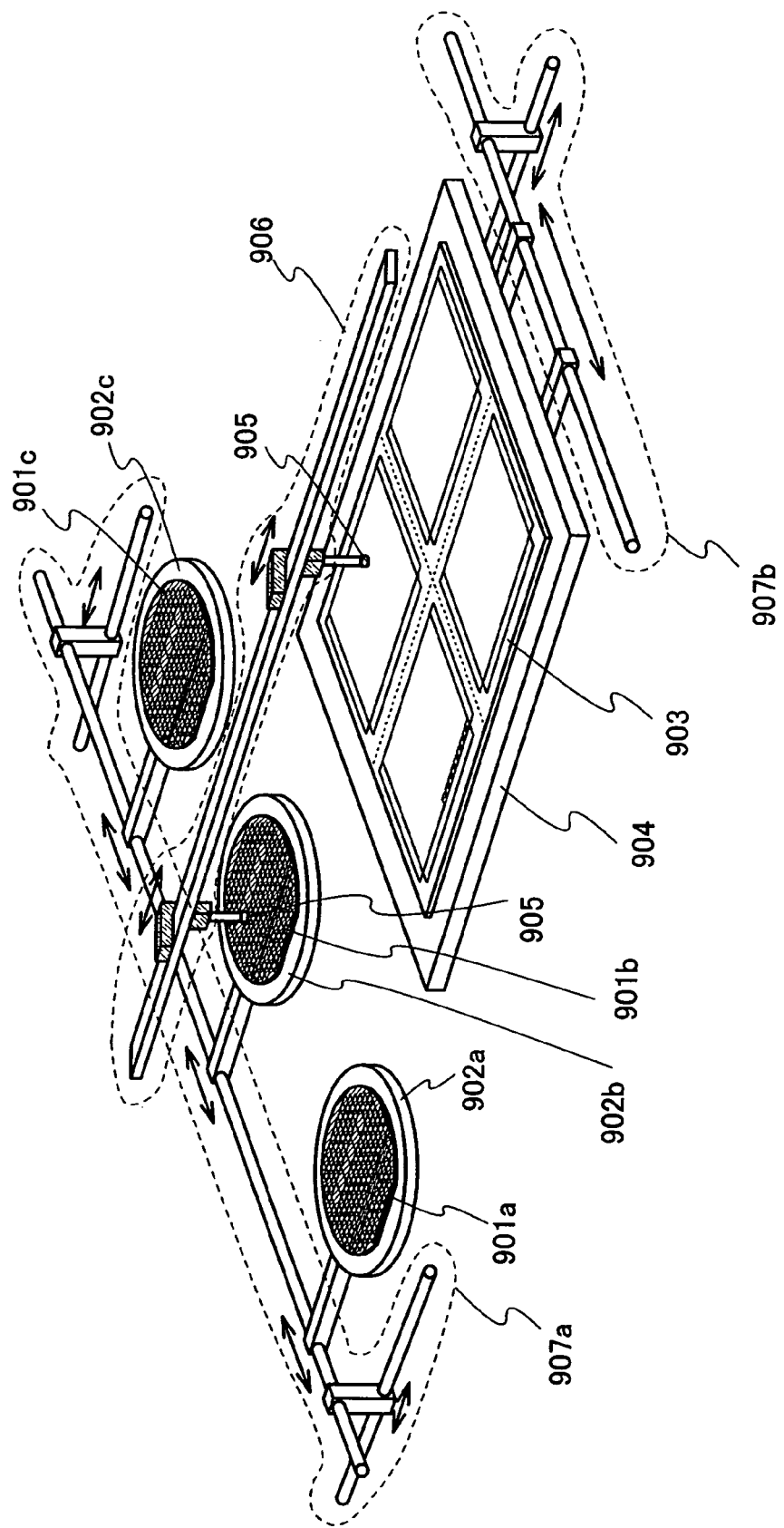
FIG. 14 is a view showing a manufacturing method of a field-effect transistor in a display device of the present invention.

Next, FIG. 14 shows a mode in which the plurality of stages 902 are employed in FIG. 13. FIG. 14 shows an example in which a stage 902a, a stage 902b, and a stage 902c are used, and all of the stage 902a, the stage 902b, and the stage 902c are controlled by the stage driving portion 907a. Note that a plurality of stage driving portions 907a may be prepared in order to independently control the operation of the stage 902a, the stage 902b, and the stage 902c.

FIG. 14 shows a state in which a semiconductor substrate 901a, a semiconductor substrate 901b, and a semiconductor substrate 901c are placed over the stage 902a, the stage 902b, and the stage 902c, respectively. The crystal plane orientations of the semiconductor substrate 901a, the semiconductor substrate 901b, and the semiconductor substrate 901c may be the same or different.

In FIG. 14, the collet 905 picks up one of a plurality of semiconductor layers formed by cleavage of the semiconductor substrate 901a, the semiconductor substrate 901b, and the semiconductor substrate 901c. The collet driving portion 906 transfers the collet 905 from the semiconductor substrate 901a, the semiconductor substrate 901b, or the semiconductor substrate 901c to the supporting substrate 903 while the collet 905 holds the semiconductor layer. Note that FIG. 14 shows an example in which one collet 905 comes and goes between the semiconductor substrate 901a, the semiconductor substrate 901b, and the semiconductor substrate 901c, and the supporting substrate 903; however, the plurality of collets 905 may be used so that at least one collet 905 is used for each of the semiconductor substrate 901a, the semiconductor substrate 901b, and the semiconductor substrate 901c.

The manufacturing apparatus which can be applied to the present invention can transfer and attach a plurality of semiconductor layers formed by one semiconductor substrate 901 to desired positions over the supporting substrate 903, as appropriate.

This embodiment mode can be implemented in combination with Embodiment Mode 3 as appropriate.

Embodiment Mode 5

This embodiment mode will describe a structure in which a semiconductor layer suitable for an n-channel field-effect transistor and a semiconductor layer suitable for a p-channel field-effect transistor are taken out from a semiconductor substrate.

As described in Embodiment Modes 1 to 4, since a semiconductor layer which is separated and transferred from a semiconductor substrate is used for field-effect transistors which form a pixel of a display device of the present invention, a crystal plane orientation of the semiconductor layer can be selected by selecting an appropriate semiconductor substrate. Therefore, a semiconductor layer having a crystal plane orientation which is most suitable for the conductivity type of a field-effect transistor can be selected for each of an n-channel field-effect transistor and a p-channel field-effect transistor.

In the case of bonding semiconductor layers having different crystal plane orientation to a supporting substrate, crystal axes of channel length directions of the semiconductor layers are set in certain orientations as a more preferable mode. Carrier mobility of electrons and holes flowing through a semiconductor layer of a field-effect transistor can be increased by matching anisotropy in crystal plane orientation of the semiconductor layer and anisotropy in a channel length direction in which carriers flow. This is because effective mass of carriers has anisotropy in crystals.

For example, in the case of taking a semiconductor layer for an n-channel field-effect transistor from a semiconductor substrate with a {100} crystal plane orientation, it is preferable that a channel length direction be along a <100> axis. When there are a plurality of <100> crystal axes in a semiconductor layer surface, any of the crystal axes can be employed as the channel length direction.

On the other hand, in order to form a semiconductor layer for a p-channel field-effect transistor, it is preferable that a semiconductor substrate with a {110} crystal plane orientation be used and a channel length direction be parallel to a <110> axis. In such a manner, when a <100> axis is employed for an n-channel field-effect transistor and a <110> axis is employed for a p-channel field-effect transistor, mobility of electrons and holes flowing through a channel formation region can be further increased.

This embodiment mode can be implemented in combination with any of Embodiment Modes 1 to 4 as appropriate.

Embodiment Mode 6

This embodiment mode will describe a structure in which a semiconductor layer suitable for an n-channel field-effect transistor and a semiconductor layer suitable for a p-channel field-effect transistor are taken out from a semiconductor substrate with a single crystal plane.

A case of using a semiconductor substrate with a {110} crystal plane orientation is described. In this case, the semiconductor layer of an n-channel field-effect transistor is formed to have a <100> axis as a channel length direction. On the other hand, the semiconductor layer of a p-channel field-effect transistor is formed to have a <110> axis as a channel length direction.

According to this embodiment mode, a first semiconductor layer in an n-channel field-effect transistor and a second semiconductor layer in a p-channel field-effect transistor can be taken out from a semiconductor substrate having a single crystal plane and provided over a supporting substrate, and a semiconductor integrated circuit or the like which includes different crystal axes in channel length directions can be obtained. When a <100> axis is employed for an n-channel field-effect transistor and a <110> axis is employed for a p-channel field-effect transistor, mobility of electrons and holes flowing through a channel formation region can be further increased.

Since a semiconductor layer of an n-channel field-effect transistor and a semiconductor layer of a p-channel field-effect transistor are independently bonded to a supporting substrate, design flexibility in a circuit configuration of the n-channel field-effect transistor and the p-channel field-effect transistor is ensured. Accordingly, the integration degree of field-effect transistors of a pixel of a display device can be increased. In a display device which is formed of a pixel having field-effect transistors of the present invention, the field-effect transistors with high mobility are formed over a supporting substrate, whereby high-speed operation, low-voltage driving, and low power consumption can be achieved. Further, according to this embodiment mode, a structure for element isolation is not necessary; therefore, a manufacturing process can be simplified.

This embodiment mode can be implemented in combination with any of Embodiment Modes 1 to 4 as appropriate.

Embodiment Mode 7

In this embodiment mode, an example of a pixel of a display device, which is formed of a filed-effect transistor (also simply referred to as a transistor), for the purpose of providing high performance and high reliability will be described. In detail, an example of a pixel of an active-matrix display device using a light-emitting element such as an EL (electroluminescence) element as an example of a pixel formed of a field-effect transistor will be described.

Figure 15B:
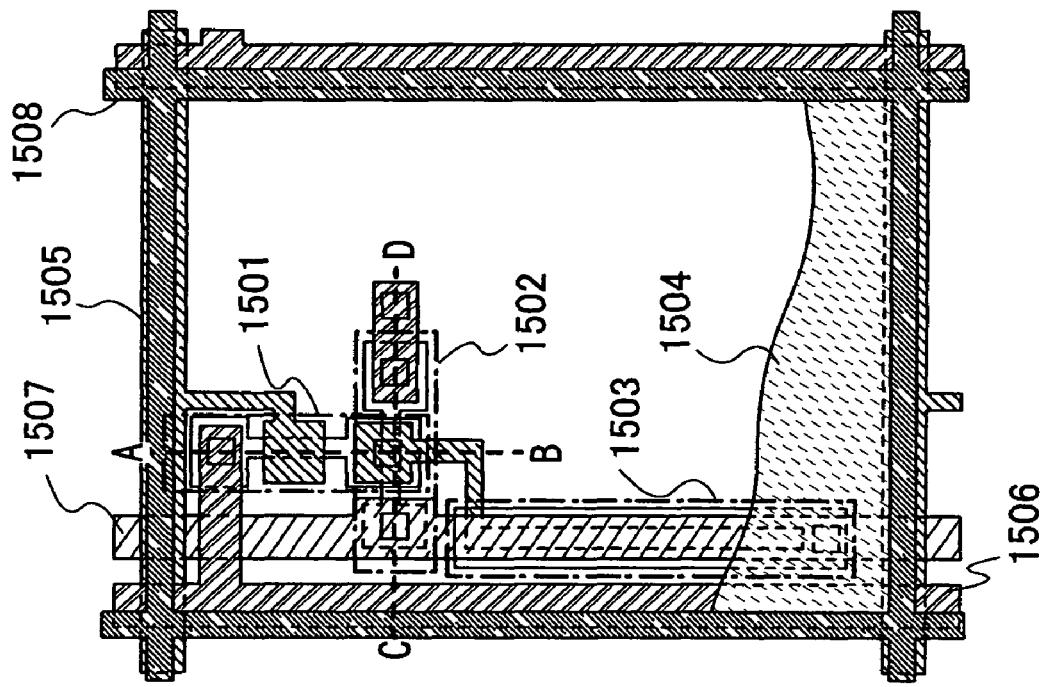
FIGS. 15A and 15B are each a diagram showing a pixel which forms a display device of the present invention.
Figure 15A:
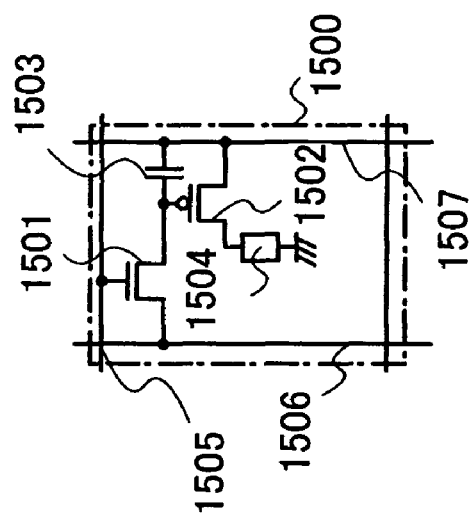
Figure 16A:
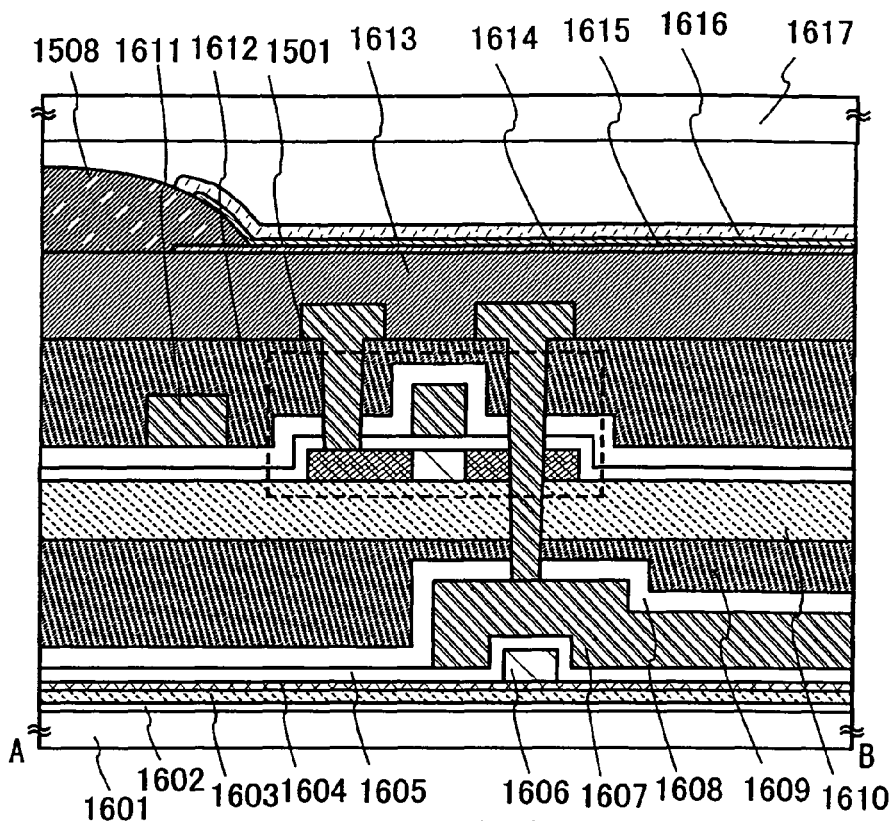
FIGS. 16A and 16B are each a cross-sectional view showing a pixel which forms a display device of the present invention.
Figure 16B:
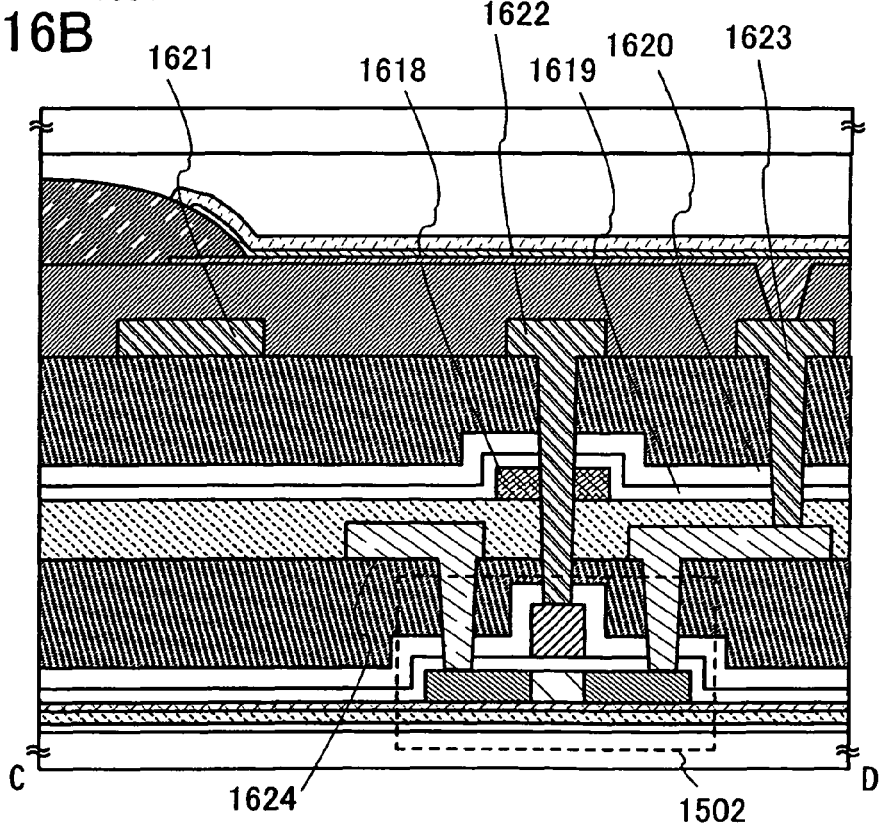

Here, a circuit diagram of a pixel in a display device provided with a light-emitting element is shown in FIG. 15A, a top view structure of the pixel is shown in FIG. 15B, and cross-sectional views of the top view structure shown in FIG. 15B are shown in FIGS. 16A and 16B. Portions of FIGS. 15A and 15B and FIGS. 16A and 16B which can be denoted by the same reference numerals are denoted by reference numerals in common and described with reference to each other. Note that a structure of a pixel in a display device of the present invention shown in this embodiment mode is just an example, and the present invention is not limited thereto.

In FIGS. 15A and 15B, a pixel 1500 includes a selecting transistor 1501 (also referred to as a first field-effect transistor), a driving transistor 1502 (also referred to as a second field-effect transistor), a capacitor 1503, and a light-emitting element 1504. Although the selecting transistor 1501 is an n-channel field-effect transistor and the driving transistor 1502 is a p-channel field-effect transistor, the present invention is not limited thereto. Note that in this embodiment mode, the selecting transistor refers to a field-effect transistor for inputting a signal from a signal line into a selected pixel, and the driving transistor refers to a field-effect transistor for supplying a signal for lighting a selected pixel to a light-emitting element. In addition, a scanning line 1505 is connected to a gate of the selecting transistor 1501; a signal line 1506 is connected to one terminal (also referred to as a first terminal) of a source and a drain; and a gate of the driving transistor 1502 and one electrode of the capacitor 1503 are connected to the other terminal (also referred to as a second terminal) of the source and the drain. In addition, a power supply line 1507 is connected to a first terminal of the driving transistor, and the light-emitting element 1504 is connected to a second terminal thereof. A second electrode of the capacitor 1503 is connected to the power supply line 1507.

Note that the terms first, second, third to Nth (N is a natural number) which are used in this specification are given to avoid the mixture of components but not to limit the number.

Although the selecting transistor 1501 and the driving transistor 1502 each have a structure having one gate in this embodiment mode, a structure may be employed in which a plurality of field-effect transistors are electrically connected in series with a plurality of gates. There is an advantage in that an off-current value can be reduced by employment of the structure in which a plurality of field-effect transistors are electrically connected in series.

Since the driving transistor 1502 is an element for controlling lighting of the light-emitting element 1504, it is also an element through which a large amount of current flows and which has a high risk of deterioration due to heat or deterioration due to hot carriers. Therefore, a structure is extremely effective in which an LDD (light doped drain) region is provided on the drain side of the driving transistor 1502 so as to be overlapped with a gate electrode with a gate insulating film interposed therebetween.

In addition, as shown in FIG. 15B, a wiring including the gate of the driving transistor 1502 extends up to a region where the wiring is overlapped with the power supply line 1507 so as to form the capacitor 1503. The capacitor 1503 is formed between a semiconductor layer (not shown) which is electrically connected to the power supply line 1507, and an insulating film (not shown) in the same layer as the gate insulating film and the wiring including the gate of the driving transistor 1502. The capacitor 1503 has a function of storing a voltage which is applied between the gate and the source of the driving transistor 1502.

In addition, the light-emitting elements 1504 are provided with light-emitting layers corresponding to respective colors of R (red), G (green), and B (blue), and the light-emitting elements 1504 are provided for respective pixel. Note that a light-emitting element 1504 having a light-emitting layer corresponding to a color of yellow, cyan, magenta or white as the light-emitting layer may be provided for each pixels. An example of a light-emitting element which can be applied to this embodiment mode is shown in FIG. 19.

The light-emitting element has an element structure such that an anode 4502, a hole injecting layer 4503 formed of a hole injecting material, a hole transporting layer 4504 formed of a hole transporting material, a light-emitting layer 4505, an electron transporting layer 4506 formed of an electron transporting material, an electron injecting layer 4507 formed of an electron injecting material, and a cathode 4508 are stacked over a substrate 4501 over which an element such as a field-effect transistor is formed. Here, the light-emitting layer 4505 may be formed of only one kind of a light-emitting material or may be formed of two or more kinds of materials. The element structure of this embodiment mode is not limited to this structure.

Figure 19:
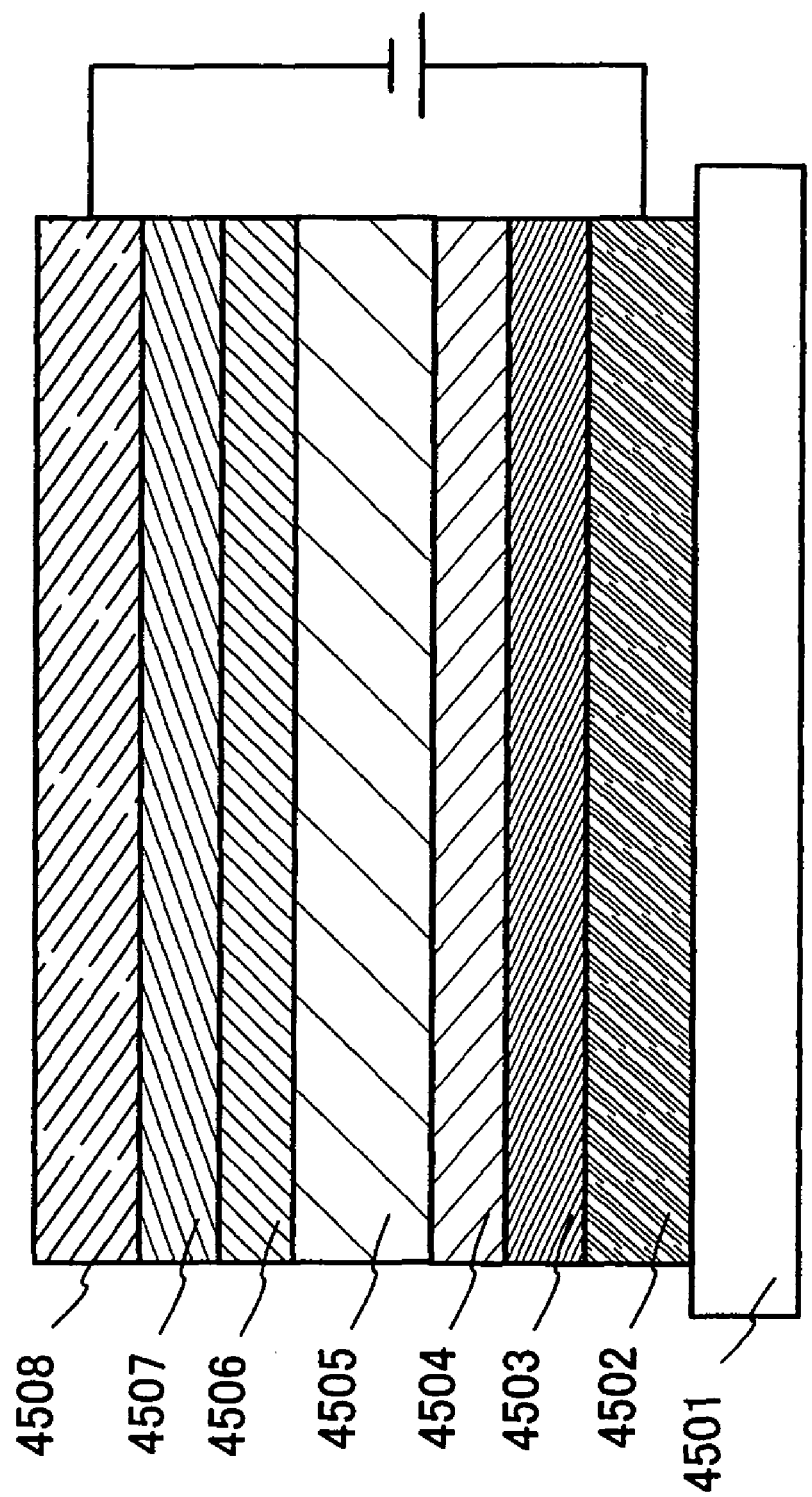
FIG. 19 is a view showing a pixel which forms a display device of the present invention.

In addition to the stacked-layer structure shown in FIG. 19, in which functional layers are stacked, there are wide variations such as an element formed using a macromolecule compound and a high efficiency element utilizing a triplet light-emitting material which emits light from a triplet excitation state for a light-emitting layer. These variations can also be applied to a white light-emitting element or the like which can be obtained by controlling a recombination region of carriers by using a hole blocking layer and dividing a light-emitting region into two regions.

Next, a manufacturing method of the element shown in FIG. 19 is described. First, a hole injecting material, a hole transporting material, and a light-emitting material are sequentially evaporated over the substrate 4501 including the anode 4502 (ITO (indium tin oxide)). Next, an electron transporting material and an electron injecting material are evaporated, and finally, the cathode 4508 is formed by evaporation.

Next, materials suitable as the hole injecting material, the hole transporting material, the electron transporting material, the electron injecting material, and the light-emitting material are described below.

As the hole injecting material, an organic compound such as a porphyrin-based compound, phthalocyanine (hereinafter referred to as "H₂PC"), copper phthalocyanine (hereinafter referred to as "CuPc"), or the like is effective. A material which has a lower ionization potential than that of the hole transporting material to be used and has a hole transporting function can also be used as the hole injecting material. Further, a material, such as polyaniline and polyethylene dioxythiophene (hereinafter referred to as "PEDOT") doped with polystyrene sulfonate (hereinafter referred to as "PSS"), obtained by subjecting a conductive macromolecule compound to chemical doping may also employed. Further, an insulating macromolecule compound is effective in planarization of the anode, and polyimide (hereinafter referred to as "PI") is often used. Furthermore, an inorganic compound is also used, such as an ultrathin film of aluminum oxide (hereinafter referred to as "alumina") as well as a thin film of a metal such as gold or platinum.

As the hole transporting material, an aromatic amine-based compound (that is, a compound having a benzene ring-nitrogen bond) is most widely used. A material which is widely used as the hole transporting material includes 4,4'-bis(diphenylamino)-biphenyl (hereinafter referred to as "TAD"), derivatives thereof such as 4,4'-bis[N-(3-methylphenyl)-N-phenyl-amino]-biphenyl (hereinafter referred to as "TPD") and 4,4'-bis[N-(1-naphthyl)-N-phenyl-amino]-biphenyl (hereinafter referred to as "α-NPD"), and starburst aromatic amine compounds such as 4,4',4''-tris(N,N-diphenyl-amino)-triphenylamine (hereinafter referred to as "TDATA") and 4,4',4''-tris[N-(3-methylphenyl)-N-phenyl-amino]-triphenylamine (hereinafter referred to as "MTDATA").

As the electron transporting material, a metal complex is often used, which includes a metal complex having a quinoline skeleton or a benzoquinoline skeleton, such as tris(8-quinolinolato)aluminum (hereinafter referred to as "Alq₃"), BAlq, tris(4-methyl-8-quinolinolato)aluminum (hereinafter referred to as "Almq"), or bis(10-hydroxybenzo[h]-quinolinato)beryllium (hereinafter referred to as "Bebq"). In addition, a metal complex having an oxazole-based or a thiazole-based ligand such as bis[2-(2-hydroxyphenyl)-benzoxazolato]zinc (hereinafter referred to as "Zn(BOX)₂") or bis[2-(2-hydroxyphenyl)-benzothiazolato]zinc (hereinafter referred to as "Zn(BTZ)₂") may be employed. Further, in addition to the metal complexes, oxadiazole derivatives such as 2-(4-biphenylyl)-5-(4-tert-butylphenyl)-1,3,4-oxadiazole (hereinafter referred to as "PBD") and OXD-7, triazole derivatives such as TAZ and 3-(4-tert-butylphenyl)-4-(4-ethylphenyl)-5-(4-biphenylyl)-1,2,4-triazole (hereinafter referred to as "p-EtTAZ"), and phenanthroline derivatives such as bathophenanthroline (hereinafter referred to as "BPhen") and BCP have electron transporting properties.

As the electron injecting material, the above-mentioned electron transporting materials can be used. In addition, an ultrathin film of an insulator, for example, metal halide such as calcium fluoride, lithium fluoride, or cesium fluoride or alkali metal oxide such as lithium oxide is often used. Further, an alkali metal complex such as lithium acetyl acetonate (hereinafter referred to as "Li(acac)") or 8-quinolinolato-lithium (hereinafter referred to as "Liq") is also effective.

As the light-emitting material, in addition to the above-mentioned metal complexes such as Alq₃, Almq, BeBq, BAlq, Zn(BOX)₂, and Zn(BTZ)₂, various fluorescent pigments are effective. The fluorescent pigments include 4,4'-bis(2,2-diphenyl-vinyl)-biphenyl, which is blue, and 4-(dicyanomethylene)-2-methyl-6-(p-dimethylaminostyryl)-4H-pyran, which is reddish orange, and the like. In addition, a triplet light-emitting material which mainly includes a complex with platinum or iridium as a central metal is available. As the triplet light-emitting material, tris(2-phenylpyridine) iridium, bis(2-(4'-tolyl)pyridinato-N,C²')acetylacetonato iridium (hereinafter referred to as "acacIr(tpy)₂"), 2,3,7,8,12,13,17,18-octaethyl-21H,23Hporphyrin-platinum, and the like are known.

By using the materials having respective functions as described above in combination, a highly reliable light-emitting element can be formed.

A light-emitting element of which layers are formed in reverse order of that in FIG. 19 can also be used. That is, the cathode 4508, the electron injecting layer 4507 formed of the electron injecting material, the electron transporting layer 4506 formed of the electron transporting material, the light-emitting layer 4505, the hole transporting layer 4504 formed of the hole transporting material, the hole injecting layer 4503 formed of the hole injecting material, and the anode 4502 are sequentially stacked over the substrate 4501.

In addition, it is acceptable as long as at least one of the anode and the cathode of the light-emitting element is transparent in order to extract light emission. Field-effect transistors and a light-emitting element are formed over a substrate; and there are light-emitting elements having a top emission structure where light emission is extracted from a surface on the side opposite to the substrate, having a bottom emission structure where light emission is extracted from a surface on the substrate side, and having a dual emission structure where light emission is extracted from both the surface on the side opposite to the substrate and the surface on the substrate side. As a pixel configuration, a light-emitting element having any emission structure can also be applied. In this embodiment mode, as an example, a pixel to which a light-emitting element having a top emission structure is applied is described in FIGS. 15A and 15B and FIGS. 16A and 16B. In the case of the pixel to which a light-emitting element having a top emission structure is applied, the light-emitting element is provided inside of a partition 1508 formed in each pixel, which is shown in FIG. 15B, over an element which forms a pixel. In addition, in the case of the pixel to which a light-emitting element having a top emission structure is applied, it is preferable to provide a reflective electrode for reflecting light emitted to a surface on the substrate side toward a surface on the side opposite to the substrate. When ITO (indium tin oxide) is used for the anode as the reflective electrode, a stacked-layer structure of an alloy layer of aluminum and titanium and a titanium layer may be employed under ITO, so that aluminum which has low resistance and is an inexpensive material can be employed and the titanium layer can ensure preferable connection between ITO and aluminum. Note that in the case of the bottom emission structure or the dual emission structure, the partition may be provided over an element which forms a pixel, depending on disposition of the field-effect transistor which forms a pixel, and the like. Accordingly, a light-emitting element may be provided.

Next, a cross-sectional view corresponding to the top view of the pixel shown in FIG. 15B is described. FIG. 16A is an example of a cross-sectional view taken along line A-B shown in FIG. 15B. FIG. 16B is an example of a cross-sectional view taken along line C-D shown in FIG. 15B. Note that each element shown in the cross-sectional views in this embodiment mode is illustrated with an exaggerated scale in order to describe the cross-sectional structures definitely.

FIG. 16A shows a cross-sectional view provided with the following over a supporting substrate 1601: a blocking film 1602, an insulating layer 1603, a protective layer 1604, an insulating layer 1605, a semiconductor layer 1606, a wiring layer 1607, a protective layer 1608, a planarization layer 1609, an insulating layer 1610, a selecting transistor 1501, a wiring layer 1611, a planarization layer 1612, a planarization layer 1613, a partition 1508, a pixel electrode 1614, an organic thin film 1615, an organic conductive film 1616, and an opposite substrate 1617. Note that the insulating layer 1605 functions as the gate insulating film of the driving transistor 1502. The semiconductor layer 1606 functions as a semiconductor layer of the driving transistor 1502. The wiring layer 1607 functions as the gate electrode of the driving transistor 1502. The wiring layer 1611 has a function as the scanning line 1505 connected to the gate of the selecting transistor 1501. The pixel electrode 1614, the organic thin film 1615, and the organic conductive film 1616 have a function as the light-emitting element 1504 by being stacked.

In addition, FIG. 16B shows a cross-sectional view provided with the following: the driving transistor 1502 which is provided over the supporting substrate and connected to wiring layers 1624 with the blocking film, the insulating layer, and the protective layer interposed therebetween; a semiconductor layer 1618, an insulating layer 1619, and a protective layer 1620 which are provided over the driving transistor 1502 with the planarization layer and the insulating layer interposed therebetween; and further a wiring layer 1621, a wiring layer 1622, and a wiring layer 1623 which are provided over the planarization layer. Note that the wiring layer 1624 is connected to one of the source and the drain of the driving transistor 1502 and functions as the power supply line 1507. The semiconductor layer 1618 functions as one of a source and a drain in a semiconductor layer of the selecting transistor 1501. The insulating layer 1619 functions as a gate insulating film in the selecting transistor 1501. The wiring layer 1621 functions as the signal line 1506. The wiring layer 1622 has a function of connecting the gate of the driving transistor and one of the source and the drain of the selecting transistor 1501 through an opening formed so as to penetrate the planarization layer and the insulating layers with respect to a vertical direction of the supporting substrate. The wiring layer 1623 has a function of connecting the pixel electrode and the other of the source and the drain of the driving transistor through an opening formed so as to penetrate the planarization layer, the protective layer 1620, and the insulating layer 1619.

A display device provided with a light-emitting element formed of the pixel shown in this embodiment mode can be manufactured using the semiconductor substrate shown in the above embodiment modes. Thus, channel regions of the selecting transistor 1501 and the driving transistor 1502 which are provided three-dimensionally over the supporting substrate 1601 which is a light-transmitting substrate such as glass substrate can be formed of single crystal silicon. Then, the pixel which includes field-effect transistors, semiconductor layers of which are stacked three-dimensionally to obtain high integration; therefore, the semiconductor layers are disposed in contact and adjacent to the same insulating layer, and further the semiconductor layers can be stacked in contact with a different insulating layer with the planarization layer interposed therebetween in up and down directions. Therefore, arrangement flexibility of field-effect transistors in the pixel is high, which can lead to higher integration and higher performance.

As for the top view and cross-sectional view structures of the pixel of a display device described in FIGS. 15A and 15B and FIGS. 16A and 16B, a pixel provided with a light-emitting element having a top emission structure is described. The structure of a pixel provided with a light-emitting element having a bottom emission structure is described briefly with reference to FIG. 21 and FIG. 22. The descriptions for the circuit diagrams and the cross-sectional views which are shown in FIGS. 15A and 15B and FIGS. 16A and 16B are employed for the top view and the cross-sectional view shown in FIG. 21 and FIG. 22.

Figure 21:
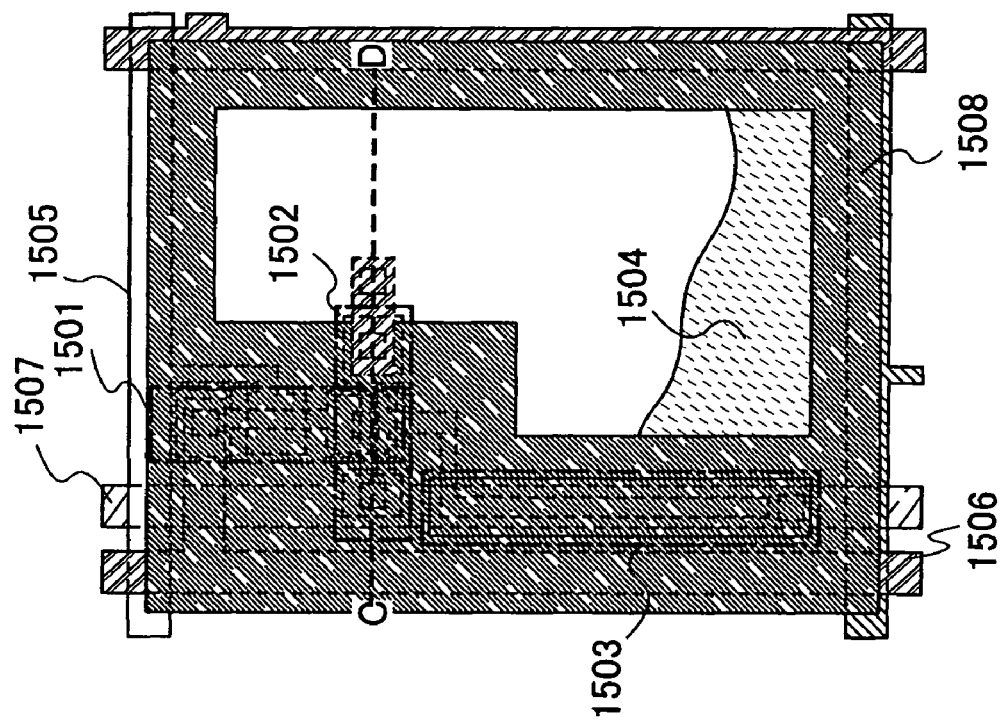
FIG. 21 is a diagram showing a pixel which forms a display device of the present invention.

In FIG. 21, the difference from the top view shown in FIG. 15B is that a region where the light-emitting element 1504 occupies which is provided inside of the partition 1508 to extract light from a surface provided with the supporting substrate, is provided so as not to overlap with the region provided with the field-effect transistors. A cross-sectional structure taken along line C-D of the top view shown in FIG. 21 is shown in FIG. 22.

Figure 22:
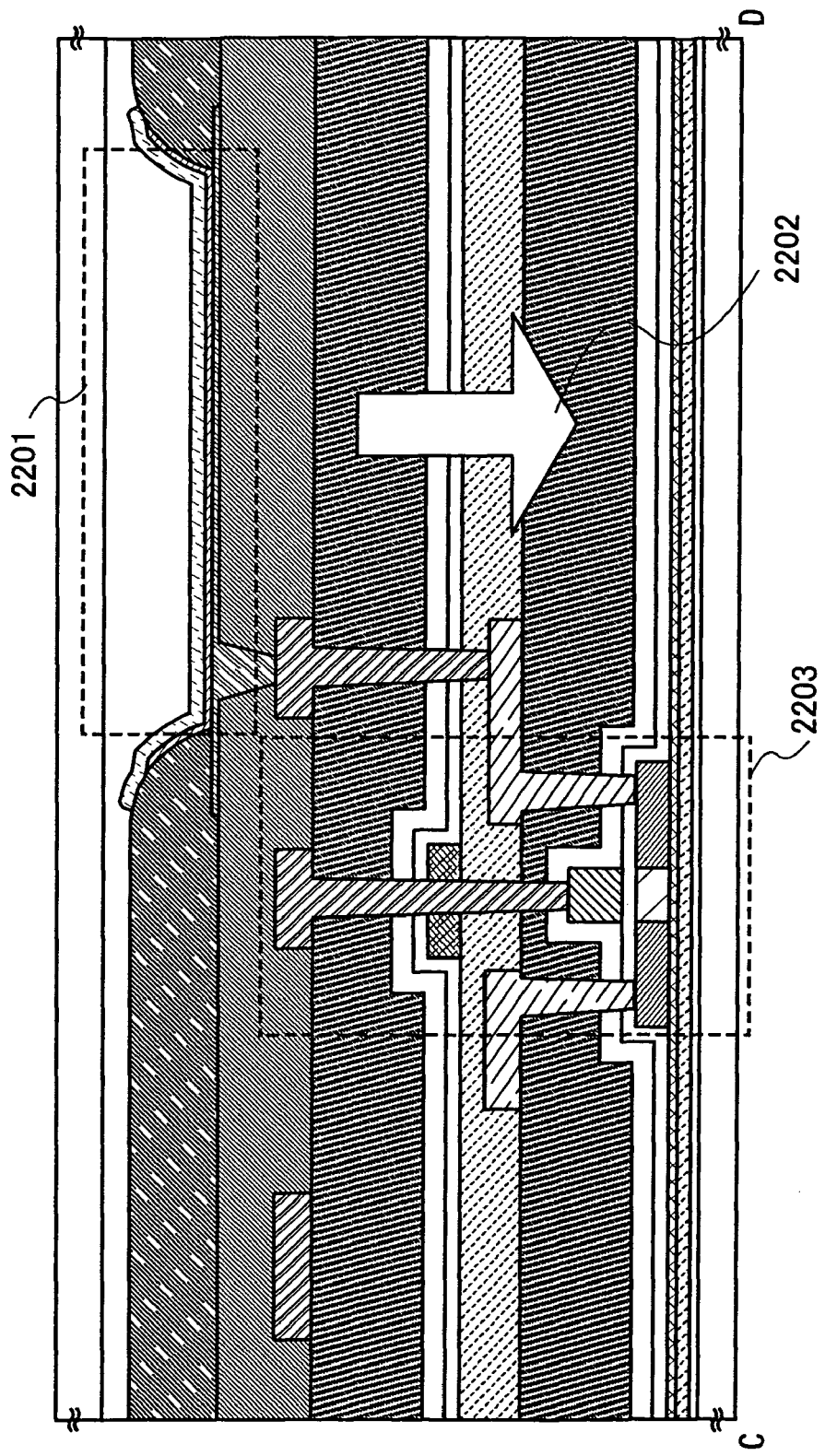
FIG. 22 is a cross-sectional view showing a pixel which forms a display device of the present invention.

In the cross-sectional view shown in FIG. 22 taken along line C-D shown in FIG. 21, light emission is extracted in a direction of an arrow 2202 which is to be the surface of the supporting substrate side from a region 2201 where the light-emitting element emits light, as described above. The region 2201 where the light-emitting element emits light is provided without being overlapped with a region 2203 provided with the field-effect transistor, so that light emission of the light-emitting element can be extracted outside efficiently. In the structure of the field-effect transistor included in the pixel which forms a display device of the present invention, the pixel includes field-effect transistors, semiconductor layers of which are stacked three-dimensionally to obtain high integration in each field-effect transistor; therefore, the semiconductor layers can be stacked in contact with a different insulating layer with the planarization layer interposed therebetween in up and down directions. Therefore, as described in FIG. 21 and FIG. 22, in a display device provided with the light-emitting element having a bottom emission structure, the area can be reduced in which the region 2201 where the light-emitting element emits light and the region 2203 provided with the field-effect transistor are overlapped. Accordingly, improvement in an aperture ratio of the pixel and reduction in the area of the field-effect transistor which occupies the pixel can be achieved, which is preferable.

Figure 17A:
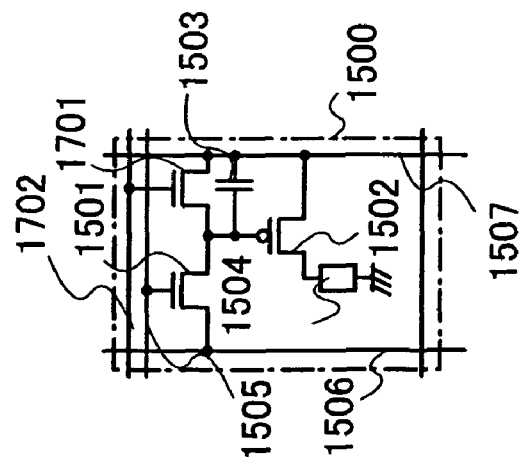
FIGS. 17A and 17B are each a diagram showing a pixel which forms a display device of the present invention.
Figure 17B:
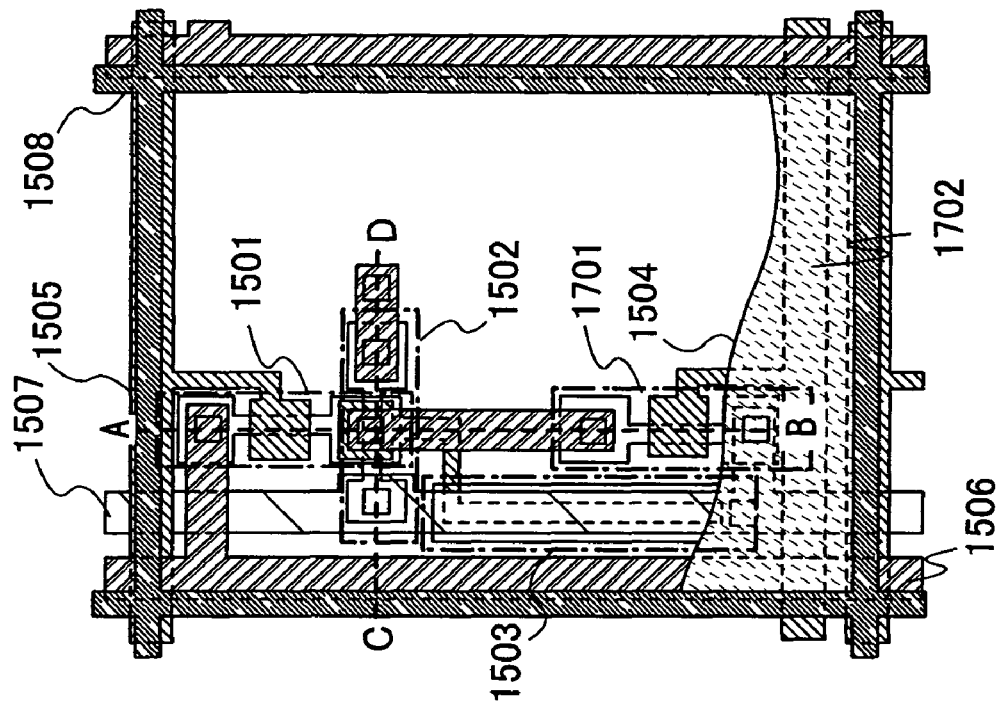
Figure 18A:
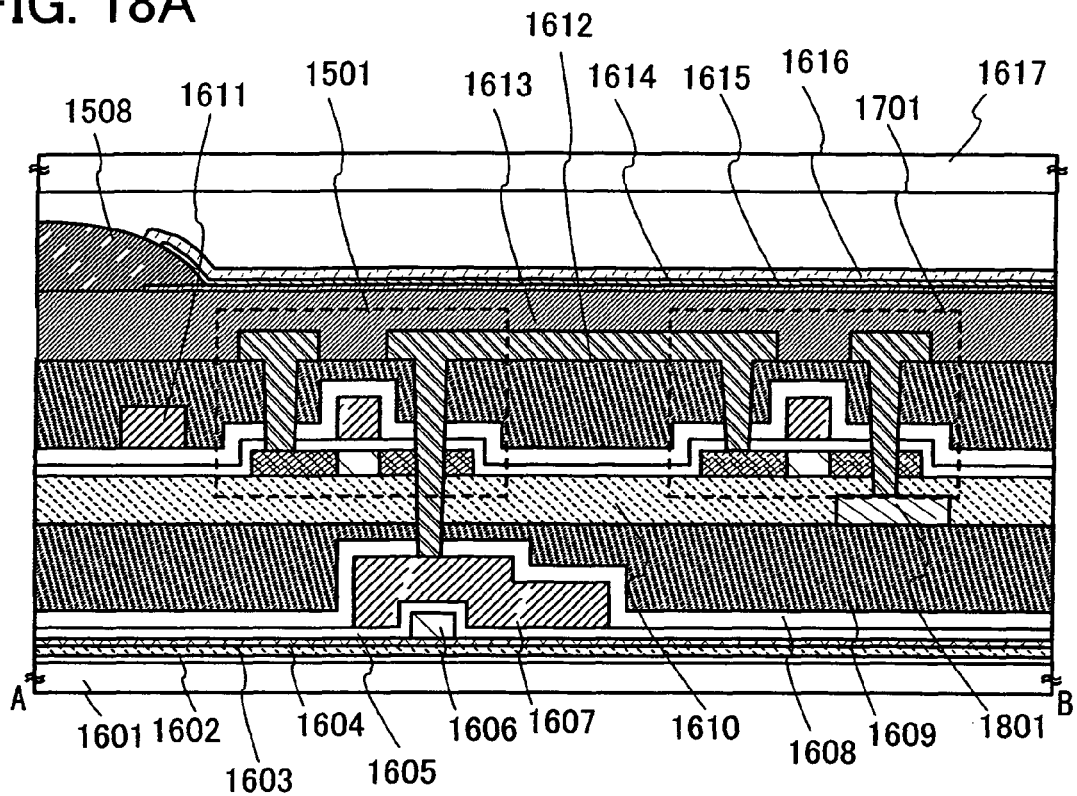
FIGS. 18A and 18B are each a cross-sectional view showing a pixel which forms a display device of the present invention.
Figure 18B:
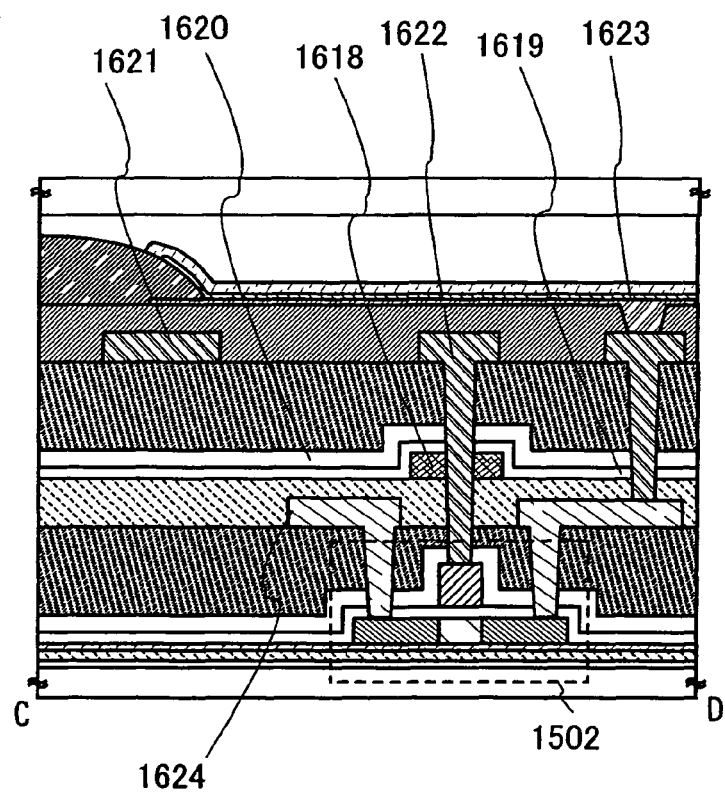

Note that the structure of the pixel of a display device which is shown in this embodiment mode is not limited thereto. For example, as described in FIGS. 17A and 17B, a display device may have a pixel formed of an erasing transistor (also referred to as a third field-effect transistor) connected to a second scanning line. A circuit diagram of a pixel having different configuration from the pixel shown in FIGS. 15A and 15B and FIGS. 16A and 16B is shown in FIG. 17A, a top view structure of the pixel is shown in FIG. 17B, and cross-sectional views of the top view structure shown in FIG. 17B are shown in FIGS. 18A and 18B. Note that portions of FIGS. 17A and 17B and FIGS. 18A and 18B which can be denoted by the same reference numerals are denoted by reference numerals in common and described with reference to each other. In addition, the structure having a function in common with the pixel described in FIGS. 15A and 15B is described by being denoted by the same reference numerals.

In FIG. 17A and FIG. 17B, a pixel 1500 includes a selecting transistor 1501 (also referred to as a first field-effect transistor), a driving transistor 1502 (also referred to as a second field-effect transistor), an erasing transistor 1701 (also referred to as a third field-effect transistor), a capacitor 1503, and a light-emitting element 1504. Although the selecting transistor 1501 and the erasing transistor 1701 are each an n-channel field-effect transistor and the driving transistor 1502 is a p-channel field effect transistor, the present invention is not limited thereto. Note that in this embodiment mode, the erasing transistor refers to a field-effect transistor for erasing a signal inputted from a signal line. In addition, a scanning line 1505 (also referred to as a first scanning line 1505) is connected to a gate of the selecting transistor 1501;

a signal line 1506 is connected to one terminal (also referred to as a first terminal) of a source and a drain of the selecting transistor 1501; and a gate of the driving transistor 1502, one electrode of the capacitor 1503, and a first terminal of the erasing transistor 1701 are connected to the other terminal (also referred to as a second terminal) of the source and the drain of the selecting transistor 1501. In addition, a power supply line 1507 is connected to a first terminal of the driving transistor, and the light-emitting element 1504 is connected to a second terminal thereof. A second scanning line 1702 is connected to a gate of the erasing transistor 1701, and the power supply line 1507 is connected to a second terminal thereof. A second electrode of the capacitor 1503 is connected to the power supply line 1507.

Although the erasing transistor 1701 has a structure having one gate in this embodiment mode, a structure may be employed in which a plurality of field-effect transistors are electrically connected in series with a plurality of gates. There is an advantage in that an off-current value can be reduced by employment of the structure in which a plurality of field-effect transistors are electrically connected in series.

In addition, as shown in FIG. 17B, the second terminal of the erasing transistor 1701 is connected to the power supply line 1507. The erasing transistor 1701 is controlled by the second scanning line 1702, thereby having a function of erasing a voltage stored in the capacitor 1503, which is applied between the gate and the source of the driving transistor 1502.

Next, a cross-sectional view corresponding to the top view of the pixel shown in FIG. 17B is described. FIG. 18A is an example of a cross-sectional view taken along line A-B shown in FIG. 17B. FIG. 18B is an example of a cross-sectional view taken along line C-D shown in FIG. 17B. Note that each element shown in the cross-sectional views in this embodiment mode is illustrated with an exaggerated scale in order to describe the cross-sectional structures definitely.

FIG. 18A shows a cross-sectional view provided with the following over a supporting substrate 1601: a blocking film 1602, an insulating layer 1603, a protective layer 1604, an insulating layer 1605, a semiconductor layer 1606, a wiring layer 1607, a protective layer 1608, a planarization layer 1609, an insulating layer 1610, a wiring layer 1801, a selecting transistor 1501, an erasing transistor 1701, a wiring layer 1611, a planarization layer 1612, a planarization layer 1613, a partition 1508, a pixel electrode 1614, an organic thin film 1615, an organic conductive film 1616, and an opposite substrate 1617. Note that the insulating layer 1605 functions as a gate insulating film of the driving transistor 1502. The semiconductor layer 1606 functions as a semiconductor layer of the driving transistor 1502. The wiring layer 1607 functions as the gate electrode of the driving transistor 1502. The wiring layer 1801 by being extended from the power supply line 1507 functions as a wiring having potential equal to potential of the power supply line. The wiring layer 1611 has a function as the scanning line 1505 connected to the gate of the selecting transistor 1501. The pixel electrode 1614, the organic thin film 1615, and the organic conductive film 1616 have a function as the light-emitting element 1504 by being stacked.

In addition, FIG. 18B shows a cross-sectional view provided with the following: the driving transistor 1502 which is provided over the supporting substrate and connected to wiring layers 1624 with the blocking film, the insulating layer, and the protective layer interposed therebetween; a semiconductor layer 1618, an insulating layer 1619, and a protective layer 1620 which are provided over the driving transistor 1502 with the planarization layer and the insulating layer interposed therebetween; and further a wiring layer 1621, a wiring layer 1622, and a wiring layer 1623 which are provided over the planarization layer. Note that the wiring layer 1624 is connected to one of the source and the drain of the driving transistor 1502 and functions as the power supply line 1507. The semiconductor layer 1618 functions as one of a source and a drain in a semiconductor layer of the selecting transistor 1501. The insulating layer 1619 functions as a gate insulating film in the selecting transistor 1501. The wiring layer 1621 functions as the signal line 1506. The wiring layer 1622 has a function of connecting the gate of the driving transistor and one of the source and the drain of the selecting transistor 1501 through an opening formed so as to penetrate the planarization layer and the insulating layers with respect to a vertical direction of the supporting substrate. The wiring layer 1623 has a function of connecting the pixel electrode and the other of the source and the drain of the driving transistor through an opening formed so as to penetrate the planarization layer, the protective layer 1620, and the insulating layer 1619.

A display device provided with a light-emitting element formed of the pixel shown in this embodiment mode can be manufactured using the semiconductor substrate shown in the above embodiment modes. Thus, channel regions of the selecting transistor 1501 and the driving transistor 1502 which are provided three-dimensionally over the supporting substrate 1601 which is a light-transmitting substrate such as glass substrate can be formed of single crystal silicon. Then, a display device provided with the structure of the pixel described in FIGS. 17A and 17B and FIGS. 18A and 18B in particular can be provided with a light-emitting element in which layers are separately formed for an n-channel field-effect transistor and a p-channel field-effect transistor can be manufactured. The pixel includes a field-effect transistor, semiconductor layers of which are stacked three-dimensionally in each of field-effect transistors having the same conductivity type to obtain high integration; therefore, the semiconductor layers are disposed in contact and adjacent to the same insulating layer, and further the semiconductor layers can be stacked in contact with a different insulating layer with the planarization layer interposed therebetween in up and down directions. Therefore, arrangement flexibility of the field-effect transistors in the pixel is high, which can lead to higher integration and higher performance. Then, in the display device provided with the light-emitting element having a bottom emission structure which is described in FIG. 21 and FIG. 22 in particular, improvement in an aperture ratio of the pixel and reduction in the area of the field-effect transistor which occupies the pixel can be achieved, which is preferable.

As for the pixel which forms the above-described display device, a field-effect transistor of each pixel is formed of semiconductor layers which are bonded to a glass substrate and each have constant crystal plane orientations; therefore, low power consumption as well as high display speed can be achieved.

This embodiment mode can be implemented in combination with any of the other embodiment modes as appropriate.

Embodiment Mode 8

This embodiment mode will describe various electronic devices completed using a display device which is manufactured by applying the present invention, with reference to FIGS. 20A to 20D.

Examples of the electronic devices each including a display device which is manufactured by applying the present invention include: televisions, cameras such as video cameras or digital cameras, goggle displays (head mount displays), navigation systems, audio reproducing devices (e.g., car audio component stereos and audio component stereos), laptop personal computers, game machines, portable information terminals (e.g., mobile computers, cellular phones, portable game machines, and e-books), and image reproducing devices provided with recording media (specifically, the devices that can reproduce a recording medium such as a digital versatile disc (DVD) and is provided with a display device capable of displaying the reproduced images), lighting equipment, and the like. Specific examples of these electronic devices are shown in FIGS. 20A to 20D.

Figure 20A:
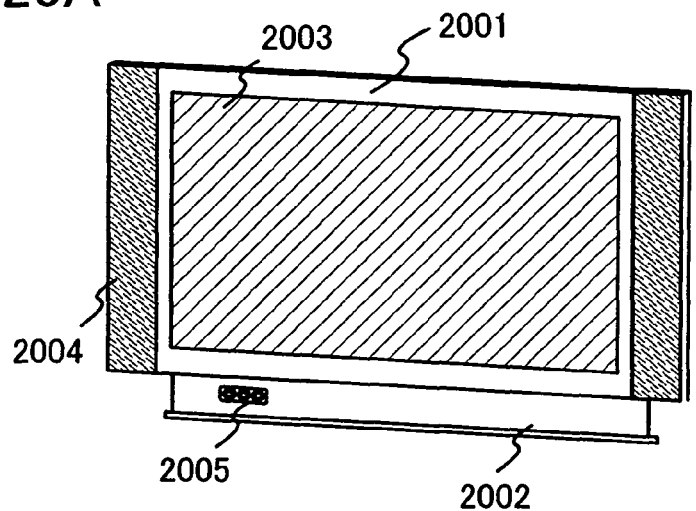
FIGS. 20A to 20D are views each showing an electronic device provided with a display device of the present invention.

FIG. 20A shows an image display device including a chassis 2001, a supporting base 2002, a display portion 2003, a speaker portion 2004, a video input terminal 2005, and the like. The image display device is manufactured using a display device formed using the present invention for the display portion 2003 or the like. Note that the image display device includes all devices for displaying information, for example, for a personal computer, for receiving TV broadcasting, and for displaying an advertisement. A pixel of the display portion 2003 is formed using the field-effect transistors formed over the supporting substrate, which are described in the above embodiment mode. Accordingly, an image display device having the display portion 2003 can be provided in which high performance of field-effect transistors which form the pixel of the display portion 2003 is realized and which can achieve improvement in an aperture ratio of the pixel, which has been reduced due to increase in the number of field-effect transistors, and reduction in the areas of the field-effect transistors which occupy the pixel, without depending on a microfabrication technique of the field-effect transistors, even when the number of field-effect transistors in the pixel is increased.

Figure 20B:
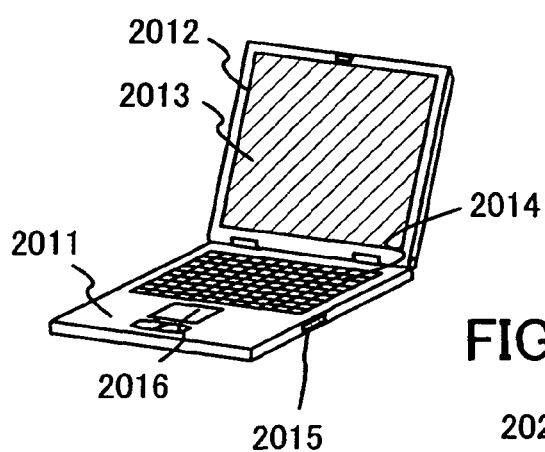

FIG. 20B shows a laptop personal computer including a main body 2011, a chassis 2012, a display portion 2013, a keyboard 2014, an external connection port 2015, a pointing device 2016, and the like. The laptop personal computer is manufactured using a display device formed using the present invention for the display portion 2013. A pixel of the display portion 2013 is formed using the field-effect transistors formed over the supporting substrate, which are described in the above embodiment mode. Accordingly, a laptop personal computer having the display portion 2013 can be provided in which high performance of field-effect transistors which form the pixel of the display portion 2013 is realized and which can achieve improvement in an aperture ratio of the pixel, which has been reduced due to increase in the number of field-effect transistors, and reduction in the areas of the field-effect transistors which occupy the pixel, without depending on a microfabrication technique of the field-effect transistors, even when the number of field-effect transistors in the pixel is increased.

Figure 20C:
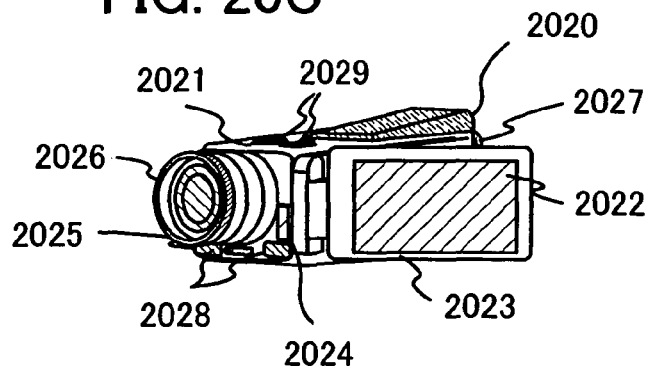

FIG. 20C shows a video camera including a main body 2021, a display portion 2022, a chassis 2023, an external connection port 2024, a remote control receiving portion 2025, an image receiving portion 2026, a battery 2027, an audio input portion 2028, operation keys 2029, an eyepiece portion 2020, and the like. A pixel of the display portion 2022 is formed using the field-effect transistors formed over the supporting substrate, which are described in the above embodiment mode. Accordingly, a video camera having the display portion 2022 can be provided in which high performance of field-effect transistors which form the pixel of the display portion 2022 is realized and which can achieve improvement in an aperture ratio of the pixel, which has been reduced due to increase in the number of field-effect transistor, and reduction in the areas of the field-effect transistors which occupy the pixel, without depending on a microfabrication technique of the field-effect transistors, even when the number of field-effect transistors in the pixel is increased.

Figure 20D:
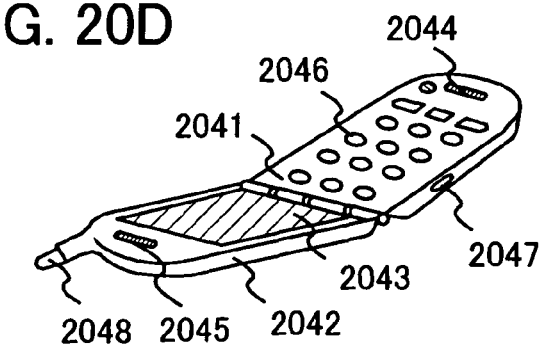

FIG. 20D shows a cellular phone including a main body 2041, a chassis 2042, a display portion 2043, an audio input portion 2044, an audio output portion 2045, operation keys 2046, an external connection port 2047, an antenna 2048, and the like. A pixel of the display portion 2043 is formed using the field-effect transistors formed over the supporting substrate, which are described in the above embodiment mode. Accordingly, a cellular phone having the display portion 2043 can be provided in which high performance of field-effect transistors which form the pixel of the display portion 2043 is realized and which can achieve improvement in an aperture ratio of the pixel, which has been reduced due to increase in the number of field-effect transistors, and reduction in the areas of the field-effect transistors which occupy the pixel, without depending on a microfabrication technique of the field-effect transistors, even when the number of field-effect transistors in the pixel is increased.

In the above-described manner, electronic devices using the display device formed using the present invention can be obtained. The applicable range of the display device formed using the present invention is so wide that the display device can be applied to electronic devices in a variety of fields besides the electronic devices described here.

This embodiment mode can be implemented in combination with any of the other embodiment modes as appropriate.

This application is based on Japanese Patent Application serial no. 2007-243925 filed with Japan Patent Office on Sep. 20, 2007, the entire contents of which are hereby incorporated by reference.

What is claimed is:

1. A display device comprising:
   a plurality of pixels over a substrate comprising an insulating surface, comprising:
   a first field-effect transistor comprising a first semiconductor layer, including silicon, a first gate insulating layer, a first gate electrode layer, a first source electrode layer, and a first drain electrode layer;
   a planarization layer over the first field-effect transistor;
   a second field-effect transistor comprising a second semiconductor layer, a second gate insulating layer, a second gate electrode layer, a second source electrode layer, and a second drain electrode layer, over the planarization layer; and
   a wiring over the first semiconductor layer,
   wherein the first semiconductor layer and the second semiconductor layer are not overlapped with each other,
   wherein the first field-effect transistor is provided over the substrate comprising the insulating surface by being bonded to a first insulating layer which is formed between the first semiconductor layer and the substrate comprising the insulating surface,
   wherein the second field-effect transistor is provided over the first field-effect transistor by being bonded to a second insulating layer which is provided over the planarization layer, and
   wherein the wiring penetrates the first gate insulating layer, the planarization layer and the second gate insulating layer, and reaches the second semiconductor layer.

2. The display device according to claim 1, wherein a conductivity type of the first field-effect transistor is a p type, and a conductivity type of the second field-effect transistor is an n type.

3. The display device according to claim 1, wherein a crystal plane orientation of a plane of the first semiconductor layer parallel to the insulating surface is {110}, and a crystal plane orientation of a plane of the second semiconductor layer parallel to the insulating surface is {100}.

4. The display device according to claim 1, wherein a crystal axis in a channel length direction of the first semiconductor layer is <110>, and a crystal axis in a channel length direction of the second semiconductor layer is <100>.

5. The display device according to claim 1, wherein the first insulating layer and the second insulating layer are each a silicon oxide film which is formed by a chemical vapor deposition method with the use of an organosilane gas.

6. The display device according to claim 1, wherein the substrate is a glass substrate.

7. The display device according to claim 1, wherein a pixel electrode is electrically connected to the first field-effect transistor.

8. A display device comprising:
a plurality of pixels over a substrate comprising an insulating surface, comprising:
a first field-effect transistor comprising a first semiconductor layer, a first gate insulating layer, a first gate electrode layer, a first source electrode layer, and a first drain electrode layer;
a planarization layer over the first field-effect transistor;
a second field-effect transistor comprising a second semiconductor layer, a second gate insulating layer, a second gate electrode layer, a second source electrode layer, and a second drain electrode layer, over the planarization layer; and
a wiring over the first semiconductor layer,
wherein the first semiconductor layer and the second semiconductor layer are not overlapped with each other,
wherein the first semiconductor layer and the second semiconductor layer each have a different crystal plane orientation, and
wherein the wiring penetrates the first gate insulating layer, the planarization layer and the second gate insulating layer, and reaches the second semiconductor layer.

9. The display device according to claim 8, wherein a conductivity type of the first field-effect transistor is a p type, and a conductivity type of the second field-effect transistor is an n type.

10. The display device according to claim 8, wherein a crystal plane orientation of a plane of the first semiconductor layer parallel to the insulating surface is {110}, and a crystal plane orientation of a plane of the second semiconductor layer parallel to the insulating surface is {100}.

11. The display device according to claim 8, wherein a crystal axis in a channel length direction of the first semiconductor layer is <110>, and a crystal axis in a channel length direction of the second semiconductor layer is <100>.

12. The display device according to claim 8,
wherein the first field-effect transistor is provided over the substrate comprising the insulating surface by being bonded to a first insulating layer which is formed between the first semiconductor layer and the substrate comprising the insulating surface, and
wherein the second field-effect transistor is provided over the first field-effect transistor by being bonded to a second insulating layer which is provided over the planarization layer.

13. The display device according to claim 12, wherein the first insulating layer and the second insulating layer are each a silicon oxide film which is formed by a chemical vapor deposition method with the use of an organosilane gas.

14. The display device according to claim 8, wherein the substrate is a glass substrate.

15. The display device according to claim 8, wherein a pixel electrode is electrically connected to the first field-effect transistor.

16. A display device comprising:
a plurality of pixels over a substrate comprising an insulating surface, comprising:
a first field-effect transistor comprising a first semiconductor layer, a first gate insulating layer, a first gate electrode layer, a first source electrode layer, and a first drain electrode layer;
a planarization layer over the first field-effect transistor;
a second field-effect transistor comprising a second semiconductor layer, a second gate insulating layer, a second gate electrode layer, a second source electrode layer, and a second drain electrode layer, over the planarization layer; and
a wiring over the first semiconductor layer,
wherein the first semiconductor layer and the second semiconductor layer are not overlapped with each other,
wherein the first semiconductor layer and the second semiconductor layer have the same crystal plane orientation and each have a different crystal axis in a channel length direction, and
wherein the wiring penetrates the first gate insulating layer, the planarization layer and the second gate insulating layer, and reaches the second semiconductor layer.

17. The display device according to claim 16, wherein a conductivity type of the first field-effect transistor is an n type, and a conductivity type of the second field-effect transistor is a p type.

18. The display device according to claim 16, wherein a crystal plane orientation of the first semiconductor layer and the second semiconductor layer, and the crystal axis in the channel length direction of the first semiconductor layer is <100> and the crystal axis in the channel length direction of the second semiconductor layer is <110>.

19. The display device according to claim 16,
wherein the first field-effect transistor is provided over the substrate comprising the insulating surface by being bonded to a first insulating layer which is formed between the first semiconductor layer and the substrate comprising the insulating surface, and
wherein the second field-effect transistor is provided over the first field-effect transistor by being bonded to a second insulating layer which is provided over the planarization layer.

20. The display device according to claim 19, wherein the first insulating layer and the second insulating layer are each a silicon oxide film which is formed by a chemical vapor deposition method with the use of an organosilane gas.

21. The display device according to claim 16, wherein the substrate is a glass substrate.

22. The display device according to claim 16, wherein a pixel electrode is electrically connected to the first field-effect transistor.

23. A display device comprising:
a plurality of pixels over a substrate comprising an insulating surface, comprising:
a first field-effect transistor comprising a first semiconductor layer, a first gate insulating layer, a first gate electrode layer, a first source electrode layer, and a first drain electrode layer;
a planarization layer over the first field-effect transistor;
a second field-effect transistor comprising a second semiconductor layer, a second gate insulating layer, a second gate electrode layer, a second source electrode layer, and a second drain electrode layer, over the planarization layer; and a wiring over the first semiconductor layer, wherein the first semiconductor layer and the second semiconductor layer are not overlapped with each other, wherein the first field-effect transistor is provided over the substrate comprising the insulating surface by being bonded to a first insulating layer which is formed between the first semiconductor layer and the substrate comprising the insulating surface, wherein the second field-effect transistor is provided over the first field-effect transistor by being bonded to a second insulating layer which is provided over the planarization layer, and wherein the wiring penetrates the first gate insulating layer, the planarization layer and the second gate insulating layer, and reaches the second semiconductor layer.

24. The display device according to claim 23, wherein a conductivity type of the first field-effect transistor is a p type, and a conductivity type of the second field-effect transistor is an n type.

25. The display device according to claim 23, wherein a crystal plane orientation of a plane of the first semiconductor layer parallel to the insulating surface is {110}, and a crystal plane orientation of a plane of the second semiconductor layer parallel to the insulating surface is {100}.

26. The display device according to claim 23, wherein a crystal axis in a channel length direction of the first semiconductor layer is <110>, and a crystal axis in a channel length direction of the second semiconductor layer is <100>.

27. The display device according to claim 23, wherein the first insulating layer and the second insulating layer are each a silicon oxide film which is formed by a chemical vapor deposition method with the use of an organosilane gas.

28. The display device according to claim 23, wherein the substrate is a glass substrate.

29. The display device according to claim 23, wherein a pixel electrode is electrically connected to the first field-effect transistor.

30. A display device comprising:

a plurality of pixels over a substrate comprising an insulating surface, comprising:

a first field-effect transistor comprising a first semiconductor layer, a first gate insulating layer, a first gate electrode layer, a first source electrode layer, and a first drain electrode layer;

a planarization layer over the first field-effect transistor;

a second field-effect transistor comprising a second semiconductor layer including silicon, a second gate insulating layer, a second gate electrode layer, a second source electrode layer, and a second drain electrode layer, over the planarization layer; and a wiring over the first semiconductor layer, wherein the first semiconductor layer and the second semiconductor layer are not overlapped with each other, wherein the first field-effect transistor is provided over the substrate comprising the insulating surface by being bonded to a first insulating layer which is formed between the first semiconductor layer and the substrate comprising the insulating surface, wherein the second field-effect transistor is provided over the first field-effect transistor by being bonded to a second insulating layer which is provided over the planarization layer, and wherein the wiring penetrates the first gate insulating layer, the planarization layer and the second gate insulating layer, and reaches the second semiconductor layer.

31. The display device according to claim 30, wherein a conductivity type of the first field-effect transistor is a p type, and a conductivity type of the second field- effect transistor is an n type.

32. The display device according to claim 30, wherein a crystal plane orientation of a plane of the first semiconductor layer parallel to the insulating surface is {110}, and a crystal plane orientation of a plane of the second semiconductor layer parallel to the insulating surface is {100}.

33. The display device according to claim 30, wherein a crystal axis in a channel length direction of the first semiconductor layer is <110>, and a crystal axis in a channel length direction of the second semiconductor layer is <100>.

34. The display device according to claim 30, wherein the first insulating layer and the second insulating layer are each a silicon oxide film which is formed by a chemical vapor deposition method with the use of an organosilane gas.

35. The display device according to claim 30, wherein the substrate is a glass substrate.

36. The display device according to claim 30, wherein a pixel electrode is electrically connected to the first field-effect transistor.

* * * * *